(12) United States Patent
Tsai et al.

(10) Patent No.: US 11,984,508 B2
(45) Date of Patent: May 14, 2024

(54) THIN FILM TRANSISTOR INCLUDING A COMPOSITIONALLY-MODULATED ACTIVE REGION AND METHODS FOR FORMING THE SAME

(71) Applicant: Taiwan Semiconductor Manufacturing Company Limited, Hsinchu (TW)

(72) Inventors: Wu-Wei Tsai, Hsinchu (TW); Po-Ting Lin, Hsinchu (TW); Hai-Ching Chen, Hsinchu (TW); Chung-Te Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 149 days.

(21) Appl. No.: 17/469,160

(22) Filed: Sep. 8, 2021

(65) Prior Publication Data

US 2022/0271166 A1 Aug. 25, 2022

Related U.S. Application Data

(60) Provisional application No. 63/153,043, filed on Feb. 24, 2021.

(51) Int. Cl.
*H01L 29/786* (2006.01)
*H01L 21/02* (2006.01)
(Continued)

(52) U.S. Cl.
CPC .... *H01L 29/7869* (2013.01); *H01L 21/02565* (2013.01); *H01L 21/443* (2013.01);
(Continued)

(58) Field of Classification Search
CPC .......................... H01L 29/105; H01L 29/7869
See application file for complete search history.

(56) References Cited

U.S. PATENT DOCUMENTS 5,915,175 A * 6/1999 Wise ................. H01L 21/31051
257/E21.243
8,319,218 B2 * 11/2012 Yamazaki ......... H01L 29/78618
438/149
(Continued)

OTHER PUBLICATIONS

Cho et al., "Local structure and conduction mechanism in amorphous In—Ga—Zn—O films", Applied Physis Letters, Mar. 2009, pp. 94, 112112-1 to 112112-3 (Year: 2009).*
(Continued)

*Primary Examiner* — Vincent Wall
(74) *Attorney, Agent, or Firm* — The Marbury Law Group, PLLC

(57) ABSTRACT

A thin film transistor includes an active layer and at least one gate stack. The active layer may be formed using multiple iterations of a unit layer stack deposition process, which includes an acceptor-type oxide deposition process and a post-transition metal oxide deposition process. A surface of each gate dielectric within the at least one gate stack contacts a surface of a respective layer of the oxide of the acceptor-type element so that leakage current of the active layer may be minimized. A source electrode and a drain electrode may contact an oxide layer providing lower contact resistance such as a layer of the post-transition metal oxide or a zinc oxide layer within the active layer.

20 Claims, 43 Drawing Sheets

(51) Int. Cl.
   *H01L 21/443*   (2006.01)
   *H01L 29/24*    (2006.01)
   *H01L 29/66*    (2006.01)
   *H10B 61/00*    (2023.01)
   *H10B 63/00*    (2023.01)

(52) U.S. Cl.
   CPC ........ *H01L 29/24* (2013.01); *H01L 29/66969* (2013.01); *H01L 29/78696* (2013.01); *H10B 61/22* (2023.02); *H10B 63/30* (2023.02)

(56) References Cited

U.S. PATENT DOCUMENTS

| | | | | |
|---|---|---|---|---|
| 9,324,747 | B2* | 4/2016 | Yamazaki | H01L 27/14607 |
| 9,397,153 | B2* | 7/2016 | Tanaka | H01L 29/7869 |
| 9,735,281 | B2* | 8/2017 | Kim | H01L 21/02565 |
| 2010/0051937 | A1* | 3/2010 | Kaji | H01L 29/7869 |
| | | | | 257/E33.013 |
| 2011/0133191 | A1* | 6/2011 | Yamazaki | H01L 29/78696 |
| | | | | 257/E21.414 |
| 2014/0239293 | A1* | 8/2014 | Yamazaki | H01L 29/78696 |
| | | | | 257/43 |
| 2015/0221679 | A1* | 8/2015 | Yamazaki | H01L 29/78618 |
| | | | | 257/43 |
| 2015/0372146 | A1* | 12/2015 | Shishido | H01L 29/0692 |
| | | | | 257/43 |
| 2016/0155803 | A1* | 6/2016 | Yamazaki | H01L 29/66969 |
| | | | | 257/43 |
| 2021/0408013 | A1* | 12/2021 | Young | G11C 11/161 |
| 2021/0408223 | A1* | 12/2021 | Chia | H01L 21/02601 |
| 2022/0139917 | A1* | 5/2022 | Yamazaki | H01L 27/088 |
| | | | | 257/296 |
| 2022/0231131 | A1* | 7/2022 | Ikeda | H01Q 23/00 |

OTHER PUBLICATIONS

Yabuta et al., "Microscopic structure and electrical transport property of sputter-deposited amorphous indium-gallium-zinc oxide semiconductor films", Journal of Pysics Conference Series, 2014, pp. 1-27 (Year: 2014).* https://www.researchgate.net/figure/Polyhedral-views-of-crystal-structures-of-a—In—O-and-b—InGaZnO-determined-by_fig5_246773745 (Year: 2009).*

* cited by examiner

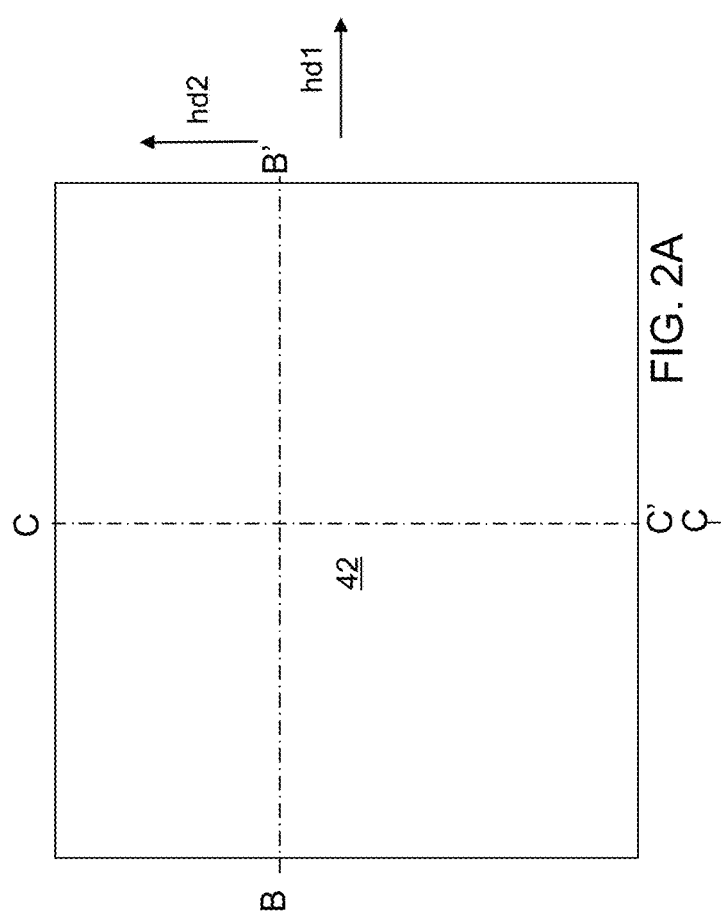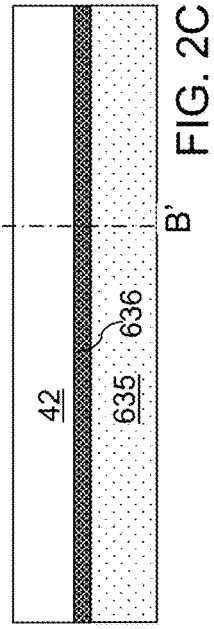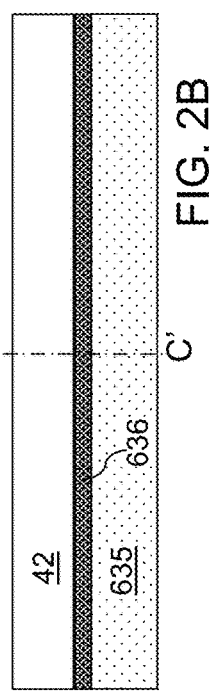

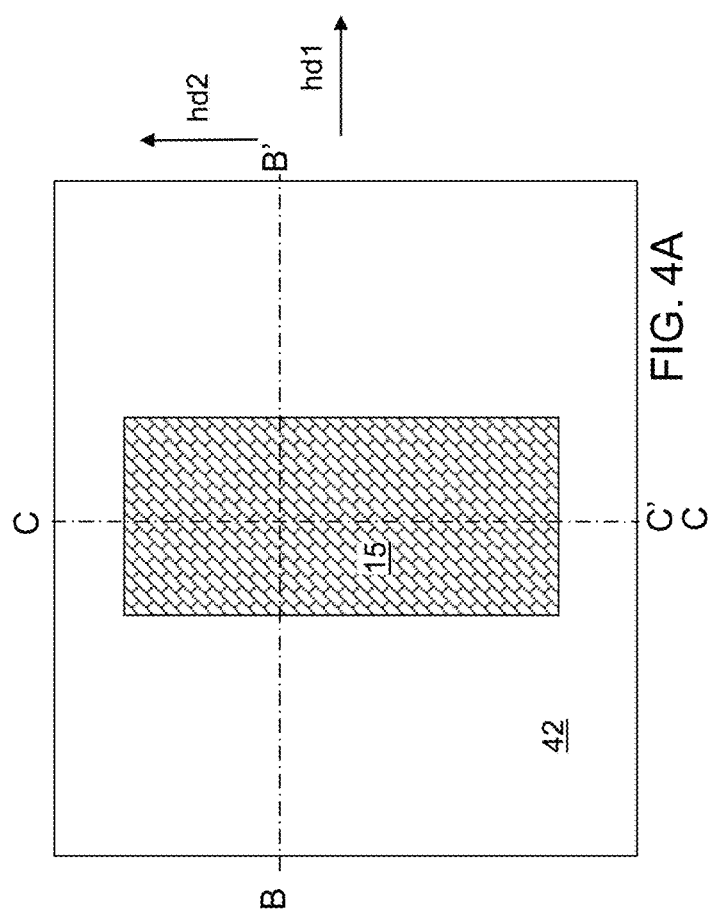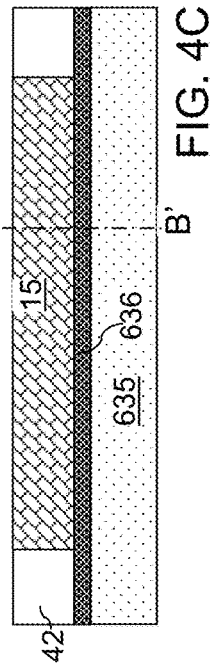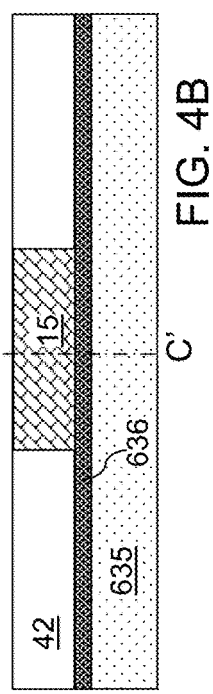

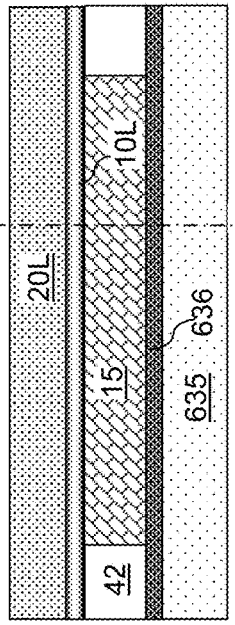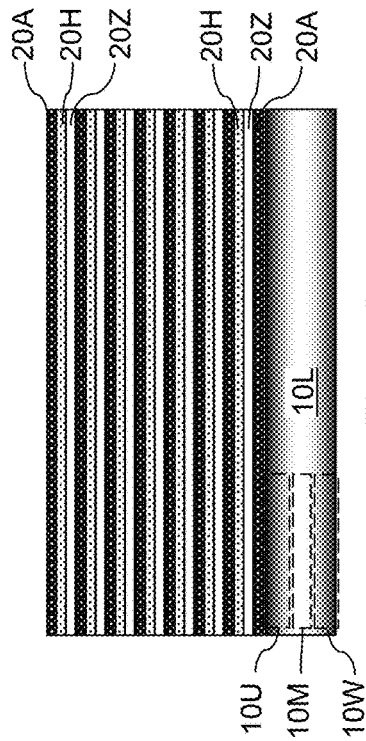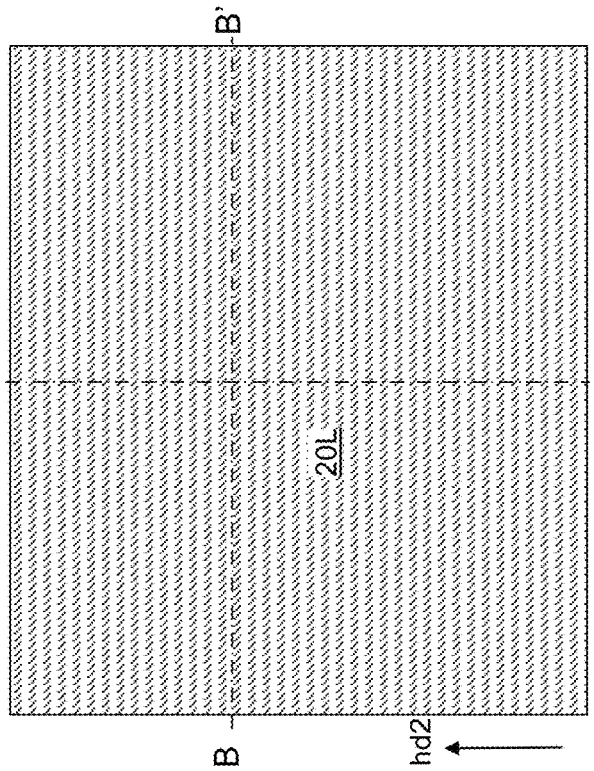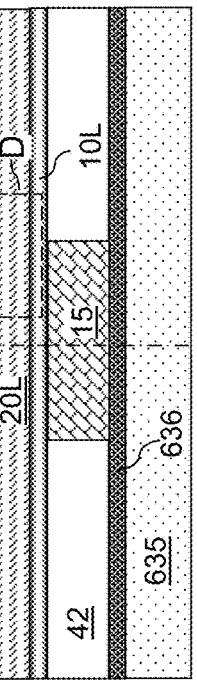

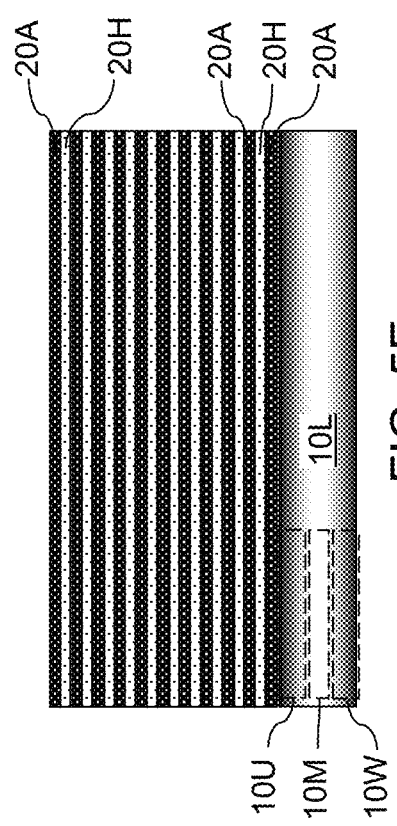

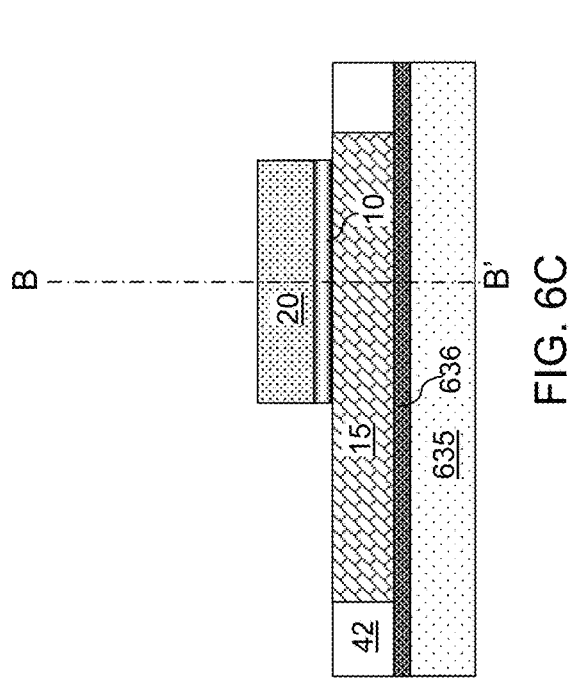
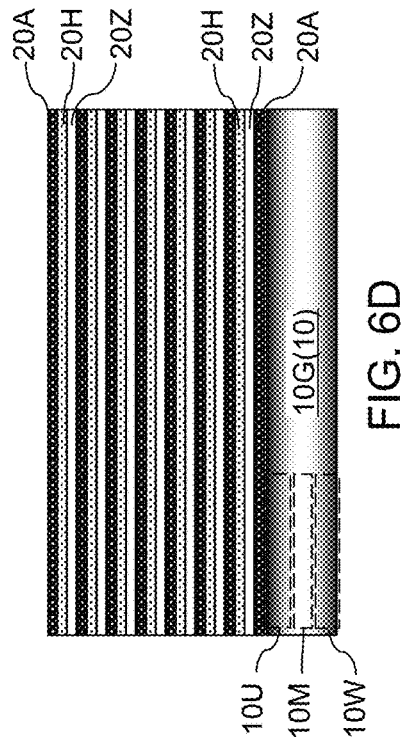
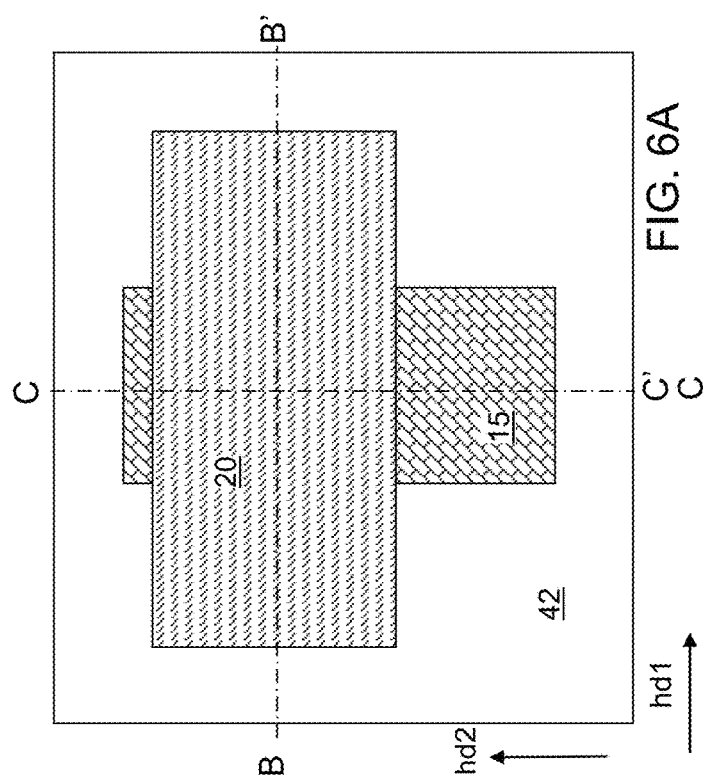
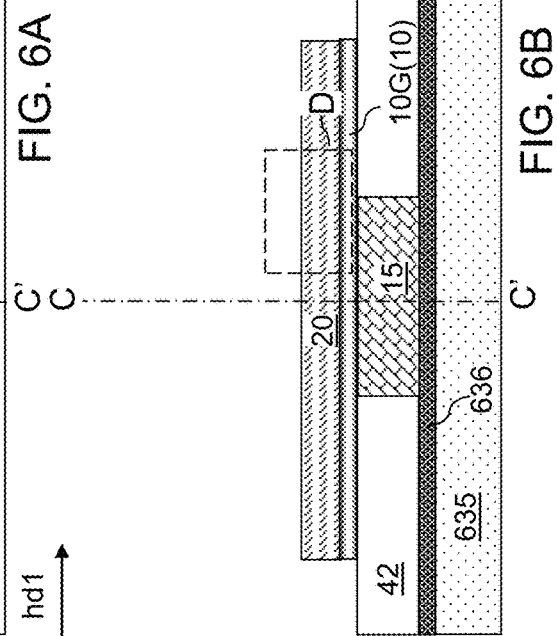

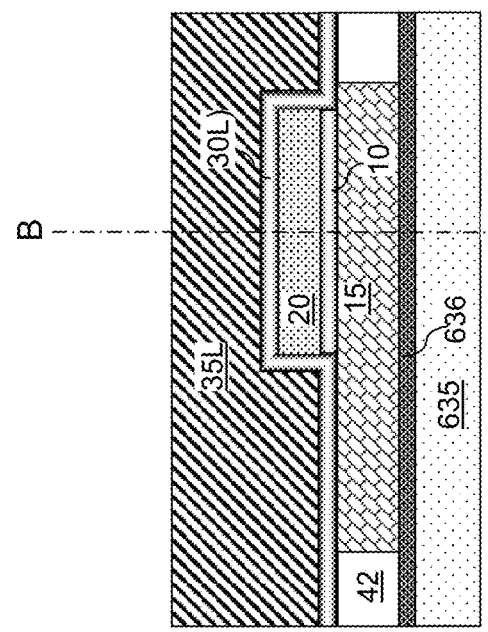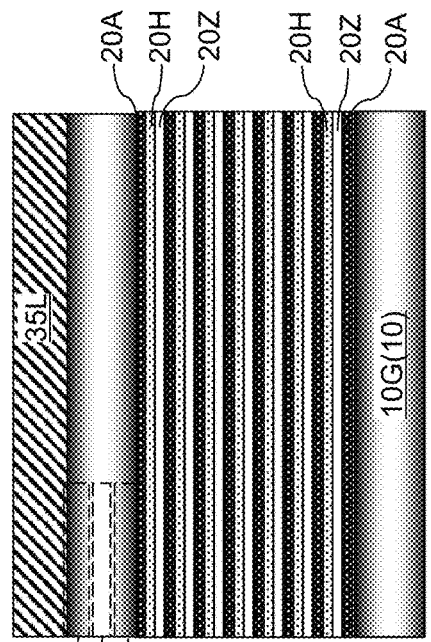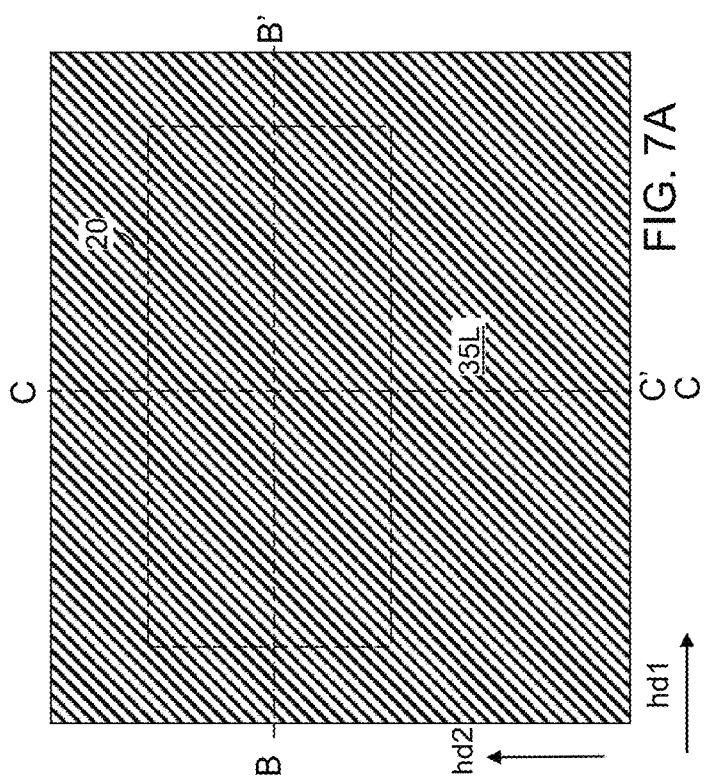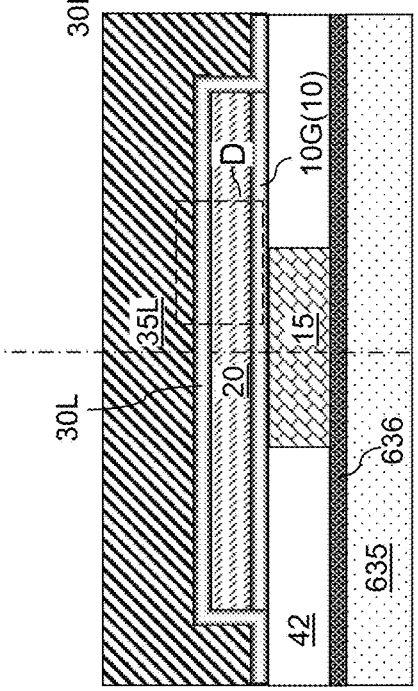

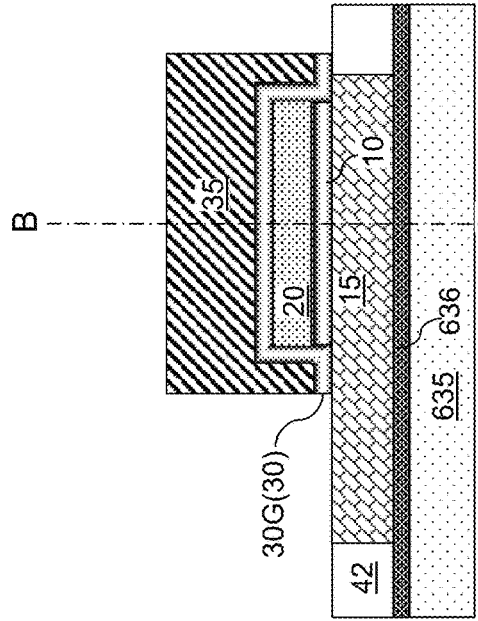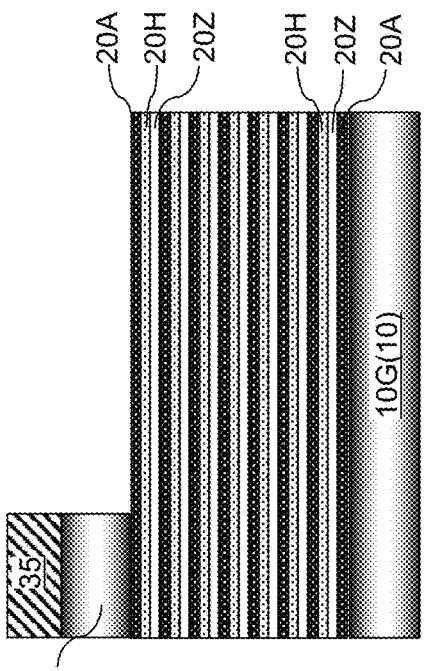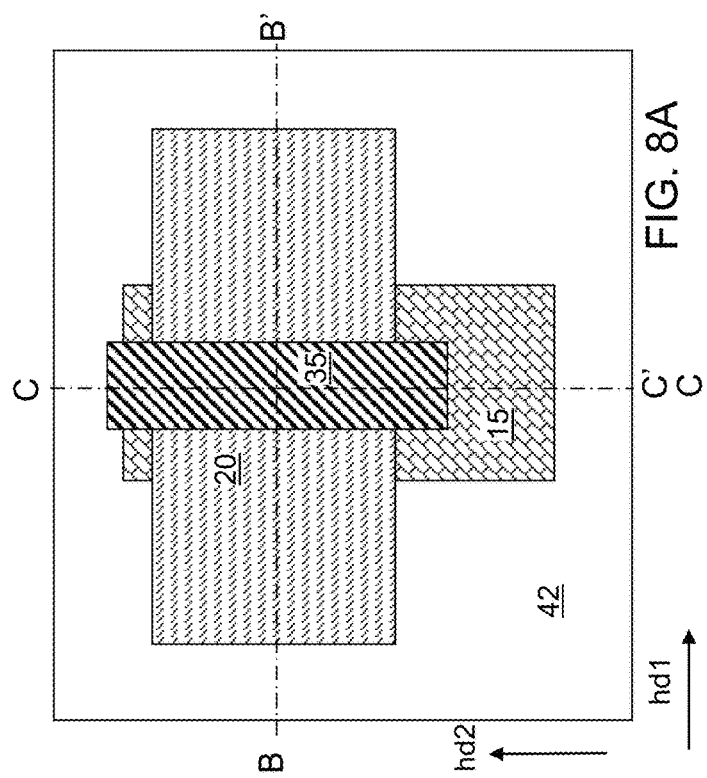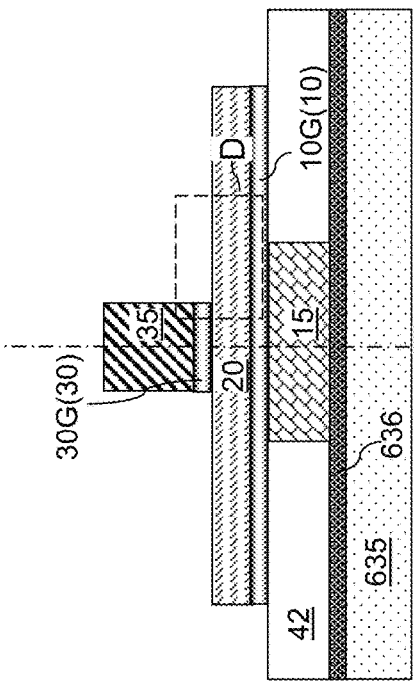

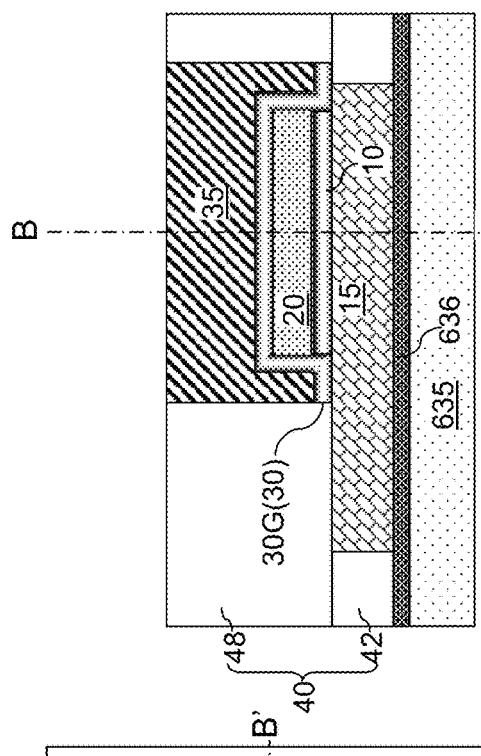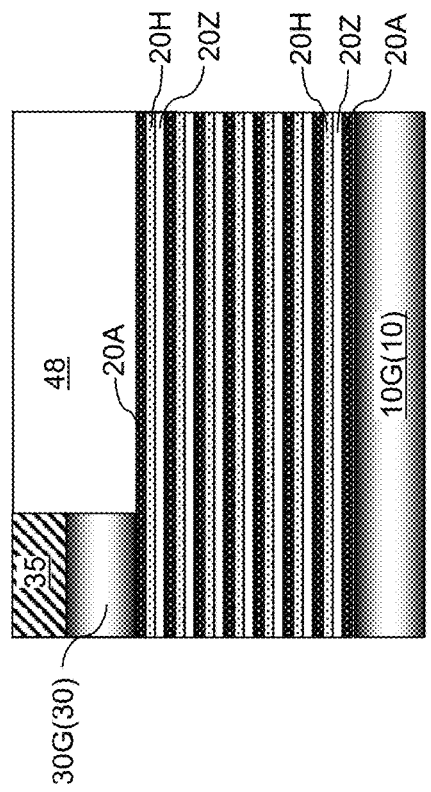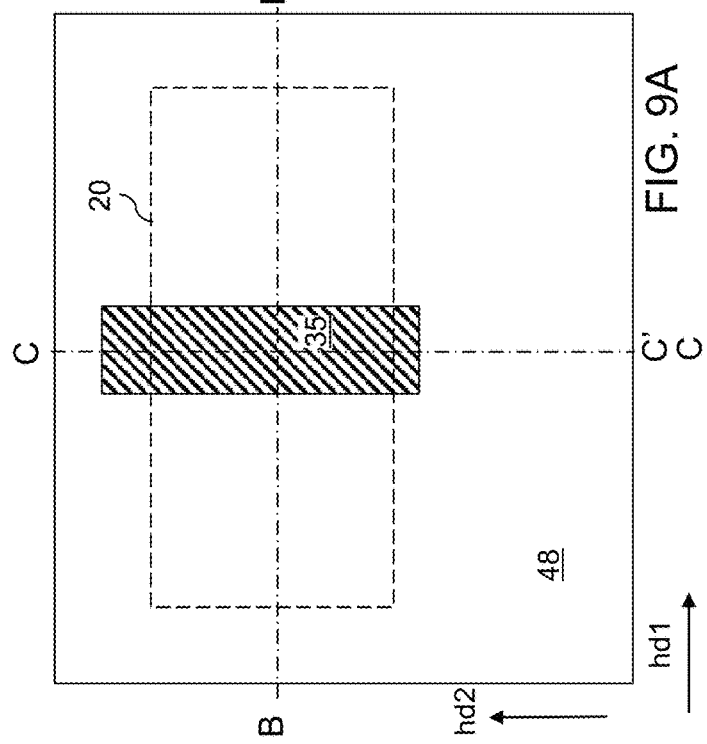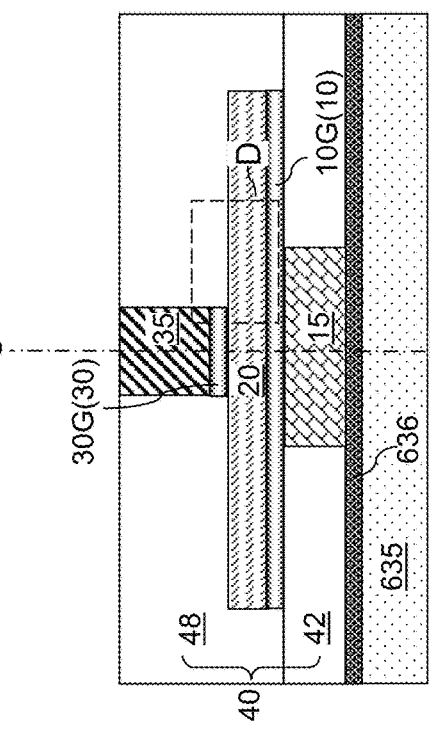

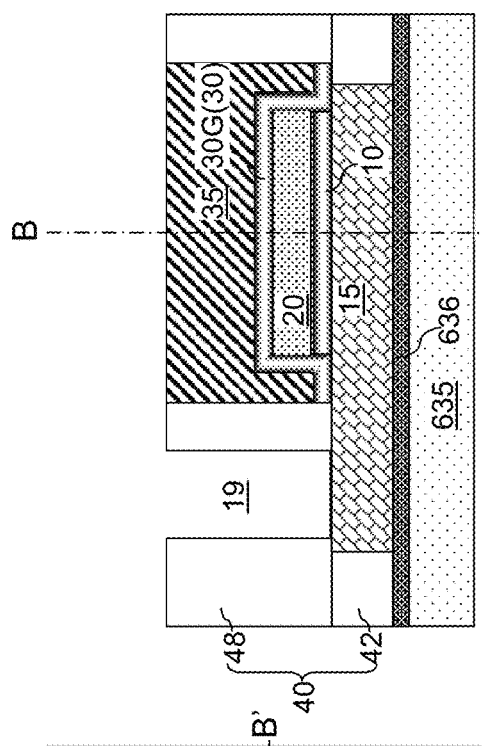
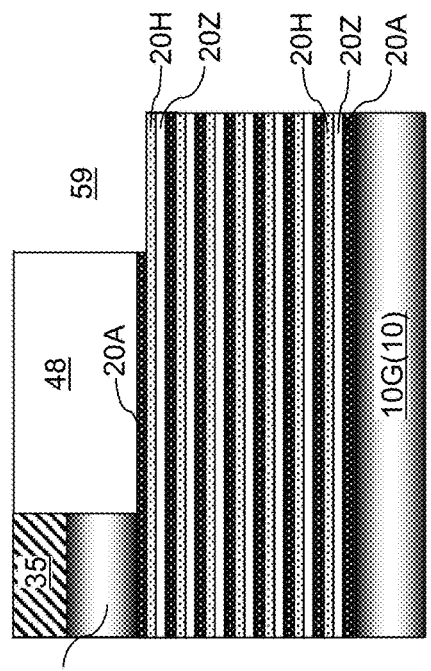
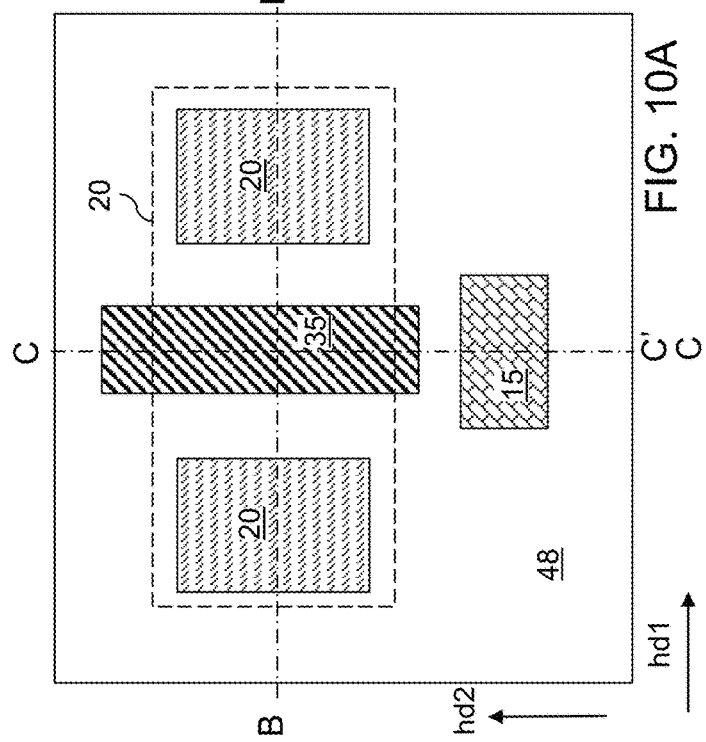
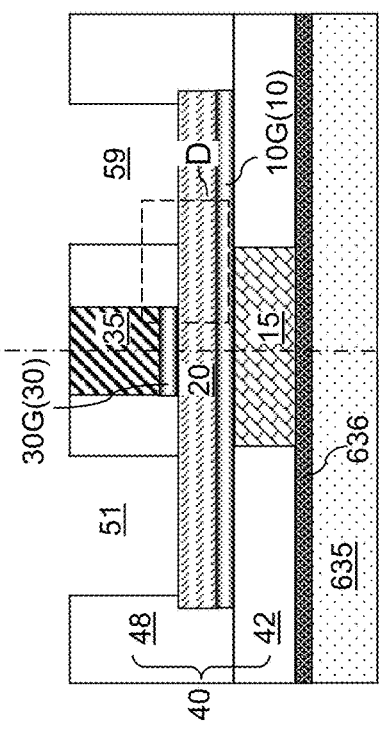
FIG. 10A
FIG. 10B
FIG. 10C
FIG. 10D

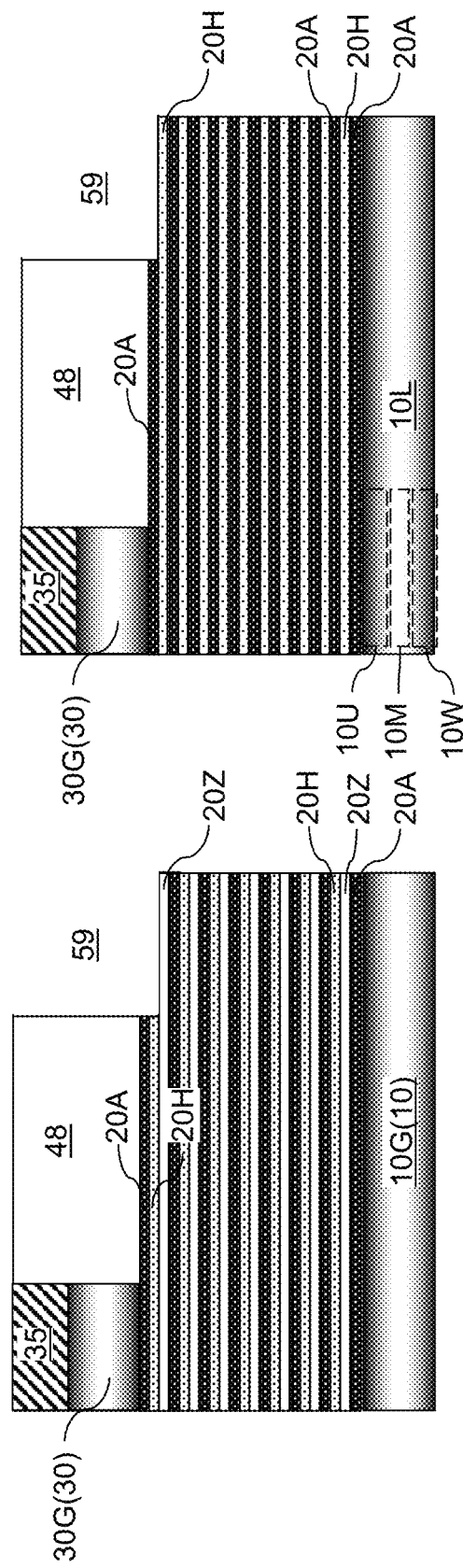

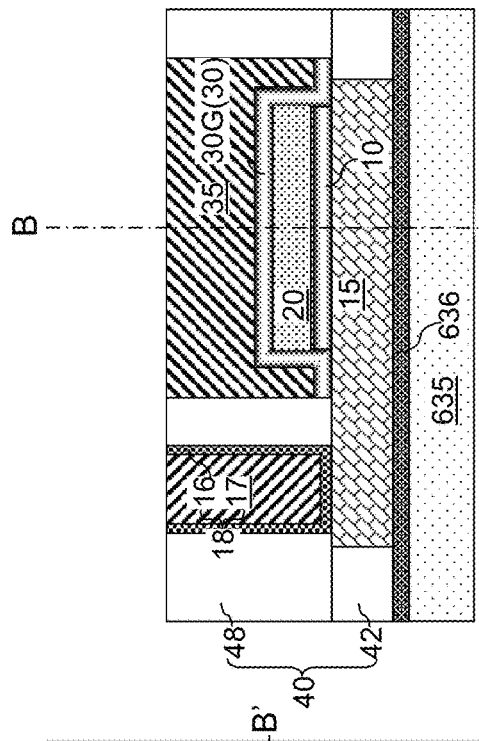
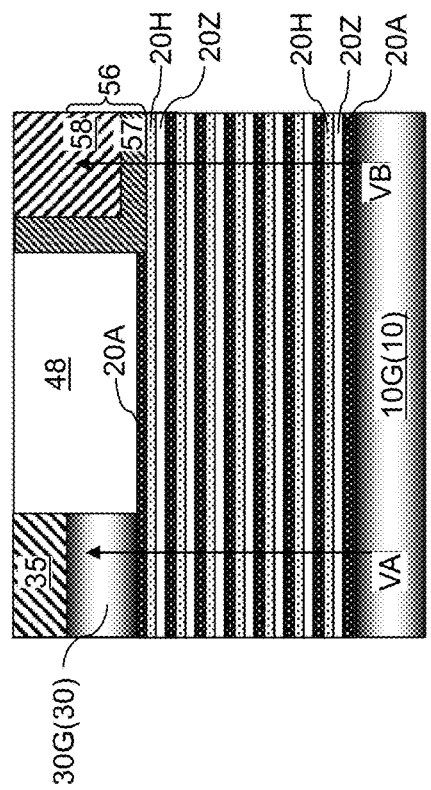
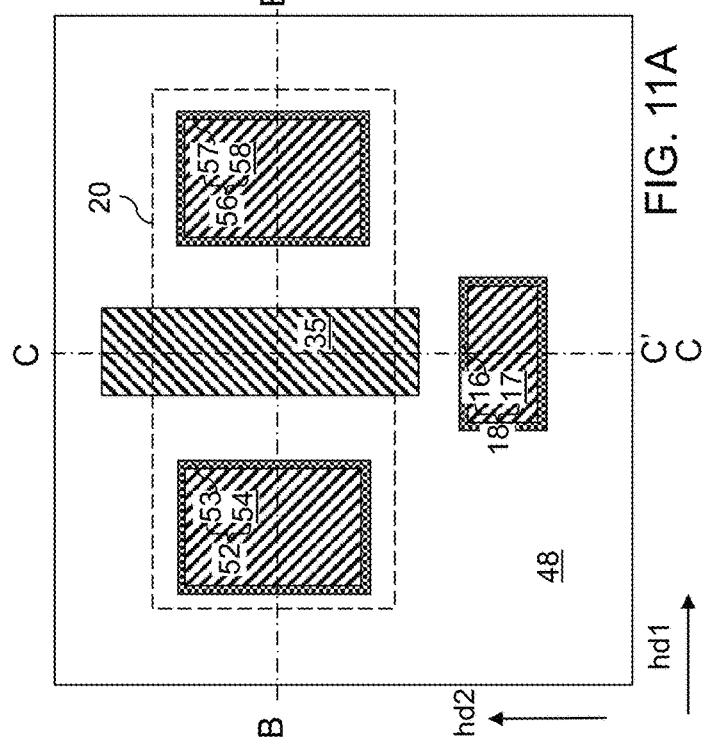
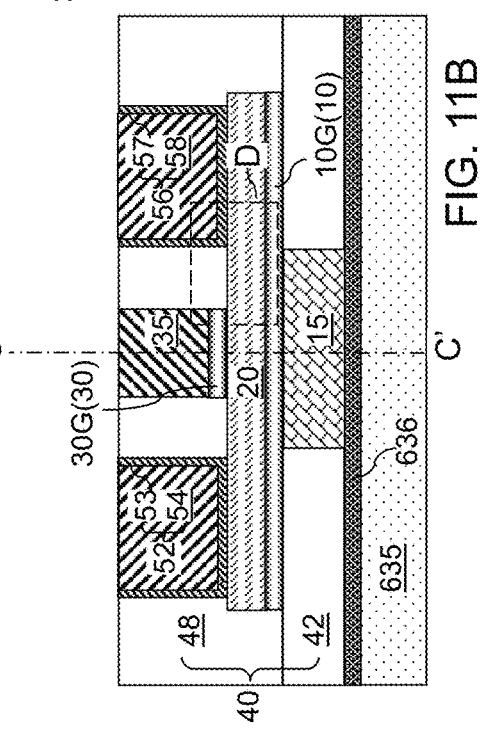
FIG. 11A
FIG. 11B
FIG. 11C
FIG. 11D

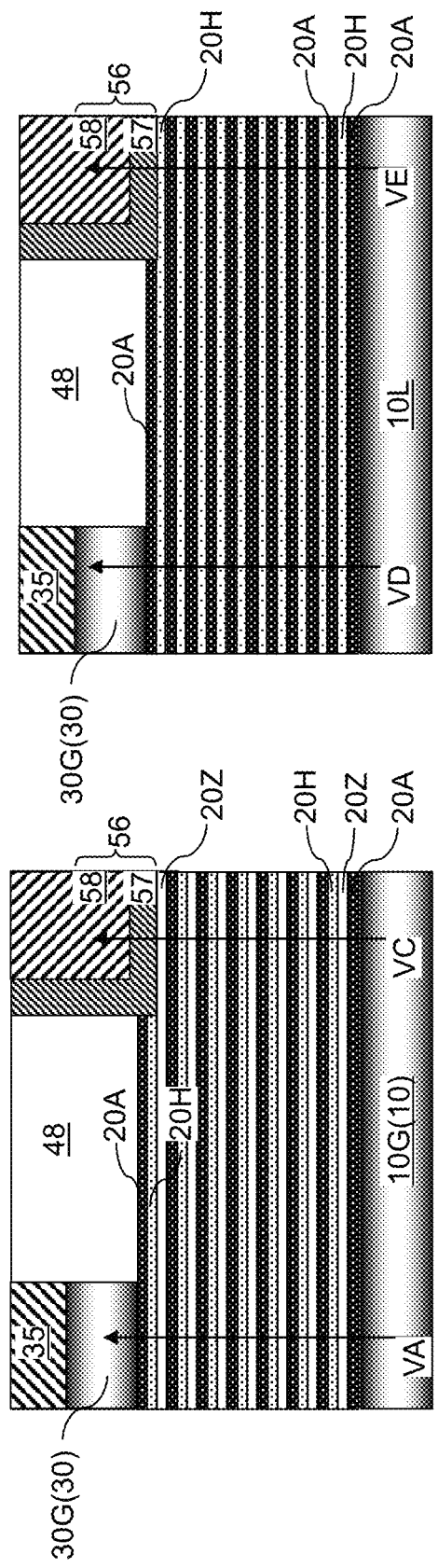

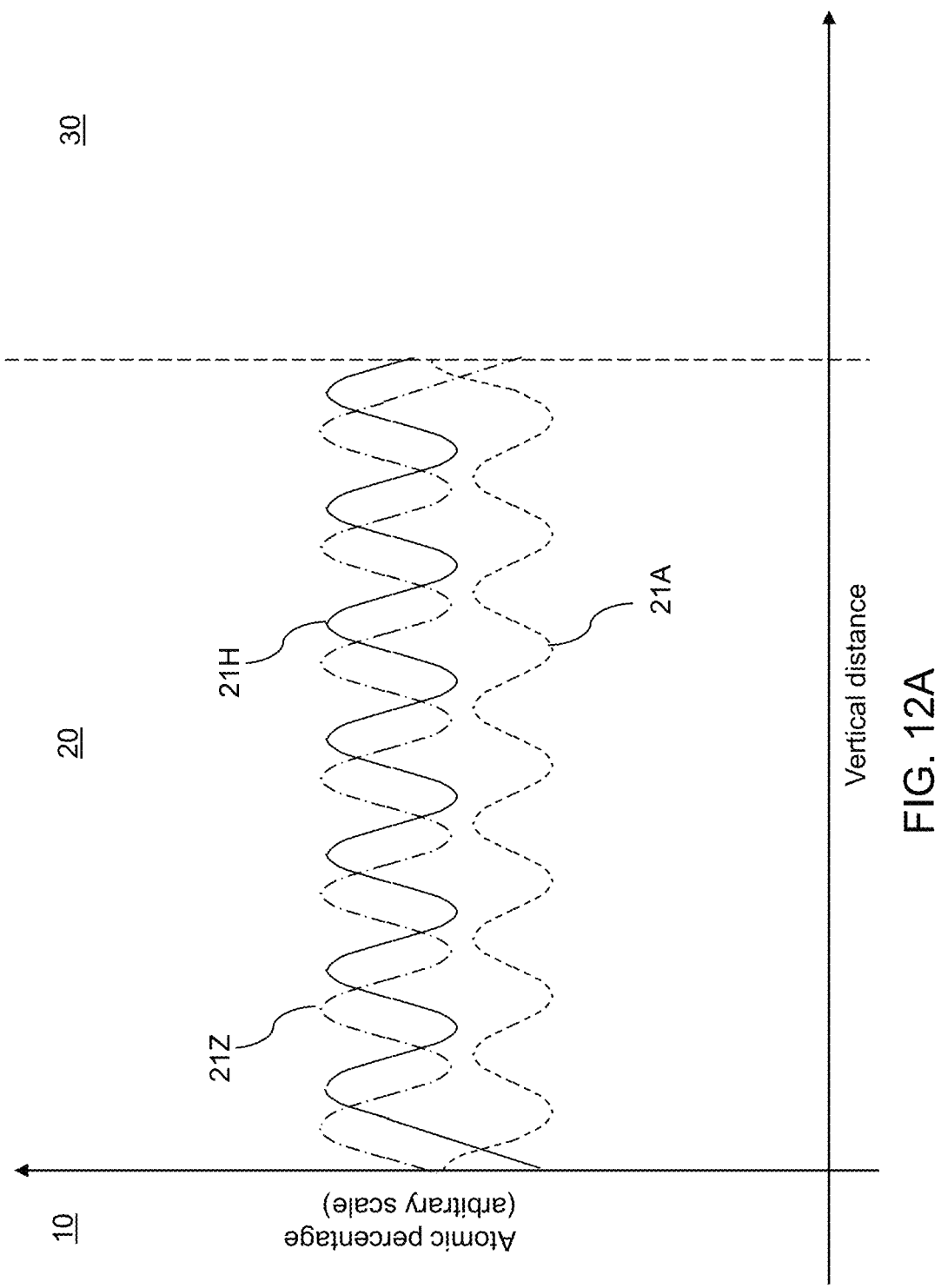

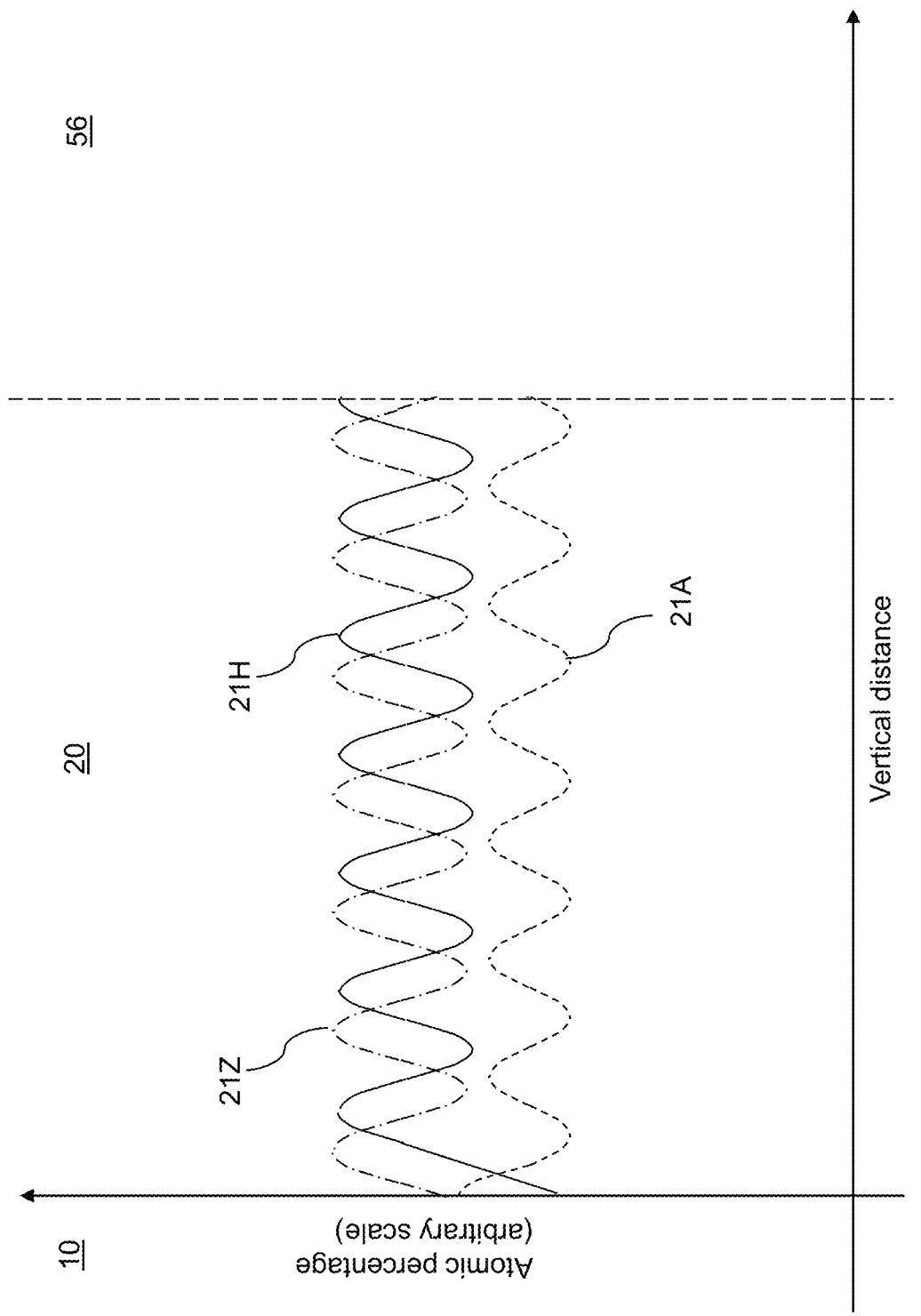

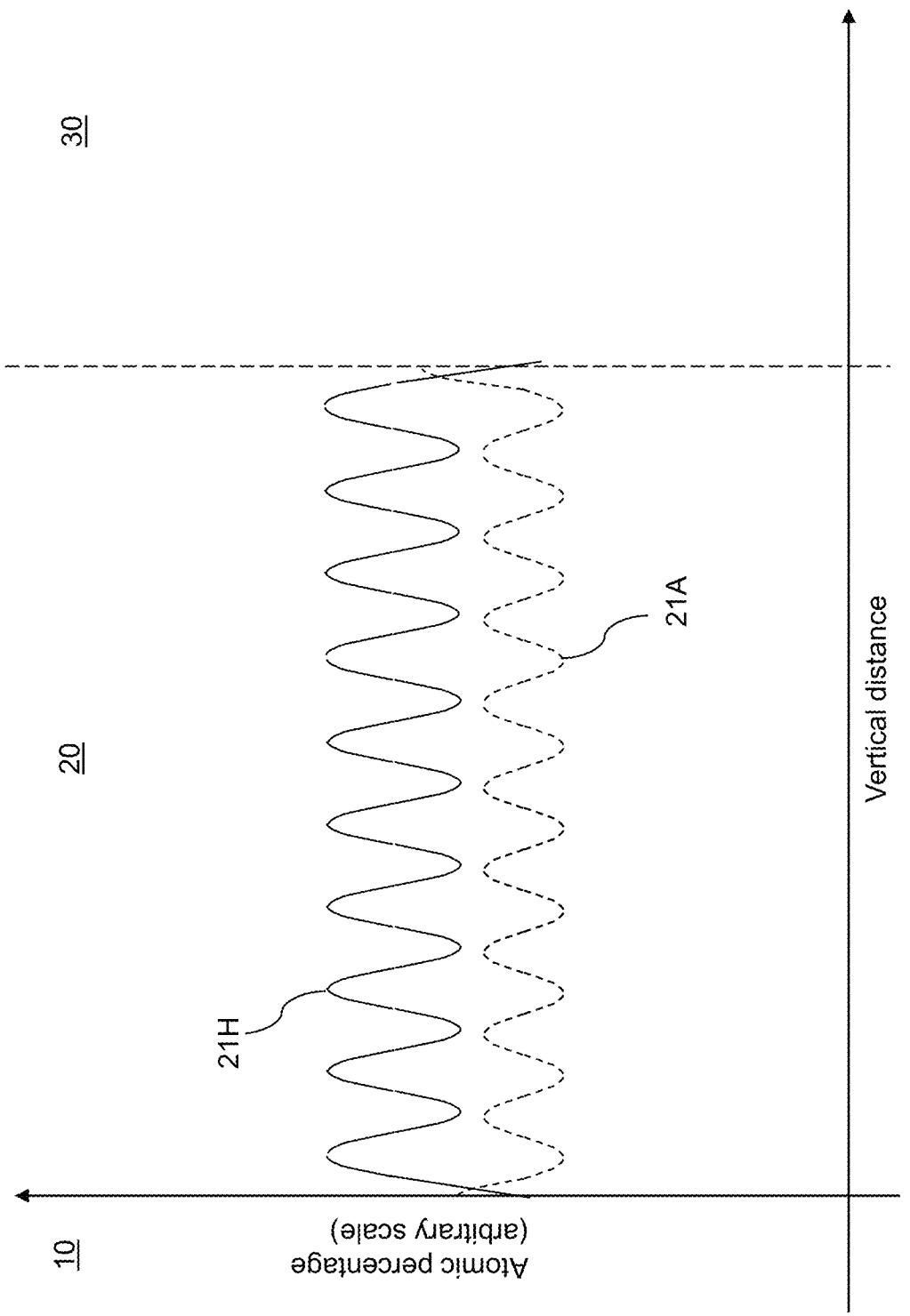

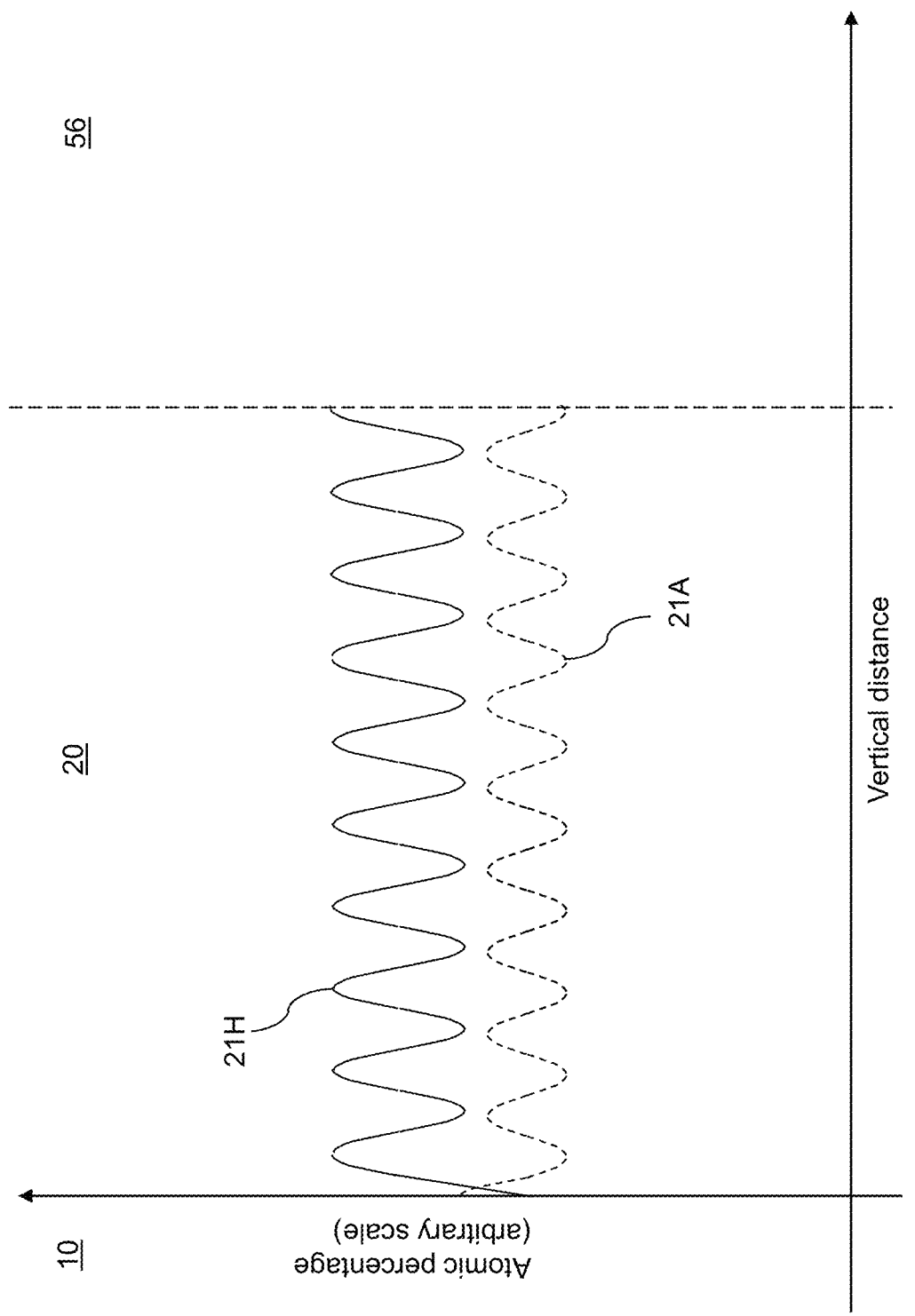

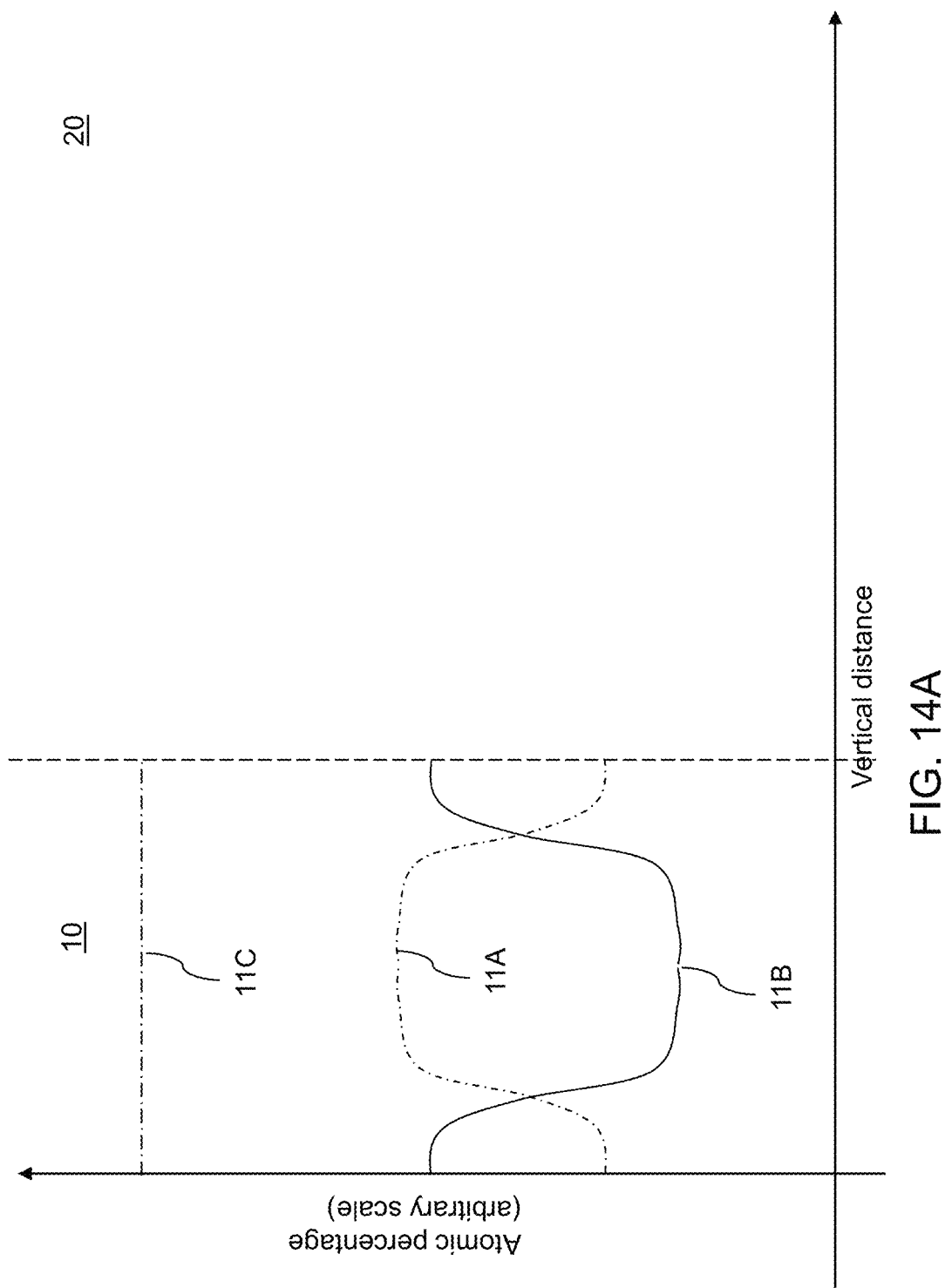

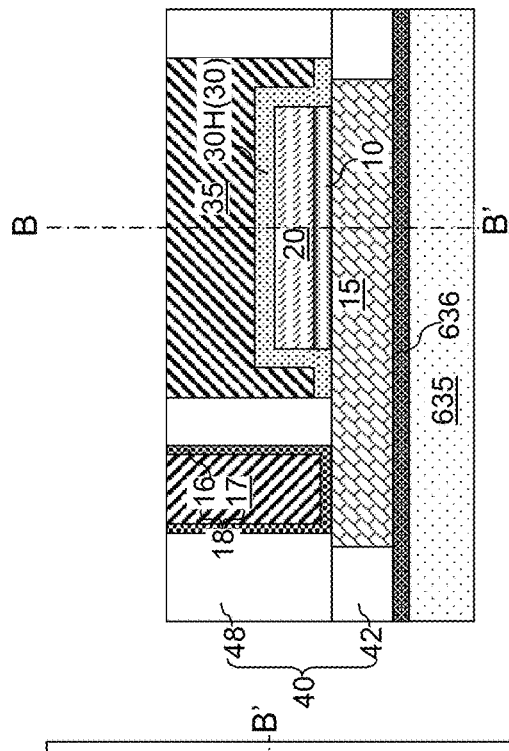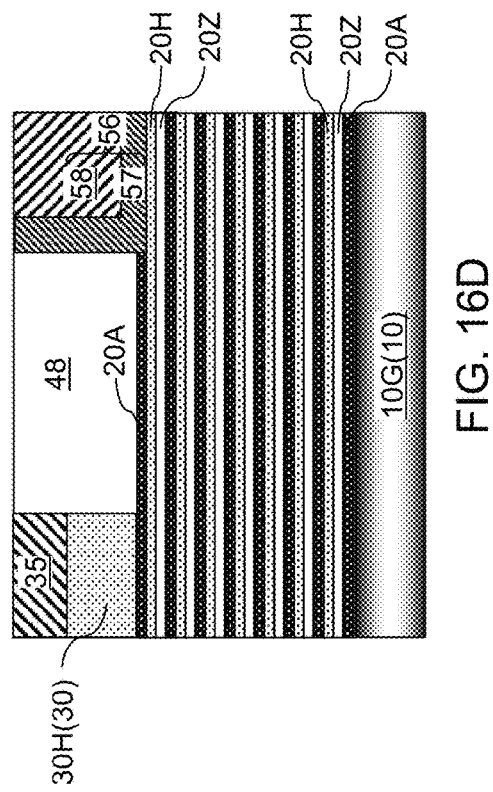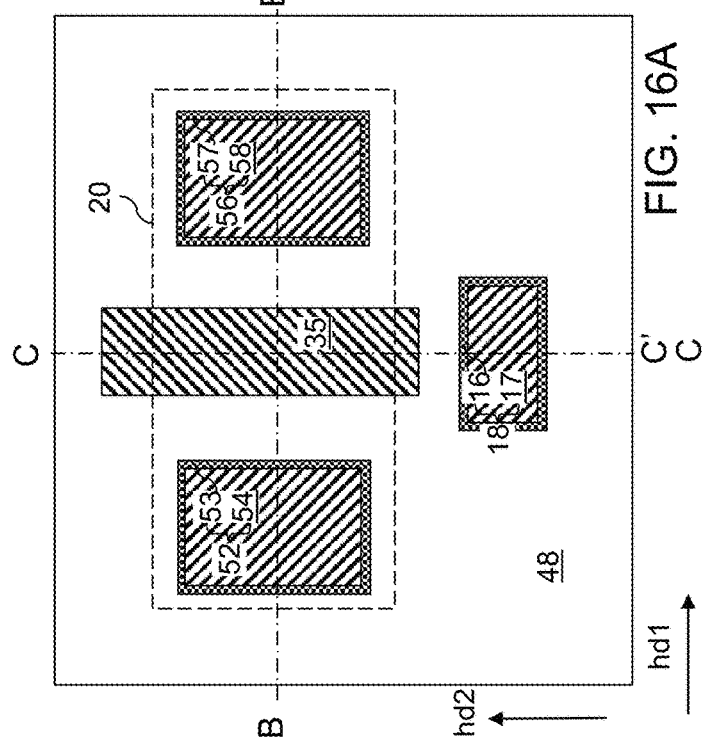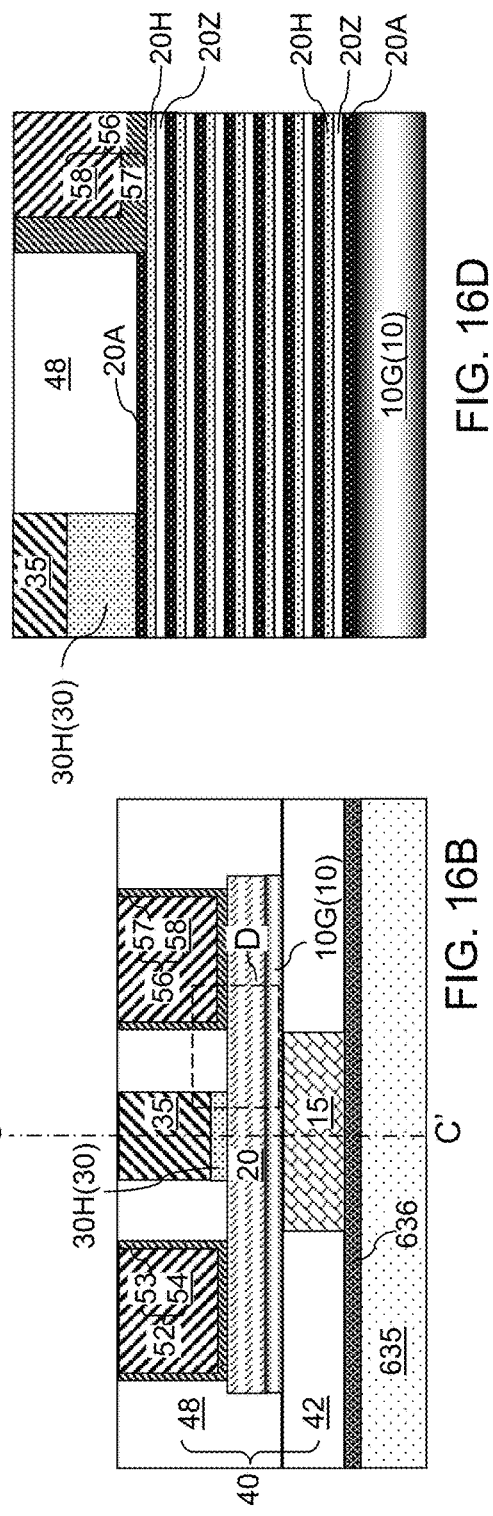
FIG. 16A
FIG. 16B
FIG. 16C
FIG. 16D

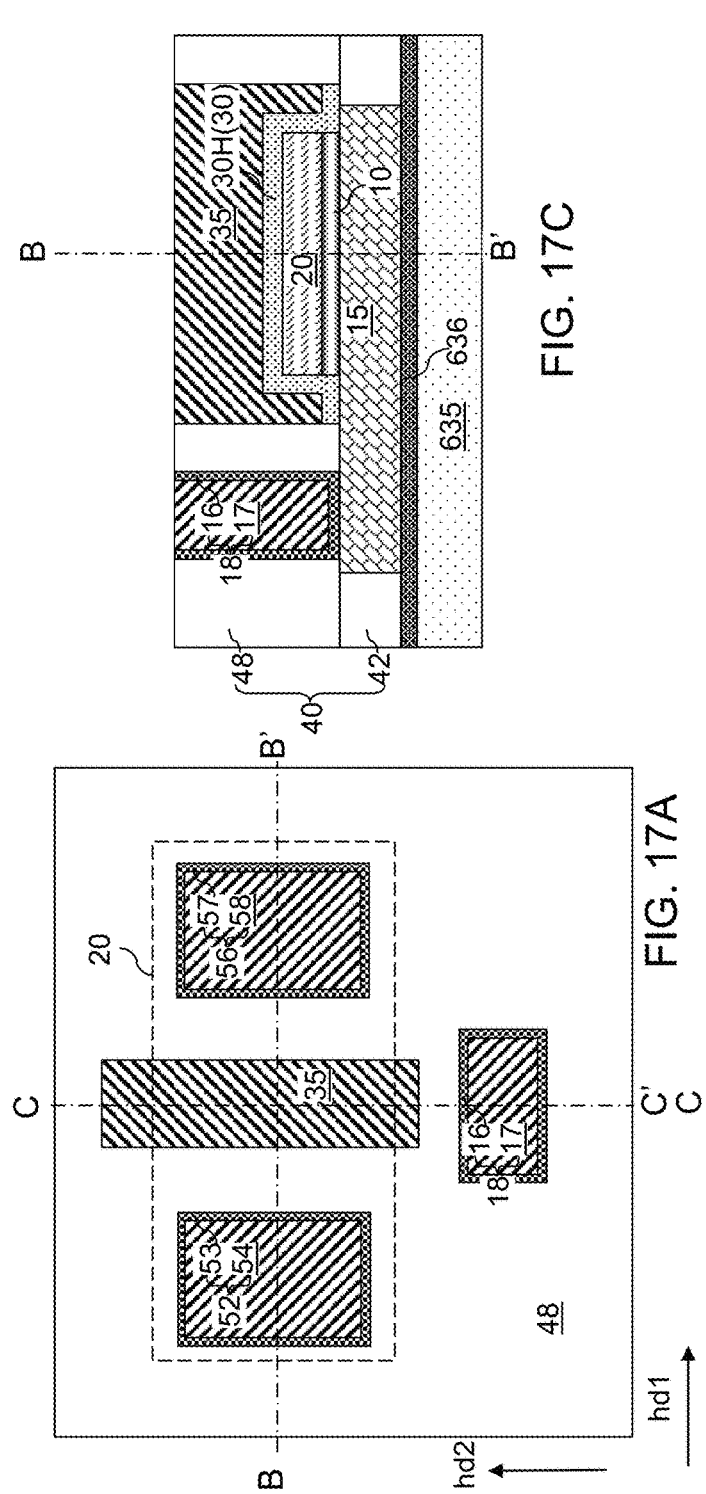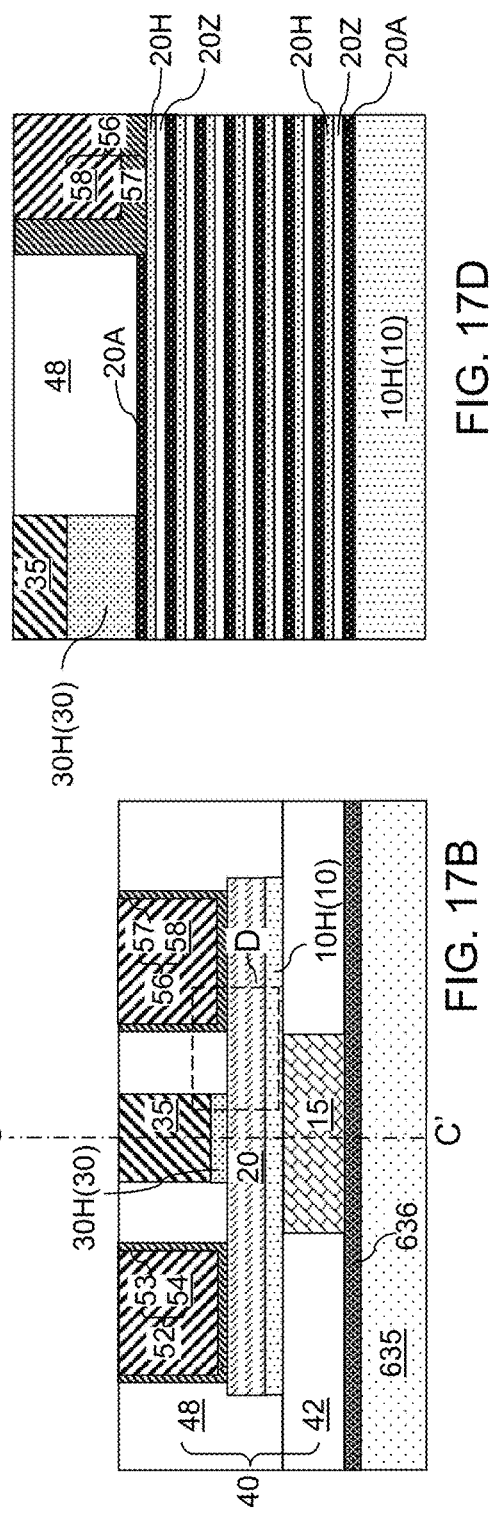

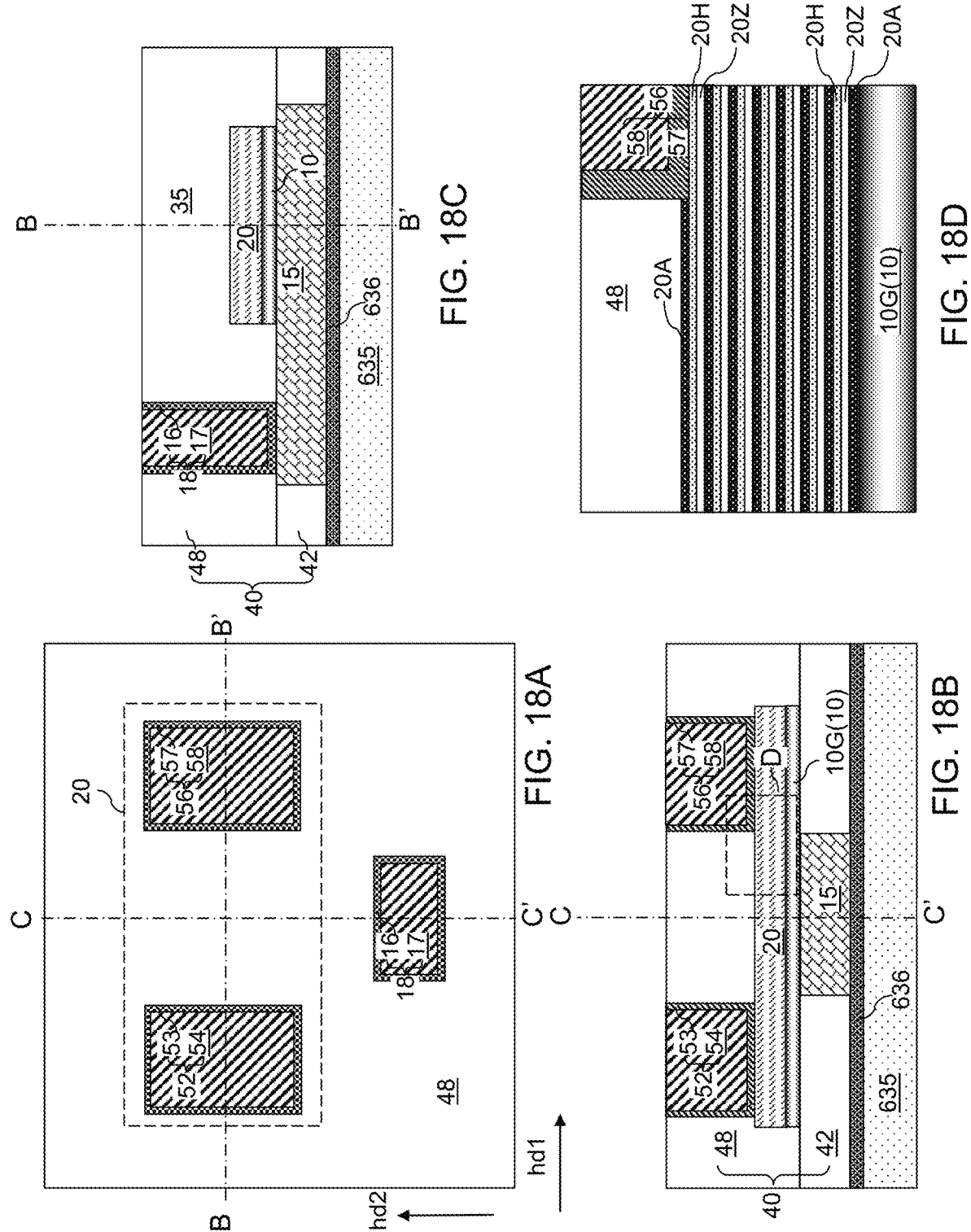

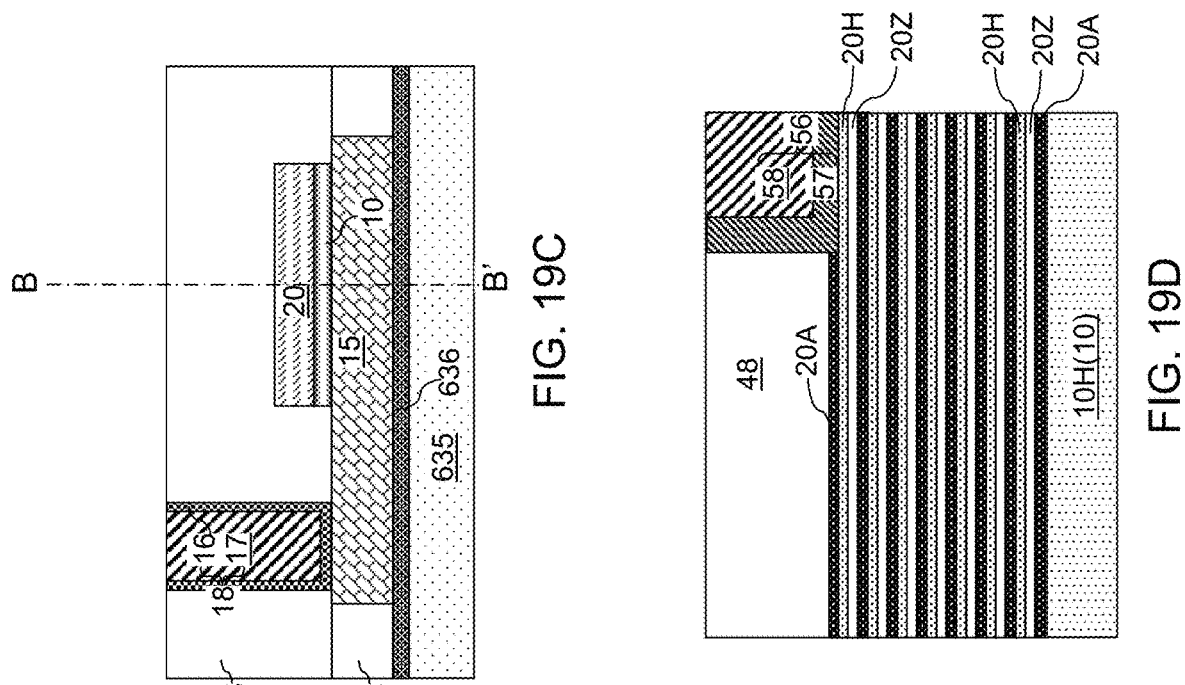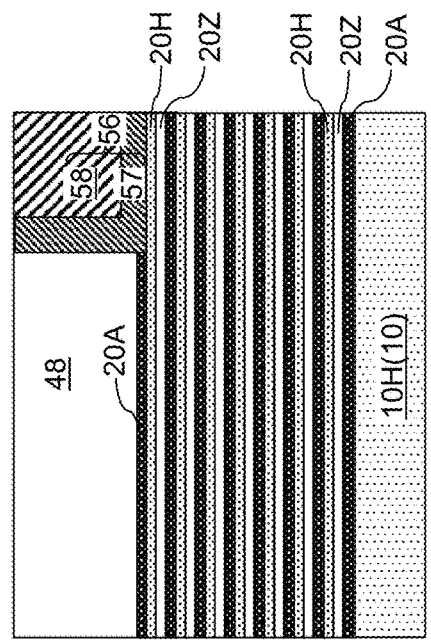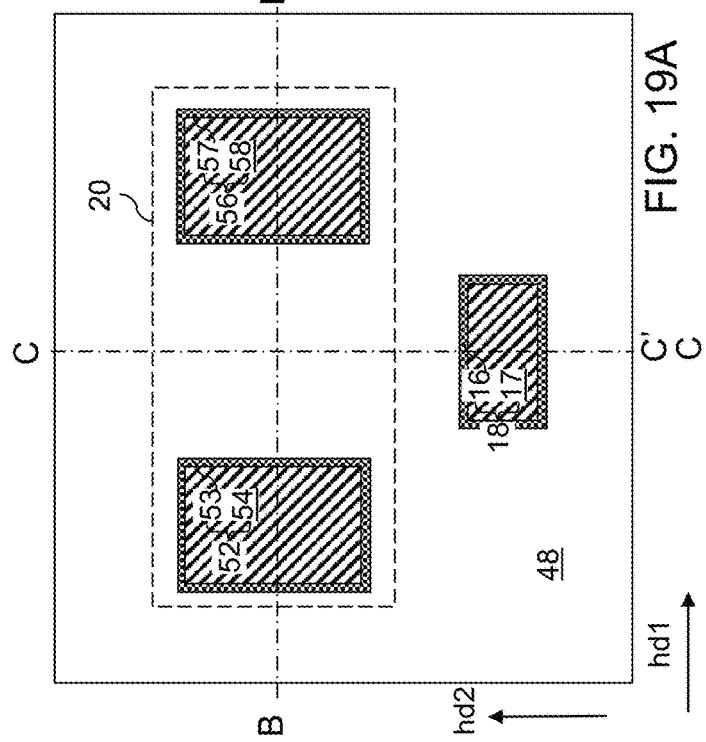
FIG. 19A FIG. 19B FIG. 19C FIG. 19D

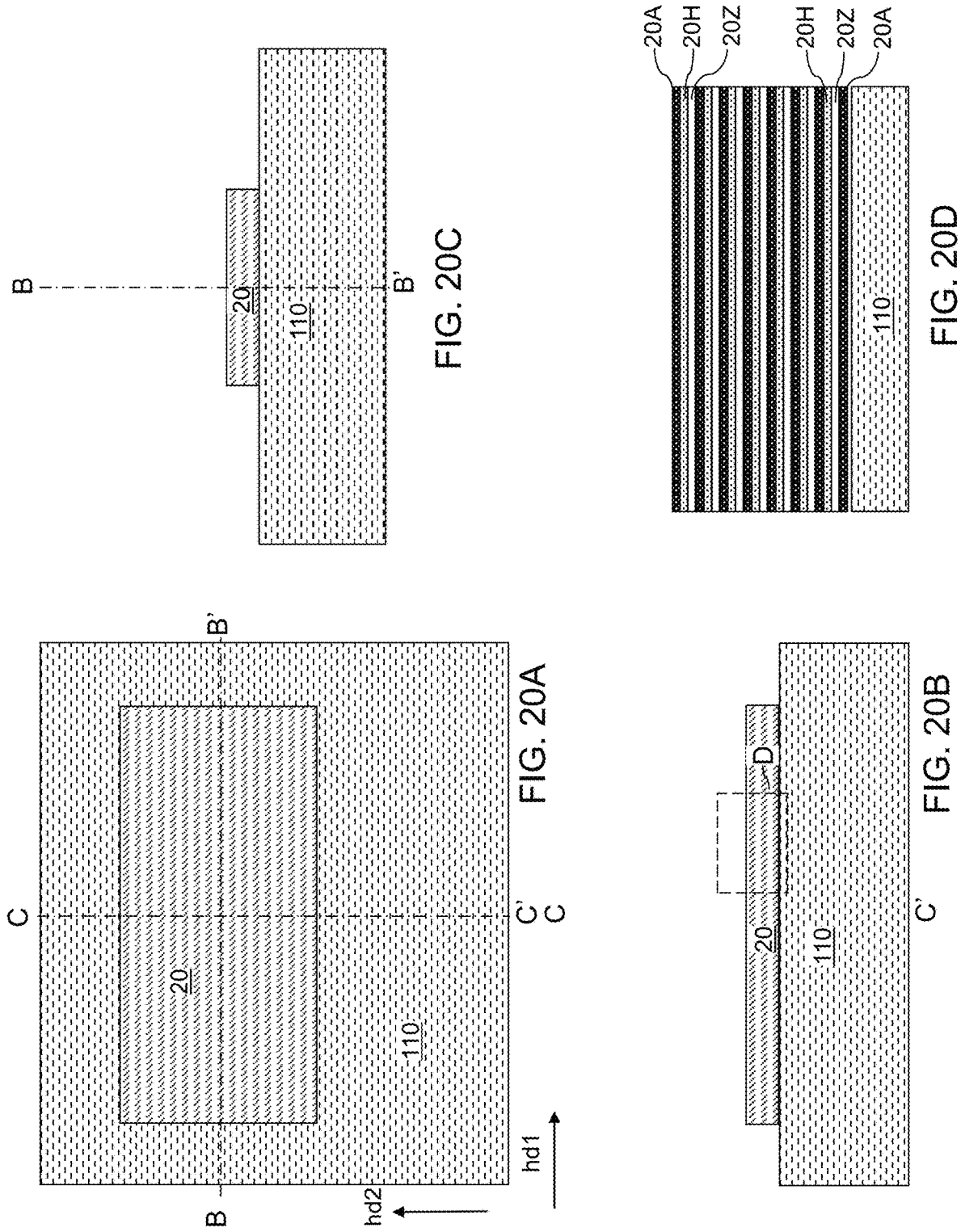

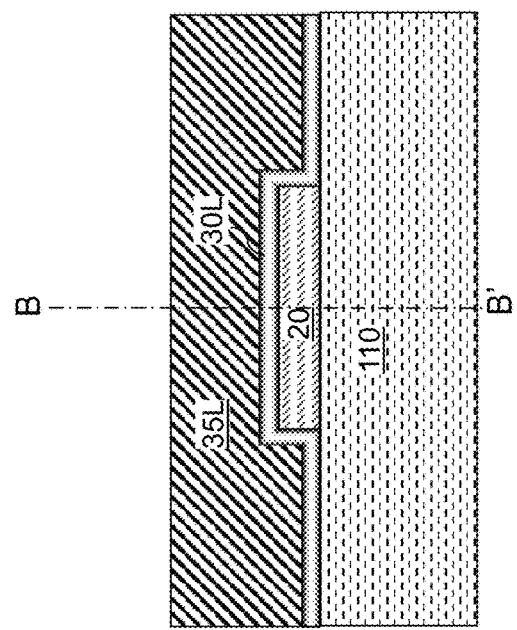
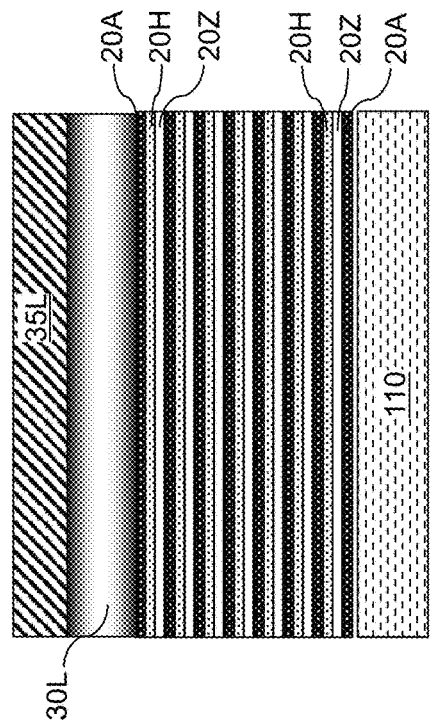
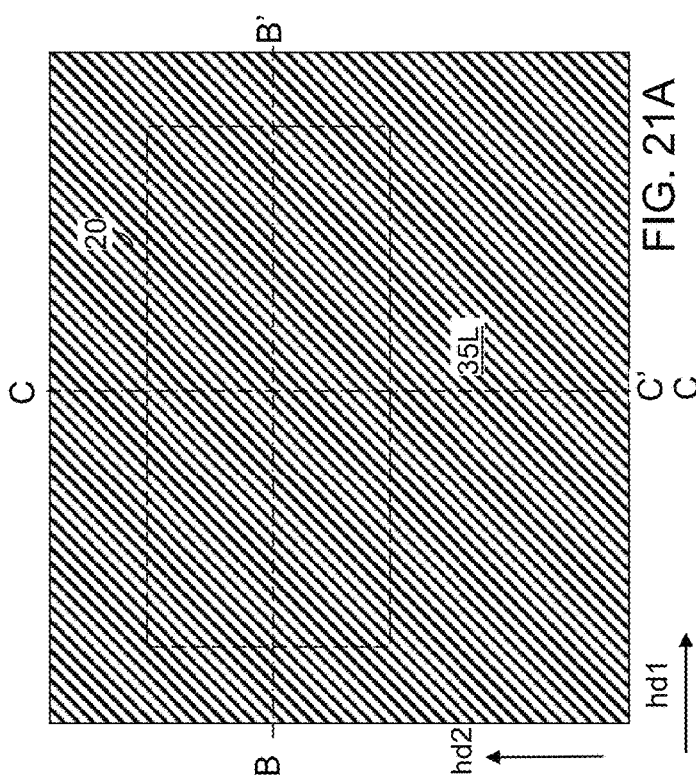
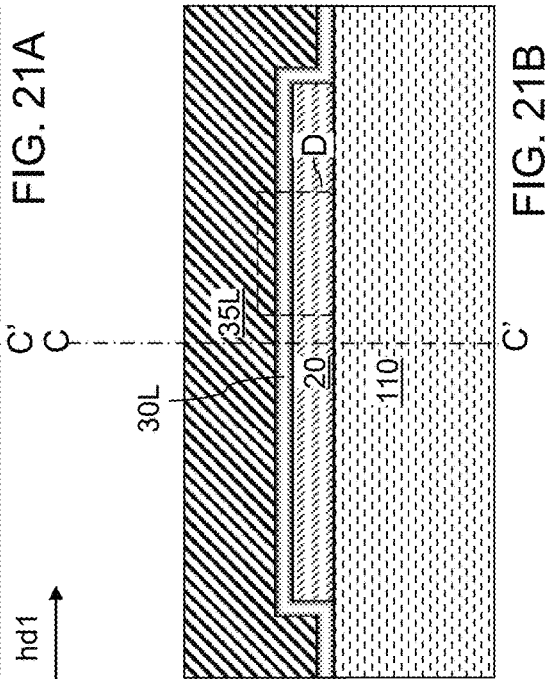

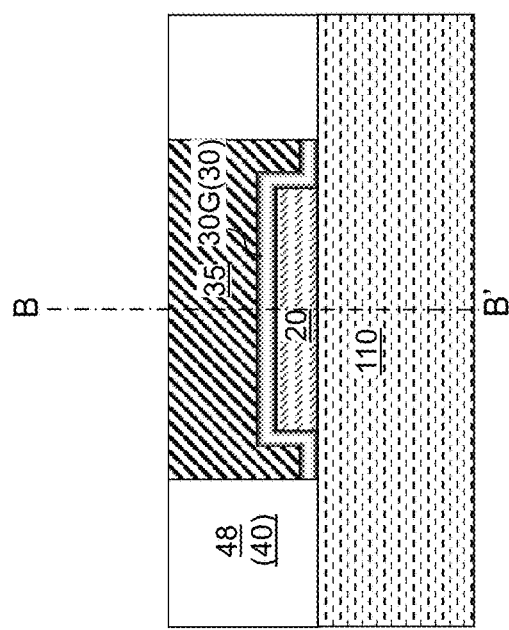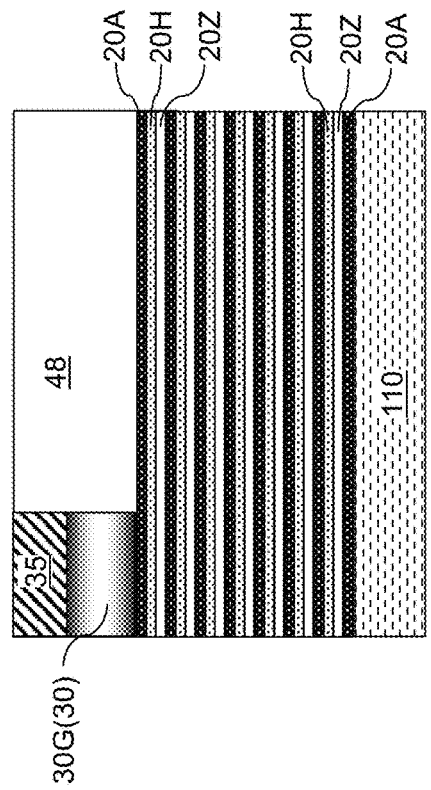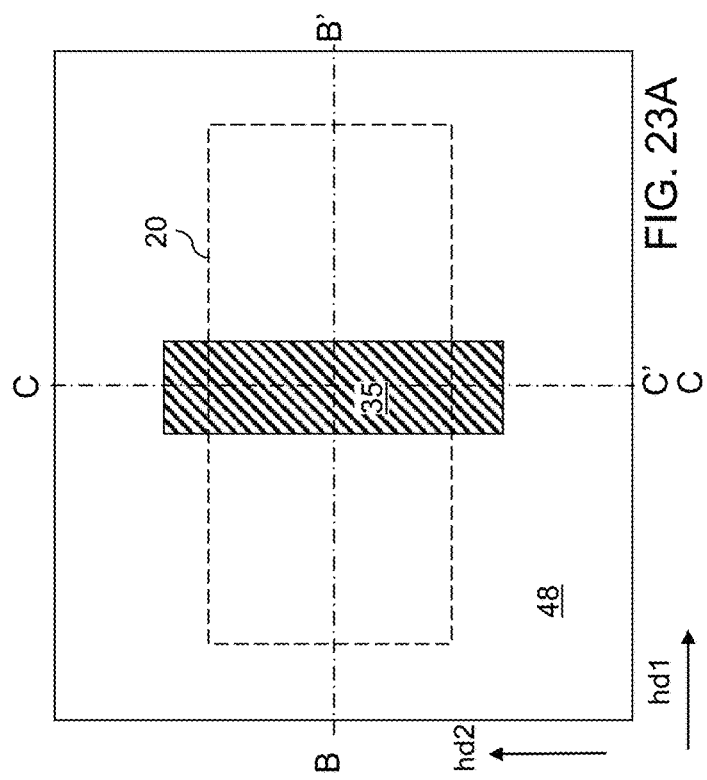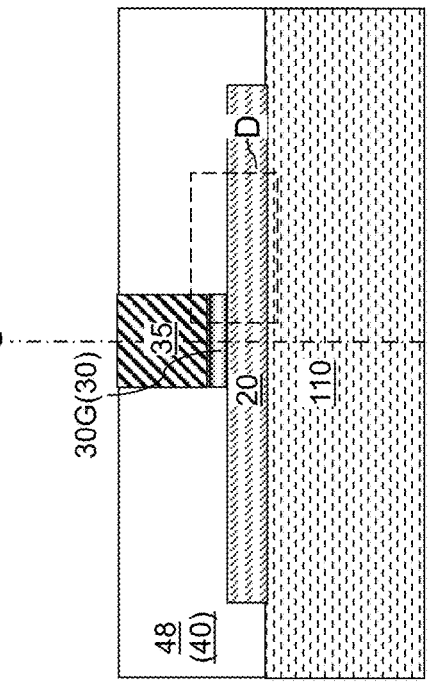

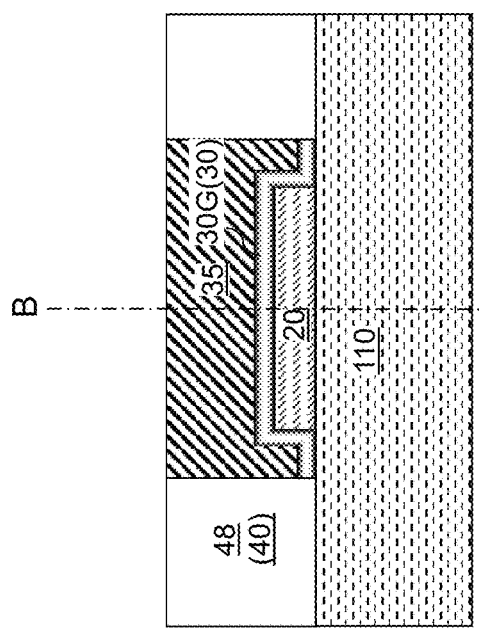
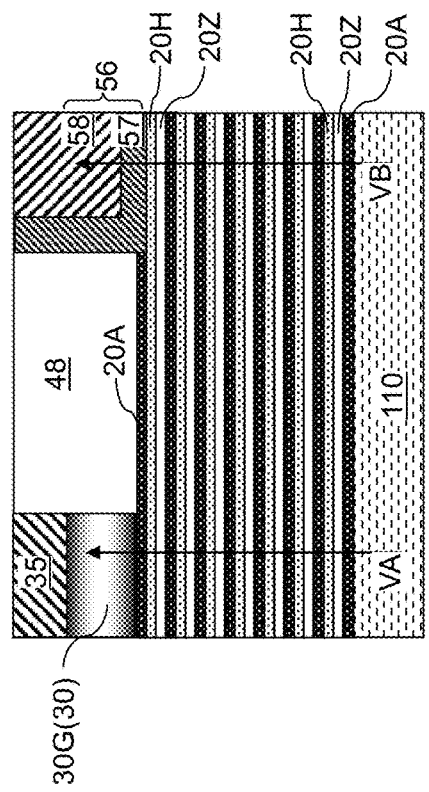
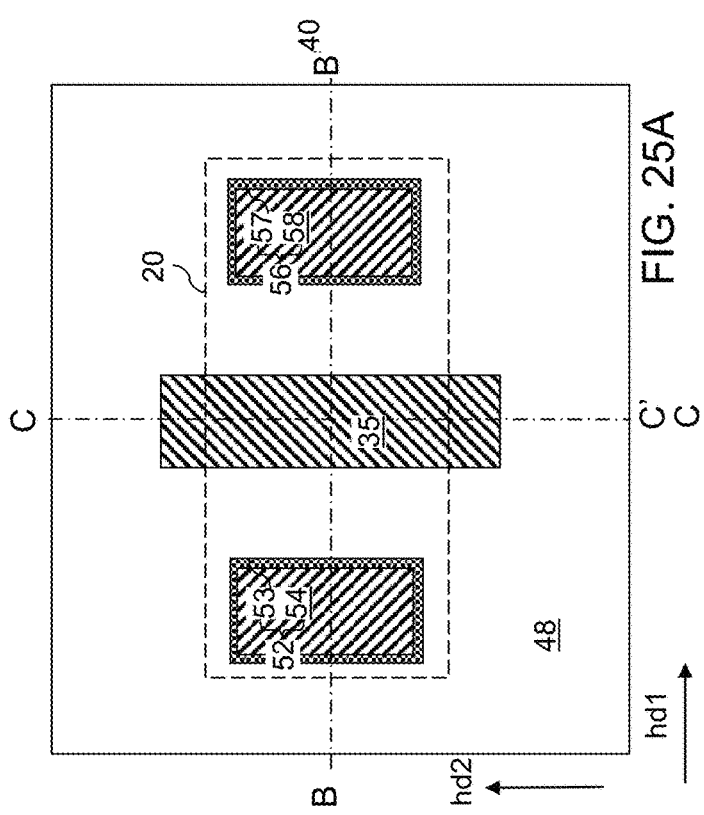
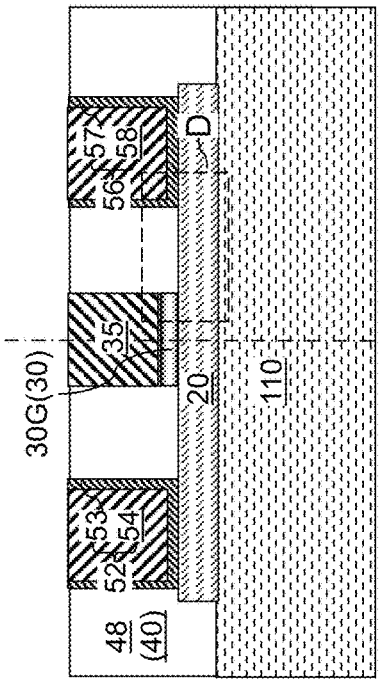
FIG. 25A
FIG. 25B
FIG. 25C
FIG. 25D

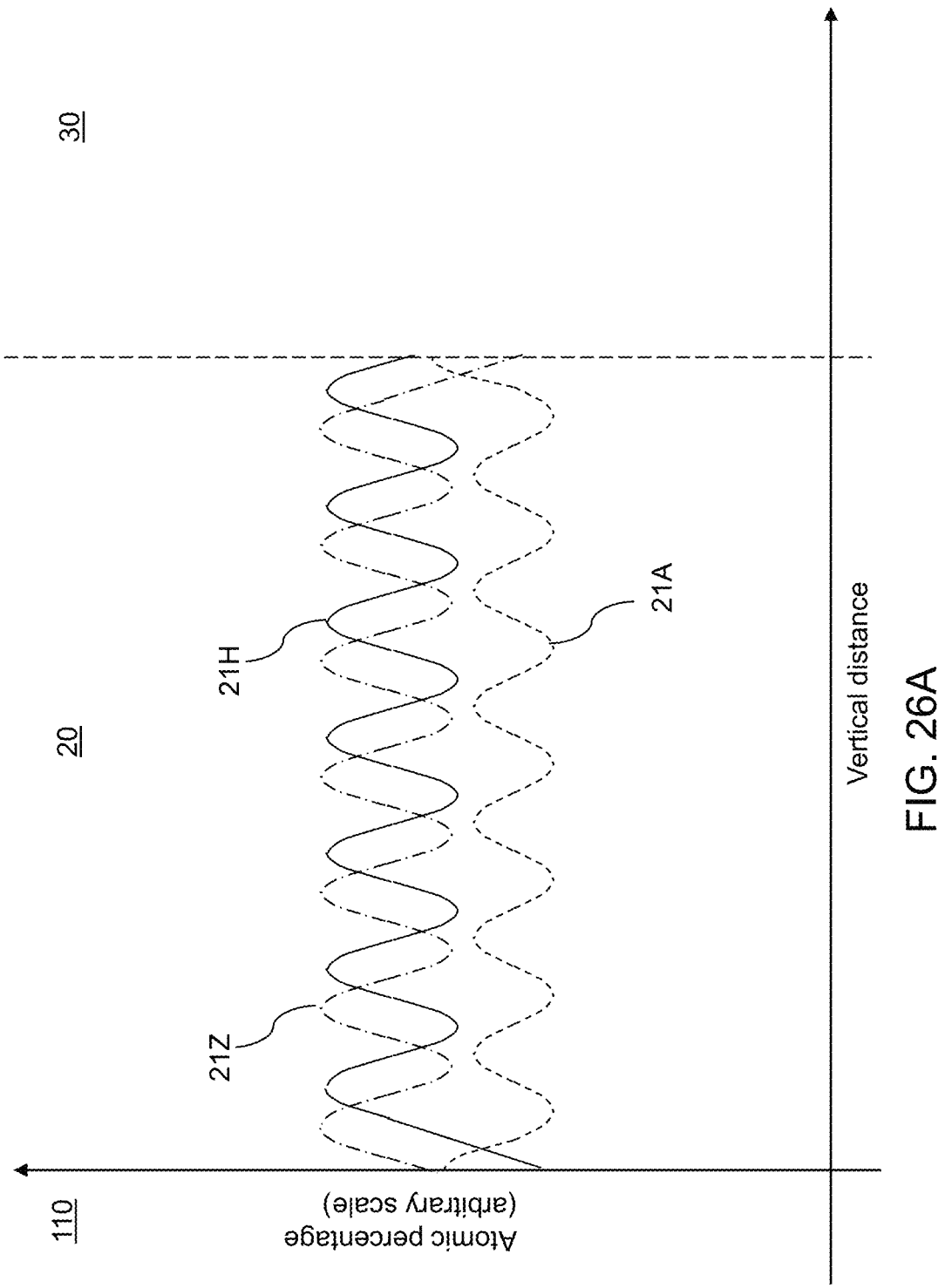

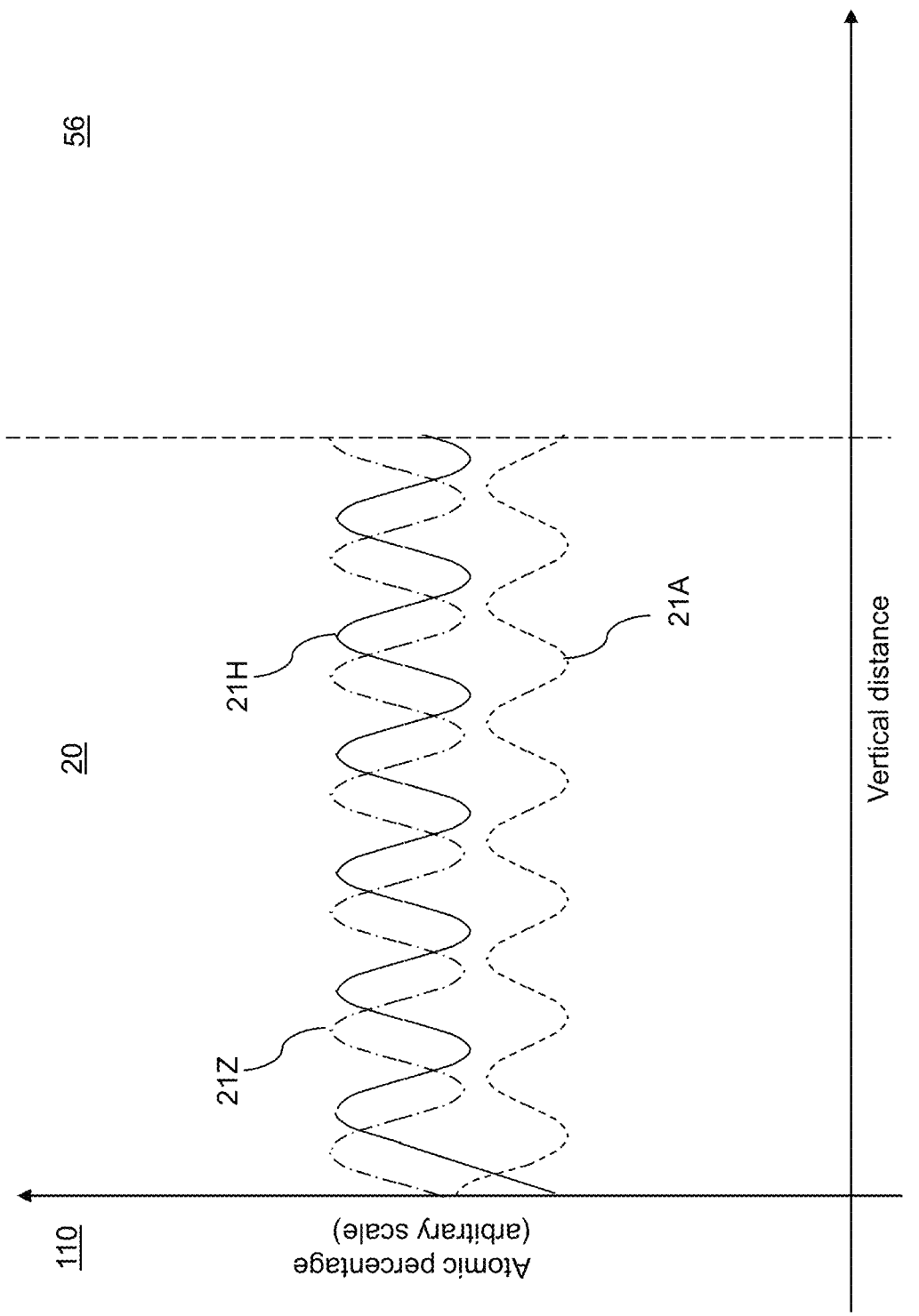

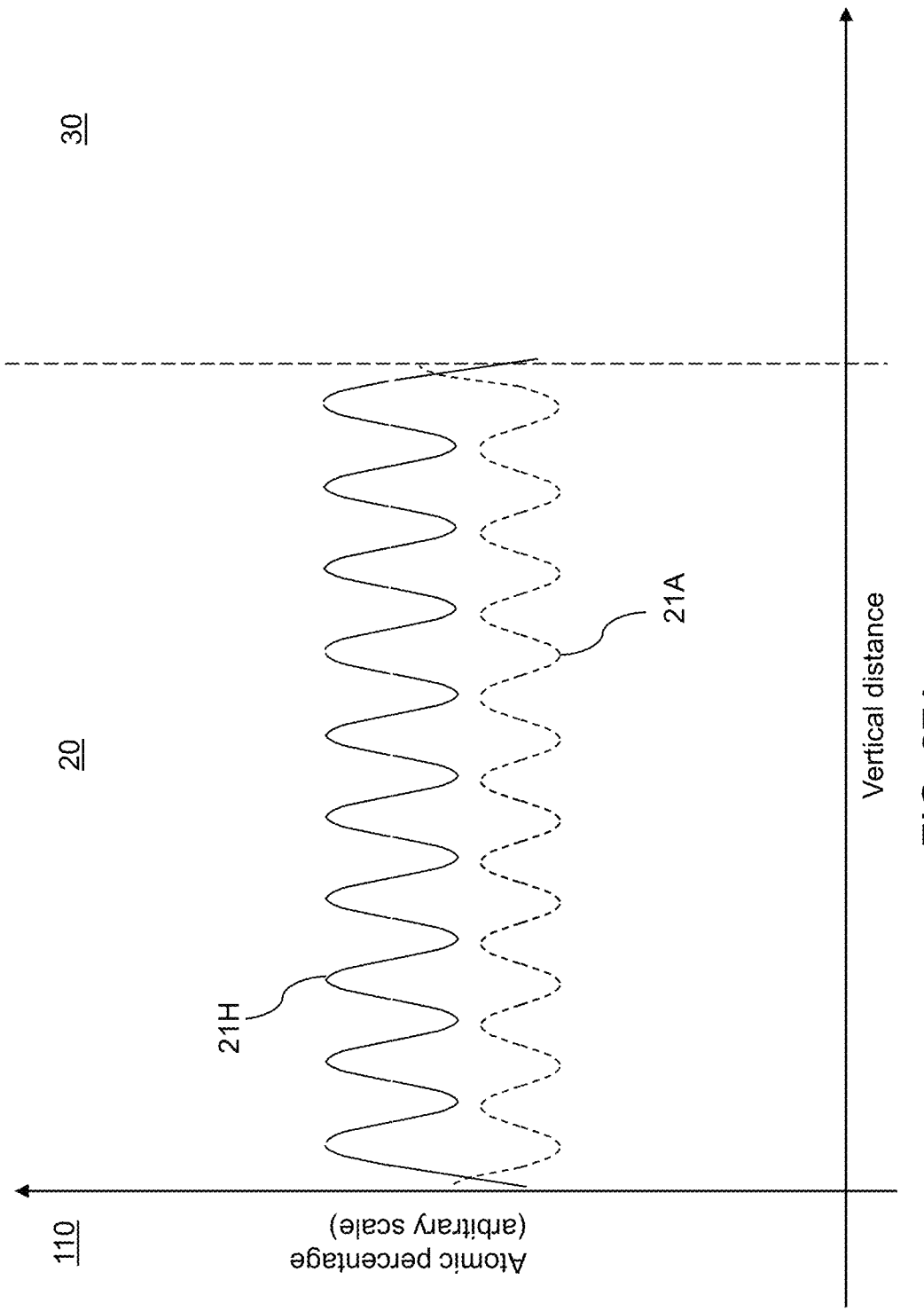

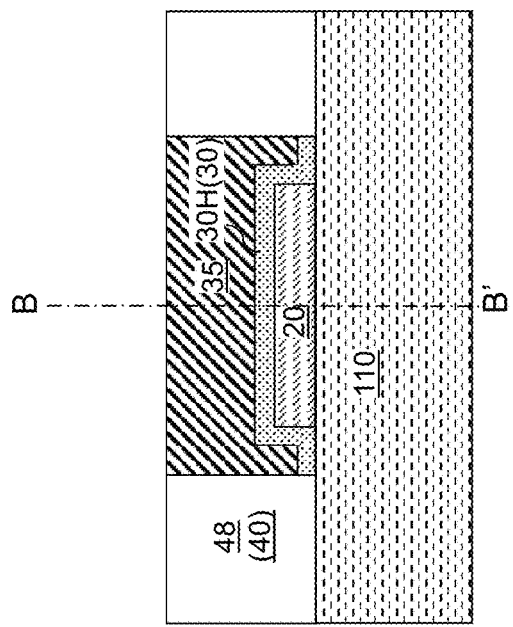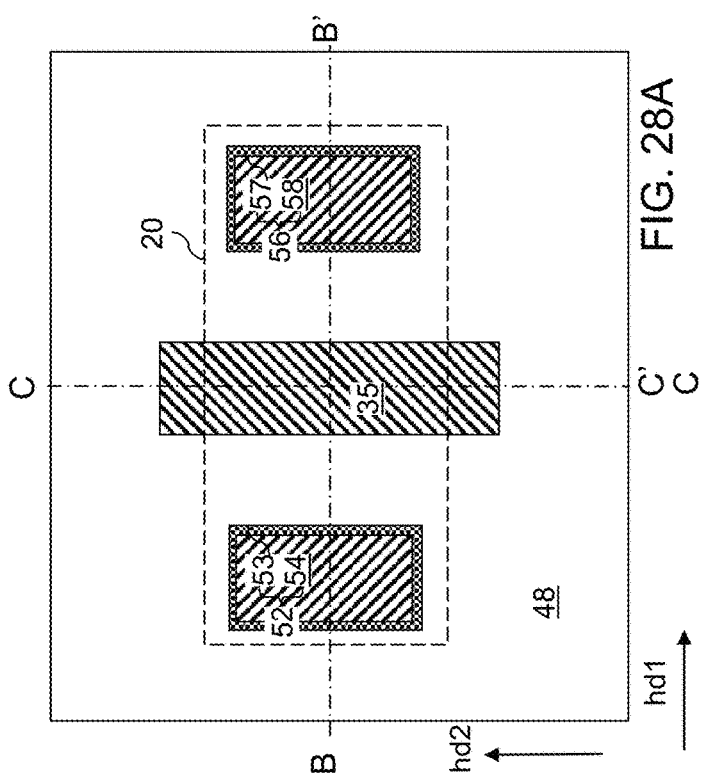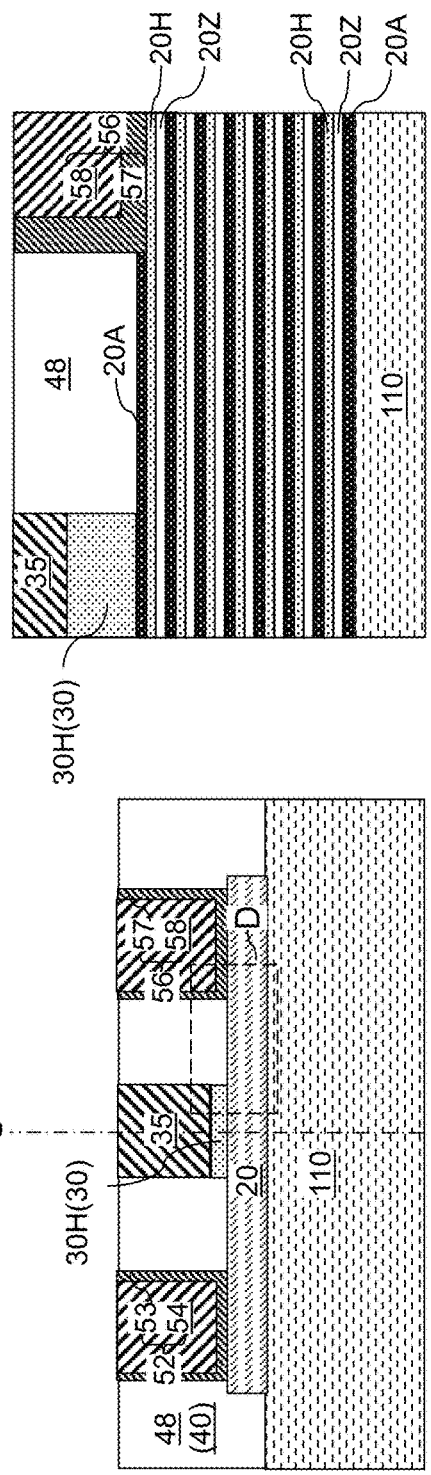

THIN FILM TRANSISTOR INCLUDING A COMPOSITIONALLY-MODULATED ACTIVE REGION AND METHODS FOR FORMING THE SAME

RELATED APPLICATIONS

This application claims the benefit of priority from a U.S. provisional application Ser. No. 63/153,043, titled "High Reliability TFT by Film Engineering", filed on Mar. 5, 2021, the entire contents of which are incorporated herein by reference.

BACKGROUND

Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques may not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of a portion of the first exemplary structure after formation of an insulating layer according to a first embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 4A is a top-down view of a region of the first exemplary structure after formation of a bottom gate electrode according to the first embodiment of the present disclosure.

FIG. 4B is a vertical cross-sectional view of the first exemplary structure along the vertical plane B-B' of FIG. 4A.

FIG. 4C is a vertical cross-sectional view of the first exemplary structure along the vertical plane C-C' of FIG. 4A.

FIG. 5A is a top-down view of a region of the first exemplary structure after formation of a continuous bottom gate dielectric layer and a continuous active layer according to the first embodiment of the present disclosure.

FIG. 5B is a vertical cross-sectional view of the first exemplary structure along the vertical plane B-B' of FIG. 5A.

FIG. 5C is a vertical cross-sectional view of the first exemplary structure along the vertical plane C-C' of FIG. 5A.

FIG. 5D is a magnified view of region D in FIG. 5B.

FIG. 5E is an alternative configuration for the magnified view of region D of FIG. 5B.

FIG. 6A is a top-down view of a region of the first exemplary structure after formation of a bottom gate dielectric and an active layer according to the first embodiment of the present disclosure.

FIG. 6B is a vertical cross-sectional view of the first exemplary structure along the vertical plane B-B' of FIG. 6A.

FIG. 6C is a vertical cross-sectional view of the first exemplary structure along the vertical plane C-C' of FIG. 6A.

FIG. 6D is a magnified view of region D in FIG. 6B.

FIG. 7A is a top-down view of a region of the first exemplary structure after formation of a continuous top gate dielectric layer and a continuous top gate electrode layer according to the first embodiment of the present disclosure.

FIG. 7B is a vertical cross-sectional view of the first exemplary structure along the vertical plane B-B' of FIG. 7A.

FIG. 7C is a vertical cross-sectional view of the first exemplary structure along the vertical plane C-C' of FIG. 7A.

FIG. 7D is a magnified view of region D in FIG. 7B.

FIG. 8A is a top-down view of a region of the first exemplary structure after formation of a top gate electrode and a top gate dielectric according to the first embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 8D is a magnified view of region D in FIG. 8B.

FIG. 9A is a top-down view of a region of the first exemplary structure after formation of a dielectric layer according to the first embodiment of the present disclosure.

FIG. 9B is a vertical cross-sectional view of the first exemplary structure along the vertical plane B-B' of FIG. 9A.

FIG. 9C is a vertical cross-sectional view of the first exemplary structure along the vertical plane C-C' of FIG. 9A.

FIG. 9D is a magnified view of region D in FIG. 9B.

FIG. 10A is a top-down view of a region of the first exemplary structure after formation of a source cavity, a drain cavity, and a bottom gate contact via cavity according to the first embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 10D is a magnified view of region D in FIG. 10B.

FIG. 10E is a magnified view of a first alternative configuration of region D in FIG. 10B.

FIG. 10F is a magnified view of a second alternative configuration of region D in FIG. 10B.

FIG. 11A is a top-down view of a region of the first exemplary structure after formation of a source electrode, a drain electrode, and a backside electrode contact via structure according to the first embodiment of the present disclosure.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 11D is a magnified view of region D in FIG. 11B.

FIG. 11E is a magnified view of a first alternative configuration of region D in FIG. 11B.

FIG. 11F is a magnified view of a second alternative configuration of region D in FIG. 11B.

FIG. 12A is a vertical compositional profile of various metallic elements within the active layer along the vertical line VA shown in FIG. 11D or FIG. 11E.

FIG. 12B is a vertical compositional profile of various metallic elements within the active layer along the vertical line VB shown in FIG. 11D.

FIG. 13A is a vertical compositional profile of various metallic elements within the active layer along the vertical line VD shown in FIG. 11F.

FIG. 13B is a vertical compositional profile of various metallic elements within the active layer along the vertical line VE shown in FIG. 11F.

FIG. 14A is a vertical compositional profile of various metallic elements within a bottom gate dielectric according to an embodiment of the present disclosure.

FIG. 16A is a top-down view of a region of a third exemplary structure after formation of a source electrode, a drain electrode, and a backside electrode contact via structure according to a third embodiment of the present disclosure.

FIG. 16B is a vertical cross-sectional view of the third exemplary structure along the vertical plane B-B' of FIG. 16A.

FIG. 16C is a vertical cross-sectional view of the third exemplary structure along the vertical plane C-C' of FIG. 16A.

FIG. 16D is a magnified view of region D in FIG. 16B.

FIG. 17A is a top-down view of a region of a fourth exemplary structure after formation of a source electrode, a drain electrode, and a backside electrode contact via structure according to a fourth embodiment of the present disclosure.

FIG. 17B is a vertical cross-sectional view of the fourth exemplary structure along the vertical plane B-B' of FIG. 17A.

FIG. 17C is a vertical cross-sectional view of the fourth exemplary structure along the vertical plane C-C' of FIG. 17A.

FIG. 17D is a magnified view of region D in FIG. 17B.

FIG. 18A is a top-down view of a region of a fifth exemplary structure after formation of a source electrode, a drain electrode, and a backside electrode contact via structure according to a fifth embodiment of the present disclosure.

FIG. 18B is a vertical cross-sectional view of the fifth exemplary structure along the vertical plane B-B' of FIG. 18A.

FIG. 18C is a vertical cross-sectional view of the fifth exemplary structure along the vertical plane C-C' of FIG. 18A.

FIG. 18D is a magnified view of region D in FIG. 18B.

FIG. 19A is a top-down view of a region of a sixth exemplary structure after formation of a source electrode, a drain electrode, and a backside electrode contact via structure according to a sixth embodiment of the present disclosure.

FIG. 19B is a vertical cross-sectional view of the sixth exemplary structure along the vertical plane B-B' of FIG. 19A.

FIG. 19C is a vertical cross-sectional view of the sixth exemplary structure along the vertical plane C-C' of FIG. 19A.

FIG. 19D is a magnified view of region D in FIG. 19B.

FIG. 20A is a top-down view of a region of a seventh exemplary structure after formation of an active layer according to a seventh embodiment of the present disclosure.

FIG. 20B is a vertical cross-sectional view of the seventh exemplary structure along the vertical plane B-B' of FIG. 20A.

FIG. 20C is a vertical cross-sectional view of the seventh exemplary structure along the vertical plane C-C' of FIG. 20A.

FIG. 20D is a magnified view of region D in FIG. 20B.

FIG. 21A is a top-down view of a region of the seventh exemplary structure after formation of a continuous top gate dielectric layer and a continuous top gate electrode layer according to the seventh embodiment of the present disclosure.

FIG. 21B is a vertical cross-sectional view of the seventh exemplary structure along the vertical plane B-B' of FIG. 21A.

FIG. 21C is a vertical cross-sectional view of the seventh exemplary structure along the vertical plane C-C' of FIG. 21A.

FIG. 21D is a magnified view of region D in FIG. 21B.

FIG. 23A is a top-down view of a region of the seventh exemplary structure after formation of a dielectric layer according to the seventh embodiment of the present disclosure.

FIG. 23B is a vertical cross-sectional view of the seventh exemplary structure along the vertical plane B-B' of FIG. 23A.

FIG. 23C is a vertical cross-sectional view of the seventh exemplary structure along the vertical plane C-C' of FIG. 23A.

FIG. 23D is a magnified view of region D in FIG. 23B.

FIG. 25A is a top-down view of a region of the seventh exemplary structure after formation of a source electrode, a drain electrode, and a backside electrode contact via structure according to the seventh embodiment of the present disclosure.

FIG. 25B is a vertical cross-sectional view of the seventh exemplary structure along the vertical plane B-B' of FIG. 25A.

FIG. 25C is a vertical cross-sectional view of the seventh exemplary structure along the vertical plane C-C' of FIG. 25A.

FIG. 25D is a magnified view of region D in FIG. 25B.

FIG. 26A is a vertical compositional profile of various metallic elements within the active layer along the vertical line VA shown in FIG. 25D or FIG. 25E.

FIG. 26C is a vertical compositional profile of various metallic elements within the active layer along the vertical line VC shown in FIG. 25E.

FIG. 27A is a vertical compositional profile of various metallic elements within the active layer along the vertical line VD shown in FIG. 25F.

FIG. 28A is a top-down view of a region of a eighth exemplary structure after formation of a source electrode, a drain electrode, and a backside electrode contact via structure according to a eighth embodiment of the present disclosure.

FIG. 28B is a vertical cross-sectional view of the eighth exemplary structure along the vertical plane B-B' of FIG. 28A.

FIG. 28C is a vertical cross-sectional view of the eighth exemplary structure along the vertical plane C-C' of FIG. 28A.

FIG. 28D is a magnified view of region D in FIG. 28B.

DETAILED DESCRIPTION

Figure 1:
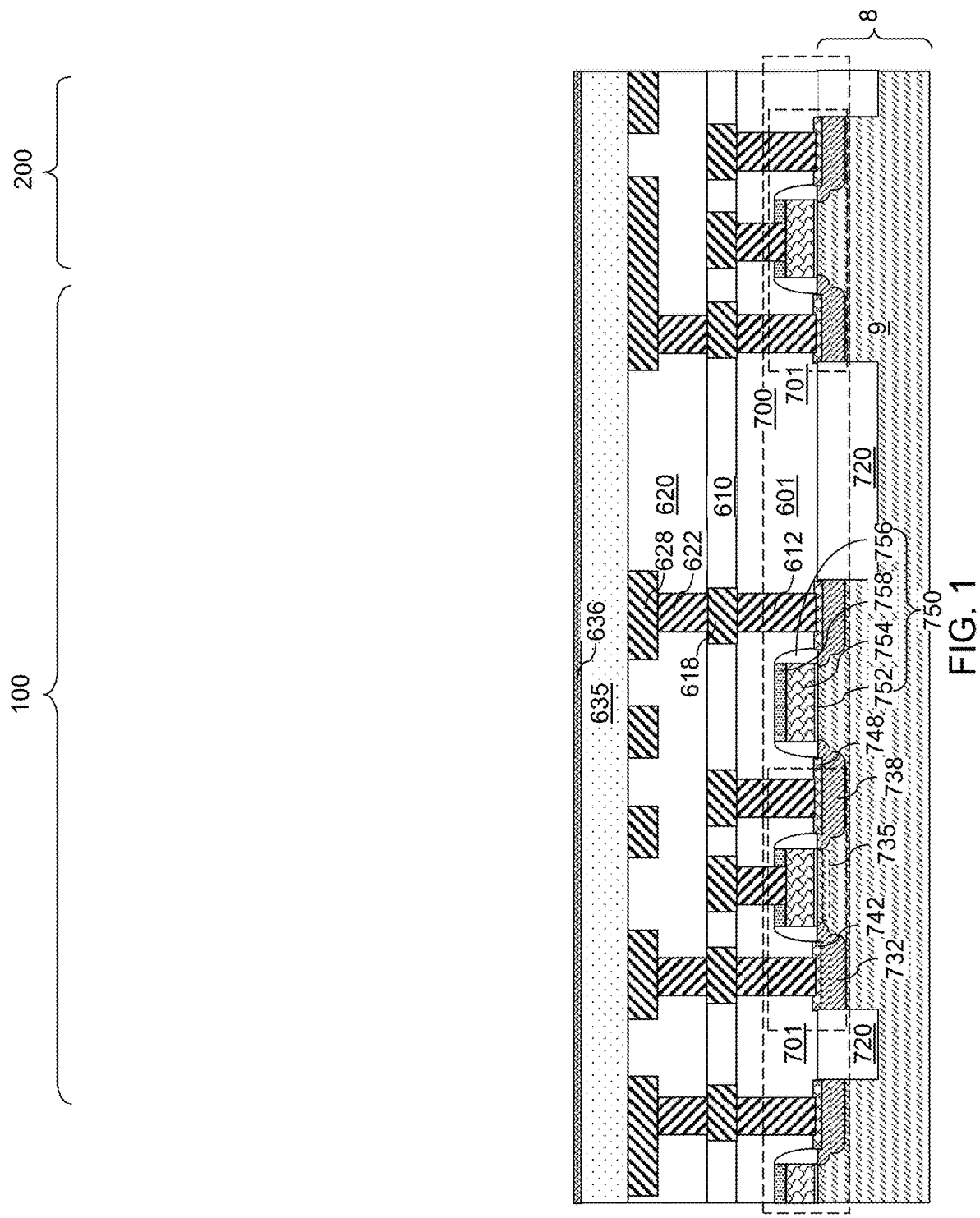
FIG. 1 is a vertical cross-sectional view of a first exemplary structure after formation of complementary metal-oxide-semiconductor (CMOS) transistors, first metal interconnect structures formed in lower-level dielectric layers, an insulating spacer layer, and an optional etch stop dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including at least one thin film transistor such as a plurality of thin film transistors. The thin film transistors may be formed over any substrate, which may be an insulating substrate, a conductive substrate, or a semiconducting substrate. In embodiments that utilize a conductive substrate or a semiconductor substrate, at least one insulating layer may be used to provide electrical isolation between the thin film transistors and the underlying substrate. In embodiments in which a semiconductor substrate such as a single crystalline silicon substrate is used, field effect transistors using portions of the semiconductor substrate as semiconductor channels may be formed on the semiconductor substrate, and metal interconnect structures embedded in interconnect-level dielectric layers may be formed over the field effect transistors. The thin film transistors may be formed over the field effect transistors including single crystalline semiconductor channels and over the metal interconnect structures, which are herein referred to as lower-level metal interconnect structures.

According to an aspect of the present disclosure, an active layer may be formed with a vertical compositional modulation. The component layers within the semiconductor metal oxide layer may be arranged such that surface leakage is minimized. Further, contact regions of the active layer may be locally recessed to provide direct contact between a metallic material of a source electrode and a drain electrode and a high-conductivity component layer within the active layer. The various aspects of embodiments of the present disclosure are described now in detail.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material. The exemplary structure may include a memory region 100 and a logic region 200.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

In embodiments in which an array of memory cells may be subsequently formed at a level of a dielectric layer, the field effect transistors 701 may include a circuit that provides functions that operate the array of memory cells. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric layer in a selected ferroelectric memory cell into a first polarization state in which electrical polarization in the ferroelectric dielectric layer points toward a first electrode of the selected ferroelectric memory cell, and to provide a second programming pulse that programs the ferroelectric dielectric layer in the selected ferroelectric memory cell into a second polarization state in which the electrical polarization in the ferroelectric dielectric layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including active layers to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric layers may be subsequently formed over the substrate 8 and the semiconductor devices thereupon (such as field effect transistors 701). In an illustrative example, the dielectric layers may include, for example, a first dielectric layer 601 that may be a layer that surrounds the contact structure connected to the source and drains (sometimes referred to as a contact-level dielectric layer 601), a first interconnect-level dielectric layer 610, and a second interconnect-level dielectric layer 620. The metal interconnect structures may include device contact via structures 612 formed in the first dielectric layer 601 and contact a respective component of the CMOS circuitry 700, first metal line structures 618 formed in the first interconnect-level dielectric layer 610, first metal via structures 622 formed in a lower portion of the second interconnect-level dielectric layer 620, and second metal line structures 628 formed in an upper portion of the second interconnect-level dielectric layer 620.

Each of the dielectric layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric layers (601, 610, 620) are herein referred to as lower-level dielectric layers. The metal interconnect structures (612, 618, 622, 628) formed within in the lower-level dielectric layers are herein referred to as lower-level metal interconnect structures.

While the present disclosure is described using an embodiment wherein thin film transistors may be formed over the second interconnect-level dielectric layer 620, other embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric layer that are formed prior to formation of an array of thin film transistors or an array of ferroelectric memory cells is collectively referred to as lower-level dielectric layers (601, 610, 620). The set of all metal interconnect structures that is formed within the lower-level dielectric layers (601, 610, 620) is herein referred to as first metal interconnect structures (612, 618, 622, 628). Generally, first metal interconnect structures (612, 618, 622, 628) formed within at least one lower-level dielectric layer (601, 610, 620) may be formed over the semiconductor material layer 9 that is located in the substrate 8.

According to an aspect of the present disclosure, thin film transistors (TFTs) may be subsequently formed in a metal interconnect level that overlies that metal interconnect levels that contain the lower-level dielectric layers (601, 610, 620) and the first metal interconnect structures (612, 618, 622, 628). In one embodiment, a planar dielectric layer having a uniform thickness may be formed over the lower-level dielectric layers (601, 610, 620). The planar dielectric layer is herein referred to as an insulating spacer layer 635. The insulating spacer layer 635 includes a dielectric material such as undoped silicate glass, a doped silicate glass, organosilicate glass, or a porous dielectric material, and may be deposited by chemical vapor deposition. The thickness of the insulating spacer layer 635 may be in a range from 20 nm to 300 nm, although lesser and greater thicknesses may also be used.

Generally, interconnect-level dielectric layers (such as the lower-level dielectric layer (601, 610, 620)) containing therein the metal interconnect structures (such as the first metal interconnect structures (612, 618, 622, 628)) may be formed over semiconductor devices. The insulating spacer layer 635 may be formed over the interconnect-level dielectric layers.

In one embodiment, the substrate 8 may comprise a single crystalline silicon substrate, and lower-level dielectric layers (601, 610, 620) embedding lower-level metal interconnect structures (612, 618, 622, 628) may be located above the single crystalline silicon substrate. Field effect transistors 701 including a respective portion of the single crystalline silicon substrate as a channel may be embedded within the lower-level dielectric layers (601, 610, 620). The field effect transistors may be subsequently electrically connected to at least one of a gate electrode, a source electrode, and a drain electrode of one or more, or each, of thin film transistors to be subsequently formed.

An etch stop dielectric layer 636 may be optionally formed over the insulating spacer layer 635. The etch stop dielectric layer 636 includes an etch stop dielectric material providing higher etch resistance to an etch chemistry during a subsequently anisotropic etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. The thickness of the etch stop dielectric layer 636 may be in a range from 2 nm to 40 nm, such as from 4 nm to 20 nm, although lesser and greater thicknesses may also be used.

Referring to FIGS. 2A-2C, a region of the first exemplary structure is illustrated, which corresponds to an area in which a thin film transistor may be subsequently formed. While the present disclosure is described using a single instance of a thin film transistor, it is understood that multiple instances of the thin film transistor may be simultaneously formed in any of the exemplary structures of the present disclosure.

An insulating layer 42 may be formed over the insulating spacer layer 635 and the optional etch stop dielectric layer 636. The insulating layer 42 includes a dielectric material such as undoped silicate glass, a doped silicate glass, organosilicate glass, or a porous dielectric material, and may be deposited by chemical vapor deposition. The thickness of the insulating layer 42 may be in a range from 20 nm to 300 nm, although lesser and greater thicknesses may also be used. Multiple thin film transistors may be subsequently formed over the insulating layer 42. In one embodiment, the multiple thin film transistors may be arranged along a first horizontal direction hd1 and a second horizontal direction hd2, which may be perpendicular to the first horizontal direction hd1.

Figure 3A:
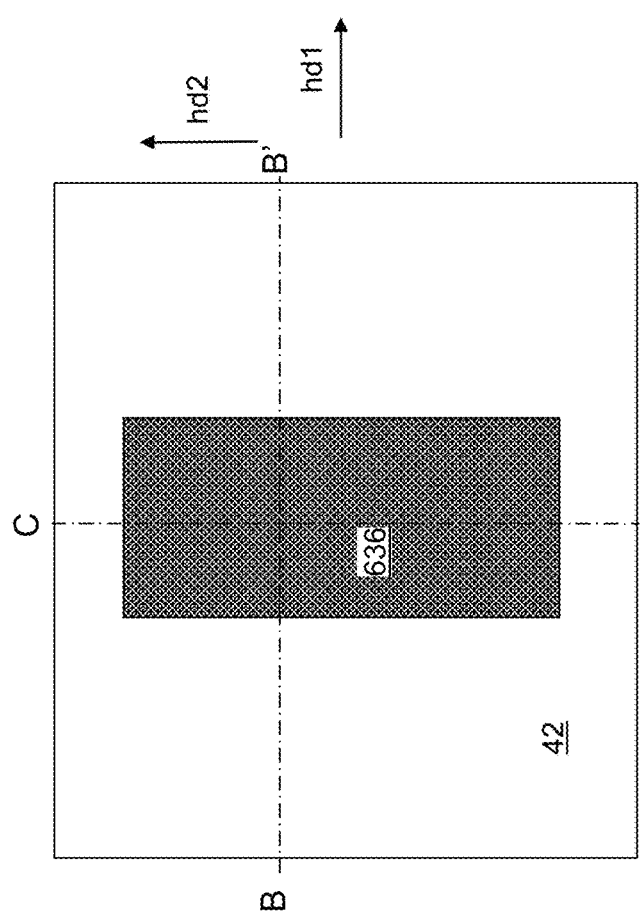
FIG. 3A is a top-down view of a region of the first exemplary structure after formation of a recess region in the insulating layer according to the first embodiment of the present disclosure.
Figure 3C:
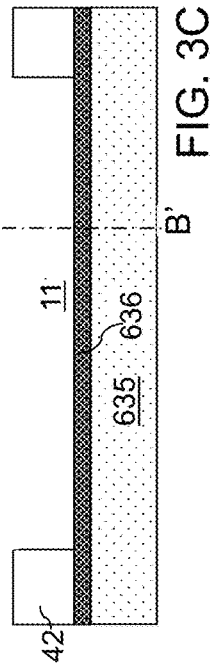
FIG. 3C is a vertical cross-sectional view of the first exemplary structure along the vertical plane C-C' of FIG. 3A.
Figure 3B:
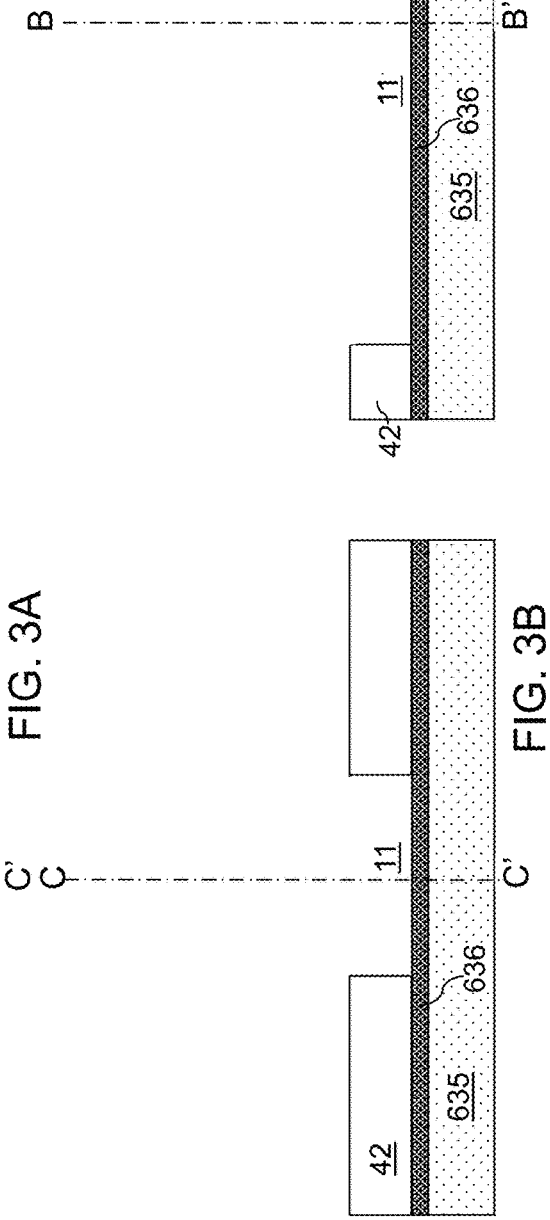
FIG. 3B is a vertical cross-sectional view of the first exemplary structure along the vertical plane B-B' of FIG. 3A.

Referring to FIGS. 3A-3C, a photoresist layer (not shown) may be applied over a top surface of the insulating layer 42, and may be lithographically patterned to form an opening within the illustrated area. In one embodiment, the opening may be a rectangular opening having a pair of widthwise sidewalls along the first horizontal direction and having a pair of lengthwise sidewalls along the second horizontal direction hd2. An anisotropic etch process may be performed to transfer the pattern of the openings in the photoresist layer into an upper portion of the insulating layer 42. A recess region 11 may be formed in an upper portion of the insulating layer 42. The recess region 11 is also referred to as a bottom gate trench.

In one embodiment, the width of the recess region 11 along the first horizontal direction hd1 may be in a range from 20 nm to 300 nm, although lesser and greater widths may also be used. In one embodiment, the length of the recess region 11 along the second horizontal direction hd2 may be in a range from 30 nm to 3,000 nm, although lesser and greater lengths may also be used. The depth of the recess region 11 may be the same as the thickness of the insulating layer 42. Thus, a top surface of the optional etch stop dielectric layer 636 or a top surface of the insulating spacer layer 635 (in embodiments in which the etch stop dielectric layer 636 is not used) may be exposed. The photoresist layer may be subsequently removed, for example, by ashing.

Referring to FIGS. 4A-4C, at least one conductive material may be deposited in the recess region 11. The at least one conductive material may include, for example, a metallic barrier liner material (such as TiN, TaN, and/or WN) and a metallic fill material (such as Cu, W, Mo, Co, Ru, etc.). Other suitable metallic barrier liner material and metallic fill materials within the contemplated scope of disclosure may also be used. Excess portions of the at least one conductive material may be removed from above the horizontal plane including the top surface of the insulating layer 42 by a planarization process, which may include a chemical mechanical polishing (CMP) process and/or a recess etch process. The planarization process may use a chemical mechanical polishing process or a recess etch process. A bottom gate electrode 15 may be formed in the recess region 11. The bottom gate electrode 15 may be the only electrode of a thin film transistor to be subsequently formed, or may be one of two gate electrodes of a thin film transistor in embodiments in which a top gate electrode may be subsequently formed. The top surface of the bottom gate electrode 15 may be located within a same horizontal plane as the top surface of the insulating layer 42.

Referring to FIGS. 5A-5E, a continuous bottom gate dielectric layer 10L and a continuous active layer 20L may be sequentially deposited over the insulating layer 42 and the bottom gate electrode 15 as continuous material layers. The continuous bottom gate dielectric layer 10L may be formed by deposition of at least one gate dielectric material. The gate dielectric material may include, but is not limited to, silicon oxide, silicon oxynitride, a dielectric metal oxide (such as aluminum oxide, hafnium oxide, yttrium oxide, zirconium oxide, lanthanum oxide, etc.), or a stack thereof. Other suitable dielectric materials are within the contemplated scope of disclosure. The gate dielectric material may be deposited by atomic layer deposition (ALD) or chemical vapor deposition (CVD). The thickness of the continuous bottom gate dielectric layer 10L may be in a range from 1 nm to 12 nm, such as from 2 nm to 6 nm, although lesser and greater thicknesses may also be used.

According to an embodiment of the present disclosure, the continuous bottom gate dielectric layer 10L may comprise, and/or may consist of, a dielectric metal oxide material including a first metallic element, a second metallic element, and oxygen. In one embodiment, the continuous bottom gate dielectric layer 10L may be deposited by a chemical vapor deposition or an atomic layer deposition such that the continuous bottom gate dielectric layer 10L has a vertical compositional modulation in which an atomic percentage of the second metallic element has a minimum at a height that is vertically spaced both from a bottom surface of the continuous bottom gate dielectric layer 10L and from a top surface of the continuous bottom gate dielectric layer 10L. For example, the atomic percentage of the second metallic element may be at a minimum at a height of about 30% to 70% of the thickness of the continuous bottom gate dielectric layer 10L as measured from the bottom surface of the continuous bottom gate dielectric layer 10L. In one embodiment, the atomic percentage of the second metallic element may be less than the average atomic percentage of the second metallic element within an entire volume of the continuous bottom gate dielectric layer 10L within a height range from about 25% to about 75% of the thickness of the continuous bottom gate dielectric layer 10L as measured from the bottom surface of the continuous bottom gate dielectric layer 10L.

In one embodiment, the first metallic element may be zirconium, and the second metallic element may be selected from an outer transition metal element (having an incomplete d shell), an inner transition metal element (such as a Lanthanide or an Actinide and having an incomplete f shell), and aluminum. For example, the second metallic element may include hafnium, lanthanum, yttrium, titanium, tantalum, and aluminum. In one embodiment, the second metallic element may comprise hafnium. Generally, the continuous bottom gate dielectric layer 10L may have a material composition of $G_\gamma D_\delta O$, in which $\gamma$ and $\delta$ are variables that change with a vertical distance from a horizontal plane including a bottom surface of the continuous bottom gate dielectric layer 10L, G is the first metallic element, and D is the second metallic element. The ratio of $\gamma$ to $\delta$ may be less than 1.0 at a lower portion 10W of the continuous bottom gate dielectric layer 10L, greater than 1.0 at a middle portion 10M of the continuous bottom gate dielectric layer 10L, and less than 1.0 at an upper portion 10U of the continuous bottom gate dielectric layer 10L. In one embodiment, the height at which the ratio of $\gamma$ to $\delta$ is 1.0, as measured from the horizontal plane including the bottom surface of the continuous bottom gate dielectric layer 10L, may be in a range from 15% to 40% of the thickness of the continuous bottom gate dielectric layer 10L for the interface between the lower portion 10W and the middle portion 10M, and may be in a range from 60% to 85% of the thickness of the continuous bottom gate dielectric layer 10L for the interface between the middle portion 10M and the upper portion 10U.

In embodiments in which the first metallic element is zirconium, a higher percentage of zirconium tends to increase leakage current in the continuous bottom gate dielectric layer 10L. A compositionally graded structure in which the percentage of zirconium is lower in the middle portion 10M of the continuous bottom gate dielectric layer 10L than in the lower portion 10W and the upper portion 10U of the continuous bottom gate dielectric layer 10L reduces the leakage current in the surface portions of the continuous bottom gate dielectric layer 10L.

The continuous active layer 20L may be deposited over continuous bottom gate dielectric layer 10L. In one embodiment, the continuous active layer 20L comprises a semiconducting metal oxide material providing electrical conductivity in a range from 1.0 S/m to $1.0 \times 10^5$ S/m upon suitable doping with electrical dopants (which may be p-type dopants or n-type dopants). Exemplary semiconducting metal oxide materials that may be used for the continuous active layer include, but are not limited to, quaternary compounds such as indium gallium zinc oxide (IGZO), indium tungsten zinc oxide, tin gallium zinc oxide, and tin tungsten zinc oxide, and ternary compounds such as indium gallium oxide, indium oxide tungsten, tin gallium oxide, and tin tungsten oxide. In one embodiment, the semiconducting metal oxide material of the continuous active layer 20L may comprise a zinc-containing quaternary semiconducting compound such as indium gallium zinc oxide (IGZO), indium tungsten zinc oxide, tin gallium zinc oxide, or tin tungsten zinc oxide. In another embodiment, the semiconducting metal oxide material of the continuous active layer 20L may comprise a ternary compound such as indium gallium oxide, indium oxide tungsten, tin gallium oxide, or tin tungsten oxide.

The continuous active layer 20L may include an amorphous semiconducting metal oxide material. According to an aspect of the present disclosure, the continuous active layer 20L may be formed by depositing multiple iterations of a unit layer stack deposition process. Each unit layer stack deposition process includes an acceptor-type oxide deposition process that deposits an oxide of an acceptor-type element selected from Ga and W in the form of an acceptor-type oxide layer 20A, a post-transition metal oxide deposition process that deposits an oxide of a heavy post-transition metal element selected from In and Sn in the form of a post-transition metal oxide layer 20H, and optionally includes a zinc oxide deposition process that deposits zinc oxide in the form of a zinc oxide layer 20Z. As used herein, post-transition metal elements refer to metal elements that are not alkali metals, alkaline earth metals, outer transition metals, or inner transition metals (i.e., Lanthanides and Actinides). Thus, post-transition metal elements comprise aluminum, zinc, gallium, cadmium, indium, tin, mercury, thallium, lead, bismuth, and polonium. Light post-transition metal elements comprise aluminum, zinc, and gallium. Heavy post-transition metal elements comprise cadmium, indium, tin, mercury, thallium, lead, bismuth, and polonium.

Each acceptor-type oxide deposition process may comprise an atomic layer deposition process. Each post-transition metal oxide deposition process may comprise an atomic layer deposition process. Each zinc oxide deposition process, if used, comprises an atomic layer deposition process. The thickness of the continuous active layer 20L may be in a range from 3 nm to 100 nm, such as from 5 nm to 50 nm and/or from 10 nm to 30 nm, although lesser and greater thicknesses may also be used.

In one embodiment, the average material composition of the continuous active layer 20L may be $M_\alpha A_\beta Zn_\gamma O$, in which M is a heavy post-transition metal element such as indium or tin, A is an acceptor-type element such as gallium or tungsten, $\alpha$ is in a range from 0.25 to 0.50, $\tau 3$ is in a range from 0.12 to 0.25, and 7 is in a range from 0.25 to 0.50. Alternatively, the average material composition of the continuous active layer 20L may be $M_\varepsilon A_\eta O$, in which M is a heavy post-transition metal element such as indium or tin, A is an acceptor-type element such as gallium or tungsten, $\varepsilon$ is in a range from 0.30 to 0.70, and $\eta$ is in a range from 0.15 to 0.40.

In one embodiment, the unit layer stack deposition processes may be iterated (N−1) times, in which N is an integer greater than 2. For example, the integer N may be in a range from 3 to 60, such as from 6 to 40 and/or from 6 to 30. The thickness of each acceptor-type oxide layer 20A may be the same as one another. The thickness of each post-transition metal oxide layer 20H may be the same as one another. The thickness of each zinc oxide layer 20Z, if present, may be the same as one another. (N−1) repetitions of the unit layer stack may be formed over the continuous bottom gate dielectric layer 10L. The thickness of the each of the acceptor-type oxide layers 20A, the post-transition metal oxide layers 20H, and the zinc oxide layers 20Z and the deposition temperature (that controls the extent of vertical diffusion of each material layer) may be selected such that the continuous active layer 20L has a vertical compositional modulation for each component metallic element within the continuous active layer 20L.

According to an aspect of the present disclosure, an acceptor-type oxide layer 20A may be deposited over the last repetition (i.e., the (N−1)-th repetition) of the unit layer stack. Thus, a total of N acceptor-type oxide layers 20A are present within the continuous active layer 20L, and a total of (N−1) post-transition metal oxide layers 20H are present within the continuous active layer 20L. If the continuous active layer 20L comprise zinc oxide layers 20Z, a total of (N−1) zinc oxide layers 20Z is present within the continuous active layer 20L.

According to an aspect of the present disclosure, each of the acceptor-type oxide layers 20A, the post-transition metal oxide layers 20H, and the optional zinc oxide layers 20Z may be deposited by a respective atomic layer deposition process. Use of the atomic layer deposition process provides precise thickness control of each layer, and limits vertical diffusion of metallic elements within each of the acceptor-type oxide layers 20A, the post-transition metal oxide layers 20H, and the optional zinc oxide layers 20Z. As a consequence, vertical modulation of metallic elements within the continuous active layer 20L may be provided.

FIG. 5E illustrates a magnified view of the vertical modulation of metallic elements within the continuous active layer 20L in which the optional zinc oxide layers 20Z are not included. In FIG. 5E, each of the acceptor-type oxide layers 20A and the post-transition metal oxide layers 20H may be deposited by a respective atomic layer deposition process.

Device performance of a thin film transistor may be enhanced through use of a non-homogeneous semiconducting metal oxide material for a channel of a thin film transistor. Specifically, the semiconducting metal oxide material may be formed with a vertical compositional modulation to suppress surface leakage current such as a back channel leakage current. For example, the surface layers of the continuous active layer 20L comprise acceptor-type oxide layer 20A, and thus, atomic concentration of the acceptor-type metallic element (such as Ga or W) is higher in the surface portions of the continuous active layer 20L than the average atomic concentration of the acceptor-type metallic element within the continuous active layer 20L.

According to an aspect of the present disclosure, the material composition at the surface portions of the continuous active layer 20L that contact each gate dielectric layer (such as the continuous bottom gate dielectric layer 10L or a continuous gate dielectric layer to be subsequently formed over patterned portions of the continuous active layer 20L) may be engineered. In one embodiment, the surface portions of the continuous active layer 20L that contact each gate dielectric layer may be an acceptor-type oxide layer 20A, which provides a higher atomic concentration for an element such as gallium or tungsten, and provides a reduced atomic concentration for indium or tin.

Referring to FIGS. 6A-6D, a photoresist layer (not shown) may be applied over the continuous active layer 20L, and may be lithographically patterned to form discrete patterned photoresist material portions straddling a respective bottom gate electrode 15 along the first horizontal direction hd1. In one embodiment, each patterned portion of the photoresist layer may have a horizontal cross-sectional shape of a rectangle or a rounded rectangle. The pattern in the photoresist layer may be transferred through the continuous active layer 20L and the continuous bottom gate dielectric layer 10L by performing an anisotropic etch process. Each patterned portion of the continuous active layer 20L comprises an active layer 20. Each patterned portion of the continuous bottom gate dielectric layer 10L comprises a bottom gate dielectric 10.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used.

Generally, a vertical stack of a bottom gate electrode 15, a bottom gate dielectric 10, and an active layer 20 may be formed over lower-level dielectric layers (601, 610, 620) that overlies a substrate 8. The sidewalls of the bottom gate dielectric 10 and the active layer 20 may be vertically coincident, i.e., may be located within same vertical planes. The photoresist layer may be subsequently removed, for example, by ashing. In embodiments in which the bottom gate dielectric 10 comprises a compositionally graded dielectric material having a vertical compositional gradient, the bottom gate dielectric 10 is herein referred to as a graded bottom gate dielectric 10G.

Referring to FIGS. 7A-7D, a continuous top gate dielectric layer 30L may be deposited over the active layer 20. The continuous top gate dielectric layer 30L may be formed by deposition of at least one gate dielectric material. The gate dielectric material may include, but is not limited to, silicon oxide, silicon oxynitride, a dielectric metal oxide (such as aluminum oxide, hafnium oxide, yttrium oxide, zirconium oxide, lanthanum oxide, etc.), or a stack thereof. Other suitable dielectric materials are within the contemplated scope of disclosure. The gate dielectric material may be deposited by atomic layer deposition or chemical vapor deposition. The thickness of the continuous top gate dielectric layer 30L may be in a range from 1 nm to 12 nm, such as from 2 nm to 6 nm, although lesser and greater thicknesses may also be used.

According to an embodiment of the present disclosure, the continuous top gate dielectric layer 30L may comprise, and/or may consist of, a dielectric metal oxide material including a first metallic element, a second metallic element, and oxygen. In one embodiment, the continuous top gate dielectric layer 30L can be deposited by a chemical vapor deposition or an atomic layer deposition such that the continuous top gate dielectric layer 30L has a vertical compositional modulation in which an atomic percentage of the second metallic element has a minimum at a height that is vertically spaced both from a top surface of the continuous top gate dielectric layer 30L and from a bottom surface of the continuous top gate dielectric layer 30L. For example, the atomic percentage of the second metallic element may be at a minimum at a height of about 30% to 70% of the thickness of the continuous top gate dielectric layer 30L as measured from a bottom surface of the continuous top gate dielectric layer 30L. In one embodiment, the atomic percentage of the second metallic element may be less than the average atomic percentage of the second metallic element within an entire volume of the continuous top gate dielectric layer 30L within a height range from about 25% to about 75% of the thickness of the continuous top gate dielectric layer 30L as measured from the top surface of the continuous top gate dielectric layer 30L.

In one embodiment, the first metallic element may be zirconium, and the second metallic element may be selected from an outer transition metal element, an inner transition metal element, and aluminum. For example, the second metallic element may include hafnium, lanthanum, yttrium, titanium, tantalum, and aluminum. In one embodiment, the second metallic element may comprise hafnium. Generally, the continuous top gate dielectric layer 30L may have a material composition of $T_\tau U_\upsilon O$, in which $\tau$ and $\upsilon$ are variables that change with a vertical distance from a horizontal plane including a bottom surface of the continuous top gate dielectric layer 30L, T is the first metallic element, and U is the second metallic element. The ratio of $\tau$ to $\upsilon$ may be less than 1.0 at a lower portion 30W of the continuous top gate dielectric layer 30L, greater than 1.0 at a middle portion 30M of the continuous top gate dielectric layer 30L, and less than 1.0 at an upper portion 30U of the continuous top gate dielectric layer 30L. In one embodiment, the height at which the ratio of $\tau$ to $\upsilon$ is 1.0, as measured from the horizontal plane including the bottom surface of the continuous top gate dielectric layer 30L, may be in a range from 15% to 40% of the thickness of the continuous top gate dielectric layer 30L for the interface between the lower portion 30W and the middle portion 30M, and may be in a range from 60% to 85% of the thickness of the continuous top gate dielectric layer 30L for the interface between the middle portion 30M and the upper portion 30U.

In embodiments in which the first metallic element is zirconium, a higher percentage of zirconium tends to increase leakage current in the continuous top gate dielectric layer 30L. A compositionally graded structure in which the percentage of zirconium is lower in the middle portion 30M of the continuous top gate dielectric layer 30L than in the lower portion 30W and the upper portion 30U of the continuous top gate dielectric layer 30L reduces the leakage current in the surface portions of the continuous top gate dielectric layer 30L.

At least one conductive material layer may be deposited over the continuous top gate dielectric layer 30L to form a continuous top gate electrode layer 35L. The at least one conductive material may include, for example, a combination of a metallic barrier liner material (such as TiN, TaN, and/or WN) and a metallic fill material (such as Cu, W, Mo, Co, Ru, etc.). Other suitable metallic liner and metallic fill materials within the contemplated scope of disclosure may also be used. The thickness of the continuous top gate electrode layer 35L, as measured above the active layer 20, may be in a range from 30 nm to 300 nm, such as from 60 nm to 150 nm, although lesser and greater thicknesses may also be used.

Referring to FIGS. 8A-8D, a photoresist layer (not shown) may be applied over the at least one conductive material layer, and may be lithographically patterned to form discrete photoresist material portions. The pattern in the photoresist material portions may be transferred through the continuous top gate electrode layer 35L by performing an anisotropic etch process. In one embodiment, the anisotropic etch process may be selective to the material of the continuous top gate dielectric layer 30L. Each patterned portion of the continuous top gate electrode layer 35L constitutes a top gate electrode 35.

Optionally, unmasked portions of the continuous top gate dielectric layer 30L may be subsequently removed by an etch process, which may comprise an anisotropic etch process (such as a reactive ion etch process) or an isotropic etch process (such as a wet etch process). Each patterned portion of the continuous top gate dielectric layer 30L constitutes a top gate dielectric 30. The photoresist layer may be subsequently removed, for example, by ashing.

The top gate electrode 35 straddles the active layer 20 along the second horizontal direction hd2. The height of the top gate electrode 35, as measured in a region overlying the active layer 20 between a bottom surface and a top surface of the top gate electrode 35, may be in a range from 30 nm to 300 nm, such as from 60 nm to 150 nm, although lesser and greater heights may also be used. In case the top gate dielectric 30 comprises a compositionally graded dielectric material having a vertical compositional gradient, the top gate dielectric 30 is herein referred to as a graded top gate dielectric 30G.

Referring to FIGS. 9A-9D, a dielectric layer 48 may be deposited over the top gate electrode 35 and the top gate dielectric 30. The dielectric layer 48 is also referred to as an electrode-level dielectric layer. The dielectric layer 48 includes a dielectric material such as undoped silicate glass, a doped silicate glass, organosilicate glass, or a stack thereof. Optionally, the dielectric layer 48 may be planarized to provide a flat top surface. The dielectric material of the dielectric layer 48 may be planarized so that a planarized horizontal top surface of the dielectric layer 48 is formed within the horizontal plane including the top surface of the top gate electrode 35. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 10A-10F, a photoresist layer (not shown) may be applied over the TFT-level dielectric layer 40, and may be lithographically patterned to form discrete openings therein. The pattern of the discrete openings in the photoresist layer may be transferred through the dielectric layer 48 by an anisotropic etch process to form a source cavity 51, a drain cavity 59, and a bottom gate contact via cavity 19. The anisotropic etch process comprises a first etch step that etches the material of the dielectric layer 48 selective to the topmost layer (i.e., the topmost acceptor-type oxide layer 20A) of the active layer 20, and a terminal etch step that etches the material of the topmost acceptor-type oxide layer 20A selective to an underlying layer, which may be a topmost post-transition metal oxide layer 20H or a topmost zinc oxide layer 20Z.

FIG. 10D illustrates a configuration in which each unit layer stack within the active layer include an acceptor-type oxide layer 20A, a post-transition metal oxide layer 20H, and a zinc oxide layer 20Z, and the terminal etch step of the anisotropic etch process etches the topmost acceptor-type oxide layer 20A selective to the topmost zinc oxide layer 20Z. A top surface of the topmost post-transition metal oxide layer 20H is physically exposed, and a physically exposed portion of the topmost post-transition metal oxide layer 20H may have a thickness in a range from 50% to 100%, such as from 70% to 95%, of the thickness of the unexposed portion of the topmost post-transition metal oxide layer 20H.

FIG. 10E illustrates a configuration in which each unit layer stack within the active layer include an acceptor-type oxide layer 20A, a post-transition metal oxide layer 20H, and a zinc oxide layer 20Z, and the terminal etch step of the anisotropic etch process etches the topmost acceptor-type oxide layer 20A and the topmost post-transition metal oxide layer 20H selective to the topmost zinc oxide layer 20Z. A top surface of the topmost zinc oxide layer 20Z is physically exposed, and a physically exposed portion of the topmost zinc oxide layer 20Z may have a thickness in a range from 50% to 100%, such as from 70% to 95%, of the thickness of the unexposed portion of the topmost zinc oxide layer 20Z.

FIG. 10F illustrates a configuration in which each unit layer stack within the active layer include an acceptor-type oxide layer 20A and a post-transition metal oxide layer 20H, and the terminal etch step of the anisotropic etch process etches the topmost acceptor-type oxide layer 20A selective to the topmost post-transition metal oxide layer 20H. A top surface of the topmost post-transition metal oxide layer 20H is physically exposed, and a physically exposed portion of the topmost post-transition metal oxide layer 20H may have a thickness in a range from 50% to 100%, such as from 70% to 95%, of the thickness of the unexposed portion of the topmost post-transition metal oxide layer 20H.

The source cavity 51 and the drain cavity 59 may be formed at opposite ends of the active layer 20, and may be laterally spaced from each other along the first horizontal direction hd1. In one embodiment, an end sidewall of the active layer 20 laterally extending along the second horizontal direction hd2 and a pair of sidewall segments of the active layer 20 laterally extending along the first horizontal direction hd1 may be physically exposed at the bottom of each of the source cavity 51 and the drain cavity 59. A rectangular portion of the top surface of the active layer 20 may be physically exposed at the bottom of each of the source cavity 51 and the drain cavity 59. A top surface of the bottom gate electrode 15 may be physically exposed at the bottom of the backside electrode contact via cavity 19. The photoresist layer may be subsequently removed, for example, by ashing.

Referring to FIGS. 11A-11F, at least one conductive material may be deposited in the cavities (51, 19, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56. Each remaining portion of the at least one conductive material filling a backside electrode contact via cavity 19 constitutes a backside electrode contact via structure 18, which contacts a top surface of the bottom gate electrode 15.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each backside electrode contact via structure 18 may include a bottom gate contact metallic liner 16 that is a remaining portion of the metallic liner material, and a bottom gate contact metallic fill material portion 17 that is a remaining portion of the metallic fill material.

The active layer 20 and a set of electrode structures (52, 15, 35, 56) may be formed within a TFT-level dielectric layer 40. Top surfaces of the source electrode 52, the drain electrode 56, the top gate electrode 35, and the bottom gate electrode contact structure 18 may be located within (i.e., may be co-planar with) a horizontal plane including a top surface of the TFT-level dielectric layer 40. The source electrode 52 and the drain electrode 56 can be formed directly on a topmost zinc oxide layer 20Z (as illustrated in FIG. 11E) or a topmost post-transition metal oxide layer 20H including the oxide of the heavy post-transition metal element within the active layer 20 (as illustrated in FIGS. 11D and 11F).

Figure 12C:
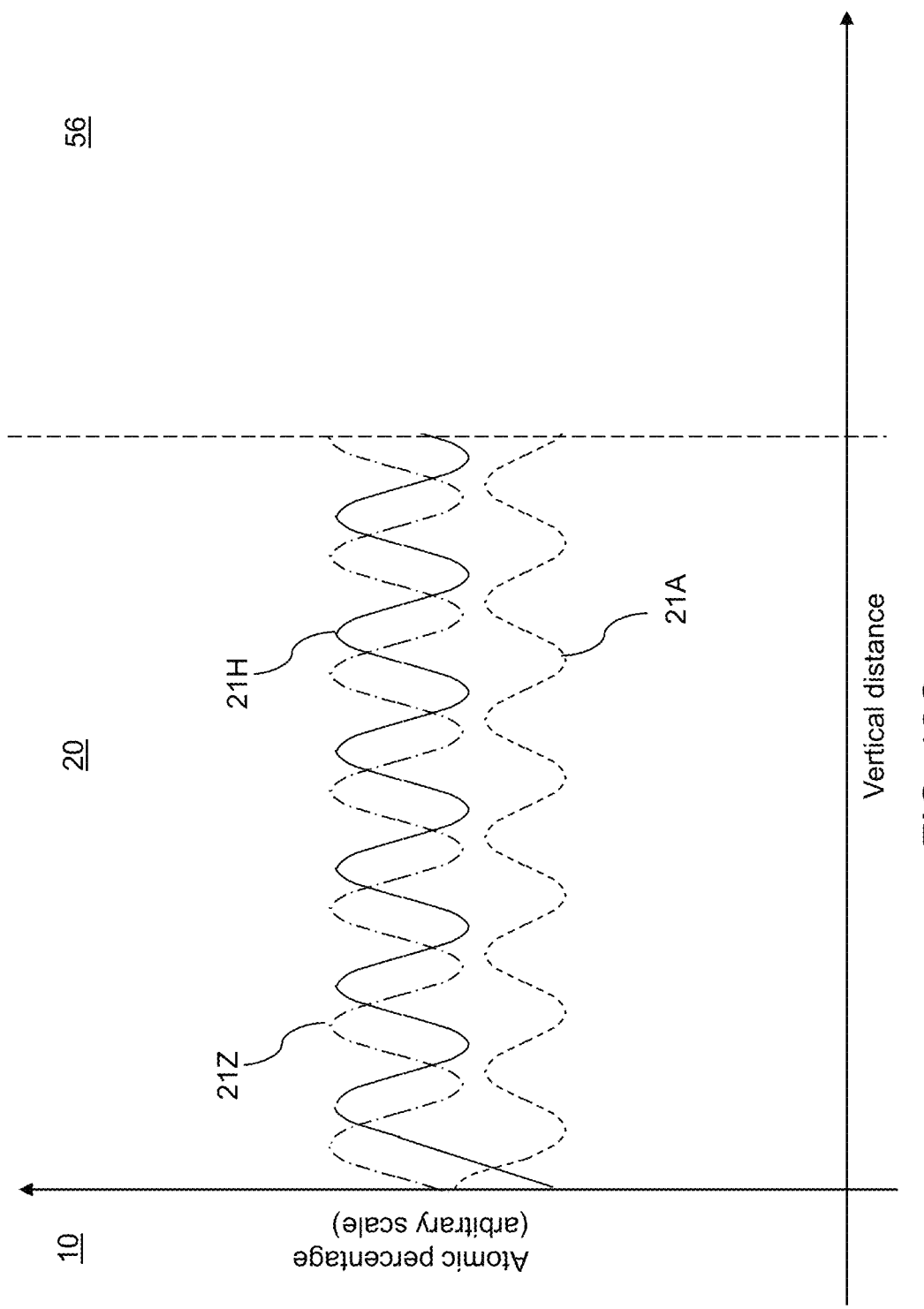
FIG. 12C is a vertical compositional profile of various metallic elements within the active layer along the vertical line VC shown in FIG. 11E.

FIG. 12A is a vertical compositional profile of various metallic elements within the active layer along the vertical line VA shown in FIG. 11D or FIG. 11E. FIG. 12B is a vertical compositional profile of various metallic elements within the active layer along the vertical line VB shown in FIG. 11D. FIG. 12C is a vertical compositional profile of various metallic elements within the active layer along the vertical line VC shown in FIG. 11E.

FIG. 13A is a vertical compositional profile of various metallic elements within the active layer along the vertical line VD shown in FIG. 11F. FIG. 13B is a vertical compositional profile of various metallic elements within the active layer along the vertical line VE shown in FIG. 11F.

Referring collectively to FIGS. 12A-13B, curve 21A represents the atomic percentage of the acceptor-type element in a respective vertical compositional profile. Curve 21H represents the atomic percentage of the heavy post-transition metal element in a respective vertical compositional profile. Curve 21Z represents the atomic percentage of zinc in a respective vertical compositional profile. Generally, the atomic percentage of an element may be determined by taking an average of the atomic concentration of the element within a volume including an entire area of the active layer 20 and having an infinitesimally small height, and taking a limit in which the infinitesimal height approaches zero.

In one embodiment, the vertical compositional profile of the atomic percentage of the acceptor-type element (as illustrated by curve 21A in FIGS. 12A and 13A) between the bottommost surface of the active layer 20 and a topmost surface of the active layer 20 may have N local peaks and (N−1) local minima (troughs or valleys) in which N is an integer greater than 2, and may be in a range from 3 to 60, such as from 6 to 40 and/or from 6 to 30. In one embodiment, a bottommost peak selected from the N peaks is higher than any of (N−2) intermediate peaks located between the bottommost peak and a topmost peak selected from the N peaks. The feature that the bottommost peak of curve 21A is higher than any of the intermediate (N−2) intermediate peaks is derived from the inability of the atoms of the acceptor-type element to effectively diffuse into the bottom gate dielectric 10. In other words, the bottom gate dielectric 10 functions as an effective diffusion barrier layer for the acceptor-type element. Thus, diffusion of the acceptor-type element from the bottommost acceptor-type oxide layer 20A occurs primarily upward, and consequently, the reduction in atomic percentage of the acceptor-type element within the bottommost acceptor-type oxide layer 20A through outdiffusion of the acceptor-type element is significantly less than in any of the intermediate (N−2) acceptor-type oxide layers 20A. Thus, the atomic percentage of the acceptor-type element in the bottommost acceptor-type oxide layer 20A can be higher than the atomic percentage of the acceptor-type element in any of the intermediate (N−2) acceptor-type oxide layer 20A.

In one embodiment, the vertical compositional profile of the atomic percentage of the heavy post-transition metal element between the bottommost surface of the active layer 20 and the topmost surface of the active layer 20 (as illustrated by curve 21H in FIGS. 12A and 13A) has (N−1) local peaks and N local minima. In one embodiment, a bottommost local minimum of the atomic percentage of the heavy post-transition metal element may be located at the bottommost surface of the active layer 20, and may be lower than any of (N−2) intermediate local minima located between the bottommost local minimum and a topmost local minimum of the vertical compositional profile of the atomic percentage of the heavy post-transition metal element.

In one embodiment, the bottommost local minimum of the atomic percentage of the heavy post-transition metal element may be a global minimum for the atomic percentage of the heavy post-transition metal element, for example, as illustrated by curve 21H in FIGS. 12A and/or 13A. Alternatively or additionally, the topmost local minimum of the atomic percentage of the heavy post-transition metal element may be lower than any of the (N−2) intermediate local minima of the vertical compositional profile of the atomic percentage of the heavy post-transition metal element, for example, as illustrated by curve 21H in FIGS. 12A and 13A.

In one embodiment, a topmost peak selected from the N peaks within the vertical compositional profile of the atomic percentage of the acceptor-type element may be located at the topmost surface of the active layer 20, and is higher than any of the (N−2) intervening peaks within the vertical compositional profile of the atomic percentage of the acceptor-type element, for example, as illustrated by curve 21A in FIGS. 12A and 13A. The feature that the topmost peak of curve 21A is higher than any of the intermediate (N−2) intermediate peaks is derived from the inability of the atoms of the acceptor-type element to effectively diffuse into the top gate dielectric 30 or into the dielectric layer 48. In other words, the top gate dielectric 30 and the dielectric layer 48 function as effective diffusion barrier layers for the acceptor-type element. Thus, diffusion of the acceptor-type element from the topmost acceptor-type oxide layer 20A occurs primarily downward, and consequently, the reduction in atomic percentage of the acceptor-type element within the topmost acceptor-type oxide layer 20A through outdiffusion of the acceptor-type element is significantly less than in any of the intermediate (N−2) acceptor-type oxide layers 20A. Thus, the atomic percentage of the acceptor-type element in the topmost acceptor-type oxide layer 20A can be higher than the atomic percentage of the acceptor-type element in any of the intermediate (N−2) acceptor-type oxide layer 20A.

In one embodiment, the active layer 20 comprises zinc, and a vertical compositional profile of an atomic percentage of zinc (as illustrated by curve 21Z in FIG. 12A) between the bottommost surface of the active layer 20 and the topmost surface of the active layer 20 has (N−1) local peaks and N local minima. In one embodiment, the vertical compositional profile of the atomic percentage of zinc (as illustrated by curve 21Z in FIG. 12A) has a global minimum at the topmost surface of the active layer 20.

In one embodiment, the vertical compositional profile of an atomic percentage of the heavy post-transition metal element between the bottommost surface of the active layer and the topmost surface of the active layer (as illustrated by curve 21H in FIGS. 12A and 13A) has (N−1) local peaks and N local minima. In one embodiment, the vertical compositional profile of the atomic percentage of the heavy post-transition metal element may have a global minimum at the bottommost surface of the active layer 20 as illustrated by curve 21H in FIGS. 12A and 13A.

In one embodiment, the source electrode 52 (as illustrated in FIGS. 11A and 11B) may contact a first recessed horizontal surface of the active layer 20, and the drain electrode 56 (as illustrated in FIGS. 11A and 11B) may contact a second recessed horizontal surface of the active layer 20. In one embodiment, the atomic percentage of the acceptor-type element at a surface portion of the active layer 20 that contacts the source electrode 52 or the drain electrode 56 (as illustrated by curve 21A in FIGS. 12B, 12C, and 13B) may be less than the atomic percentage of the acceptor-type element at the topmost peak selected from the N peaks of the vertical compositional profile of the atomic percentage of the acceptor-type element (as illustrated by curve 21A in FIGS. 12A and 13A).

In one embodiment, a vertical compositional profile of the atomic percentage of the heavy post-transition metal element along a vertical line extending between the bottommost surface of the active layer 20 and a bottom surface of one of the source electrode 52 and the drain electrode 56 has (N−1) local peaks as illustrated by curve 21H in FIGS. 12B, 12C, and 13B, and a topmost local peak selected from the (N−1) local peaks within the vertical compositional profile of the atomic percentage of the heavy post-transition metal element is located at an interface with the one of the source electrode and the drain electrode as illustrated by curve 21H in FIGS. 12B and 13B.

In one embodiment, the active layer 20 comprises zinc, and the vertical compositional profile of the atomic percentage of zinc along a vertical line extending between the bottommost surface of the active layer 20 and a bottom surface of one of the source electrode 52 and the drain electrode 56 has (N−1) local peaks and (N−1) local minima, and a location of a topmost local minimum selected from the (N−1) local minima within the vertical compositional profile of the atomic percentage of zinc is vertically spaced from an interface with the one of the source electrode 52 and the drain electrode 56 as illustrated by curve 21Z in FIGS. 12B and 12C.

In one embodiment, the vertical compositional profile of the atomic percentage of the heavy post-transition metal element between the bottommost surface of the active layer 20 and the topmost surface of the active layer 20 has (N−1) local peaks and N local minima as illustrated by curve 21H in FIGS. 12A and 13A. The topmost local peak selected from the (N−1) local peaks of the atomic percentage of the heavy post-transition metal element is vertically offset from the topmost surface of the active layer 20 as illustrated by curve 21H in FIGS. 12A and 13A.

In one embodiment, the active layer 20 comprises zinc, and the vertical compositional profile of the atomic percentage of zinc between the bottommost surface of the active layer 20 and the topmost surface of the active layer 20 has (N−1) local peaks as illustrated by curve 21Z in FIG. 12A, and the vertical compositional profile of the atomic percentage of zinc has a global minimum at the topmost surface of the active layer 20. In one embodiment, the atomic percentage of the acceptor-type element at a surface portion of the active layer 20 that contacts the source electrode 52 or the drain electrode 56, as illustrated by curve 21A in FIGS. 12B, 12C, and 13B, is less than an atomic percentage of the acceptor-type element at the topmost peak selected from the N peaks of the vertical compositional profile of the atomic percentage of the acceptor-type element as illustrated by curve 21A in FIGS. 12A and 13A.

Generally, the material composition of the active surface portions of the active layer 20 in contact with the bottom gate dielectric 10 or in contact with the top gate dielectric 30 may be precisely controlled by the atomic layer deposition processes.

The average atomic percentage of each metallic element in the vertical cross-sectional profiles of the atomic percentage of the respective metallic element is determined by the average material composition within the active layer 20 as discussed above. The maximum atomic percentage of each metallic element in the vertical cross-sectional profiled may be in a range from 110% to 200%, such as from 120% to 150%, and/or from 125% to 140%, of the average atomic percentage of the respective metallic element. The minimum atomic percentage of each metallic element in the vertical cross-sectional profiled may be in a range from 20% to 90%, such as from 50% to 80%, and/or from 60% to 75%, of the average atomic percentage of the respective metallic element. Generally, inherent intermixing of the various component layers (21A, 21H, 21Z) within the active layer 20 provides generally semiconducting properties to the active layer 20, while a vertical compositional variation provides modulations in the semiconducting properties of the active layer 20 with a vertical distance from the bottom surface of the active layer 20. Generally, interdiffusion along the vertical direction may be controlled by limiting the temperature of thermal processing after formation of the active layer 20 below a temperature implemented to induce significant diffusion, such as less than 450 degrees Celsius, and/or less than 400 degrees Celsius, and/or less than 350 degrees Celsius.

Referring to FIG. 14A, a vertical compositional profile of various metallic elements within the bottom gate dielectric 10 is illustrated for an embodiment in which the bottom gate dielectric 10 comprises a dielectric metal oxide material having a vertical compositional modulation. In this embodiment, the bottom gate dielectric may include a first metallic element, a second metallic element, and oxygen. Within the vertical compositional modulation of the bottom gate dielectric 10, an atomic percentage of the second metallic element has a minimum at a height that is vertically spaced from a bottom surface of the bottom gate dielectric 10 and from a top surface of the bottom gate dielectric 10 as illustrated by curve 11B. Within the vertical compositional modulation of the bottom gate dielectric 10, an atomic percentage of the first metallic element has a maximum at a height that is vertically spaced from a bottom surface of the bottom gate dielectric 10 and from a top surface of the bottom gate dielectric 10 as illustrated by curve 11A. The atomic percentage of oxygen remains constant as illustrated by curve 11C.

Figure 14B:
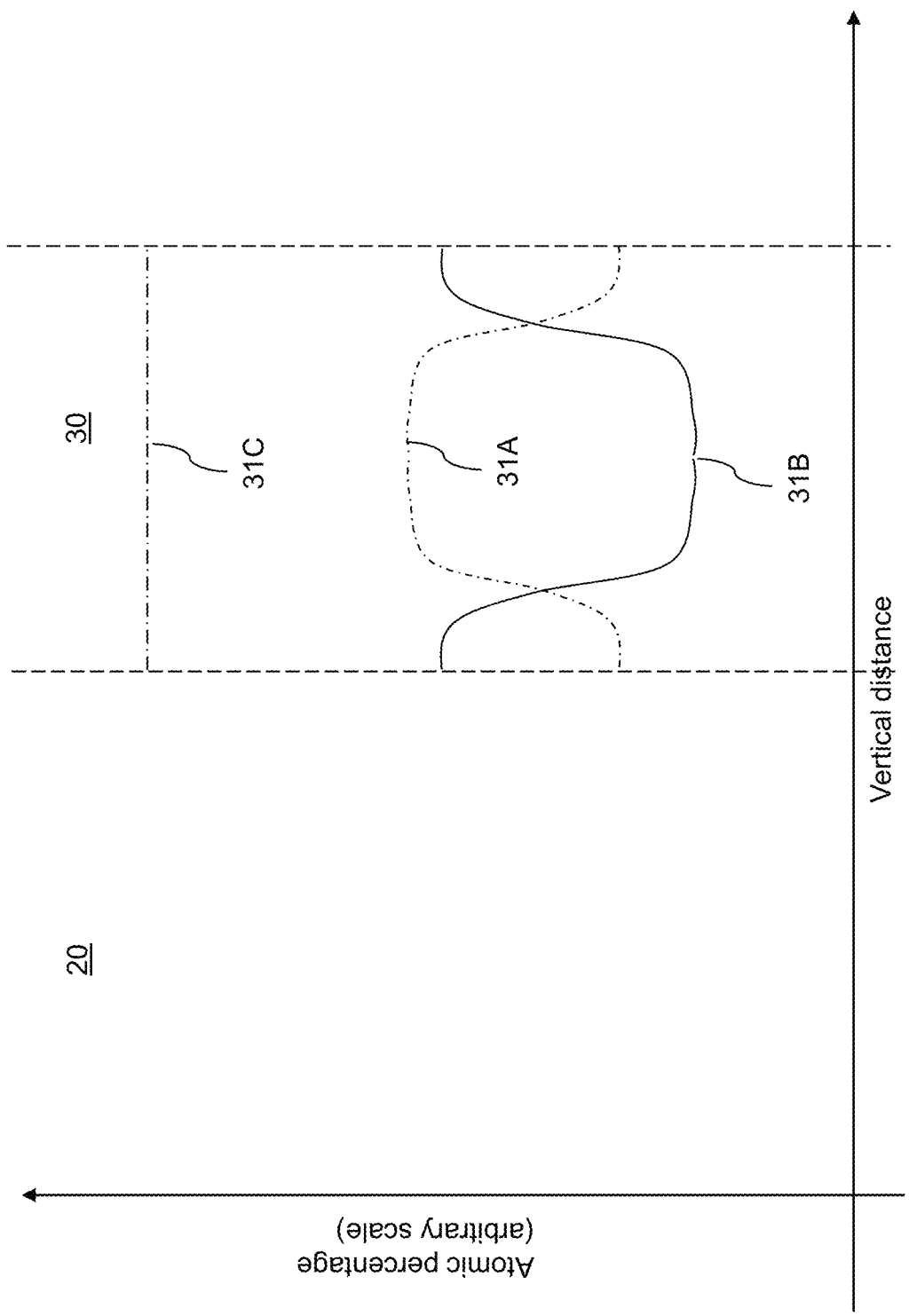
FIG. 14B is a vertical compositional profile of various metallic elements within a top gate dielectric according to an embodiment of the present disclosure.

Referring to FIG. 14B, a vertical compositional profile of various metallic elements within the top gate dielectric 30 is illustrated for an embodiment in which the top gate dielectric 30 comprises a dielectric metal oxide material having a vertical compositional modulation. In this embodiment, the top gate dielectric may include a first metallic element, a second metallic element, and oxygen. Within the vertical compositional modulation of the top gate dielectric 30, an atomic percentage of the second metallic element has a minimum at a height that is vertically spaced from a top surface of the top gate dielectric 30 and from a bottom surface of the top gate dielectric 30 as illustrated by curve 31B. Within the vertical compositional modulation of the top gate dielectric 30, an atomic percentage of the first metallic element has a maximum at a height that is vertically spaced from a bottom surface of the top gate dielectric 30 and from a top surface of the top gate dielectric 30 as illustrated by curve 31A. The atomic percentage of oxygen remains constant as illustrated by curve 31C. Generally, the material composition of the top gate dielectric 30 is independent of the material composition of the bottom gate dielectric 10.

Figure 15A:
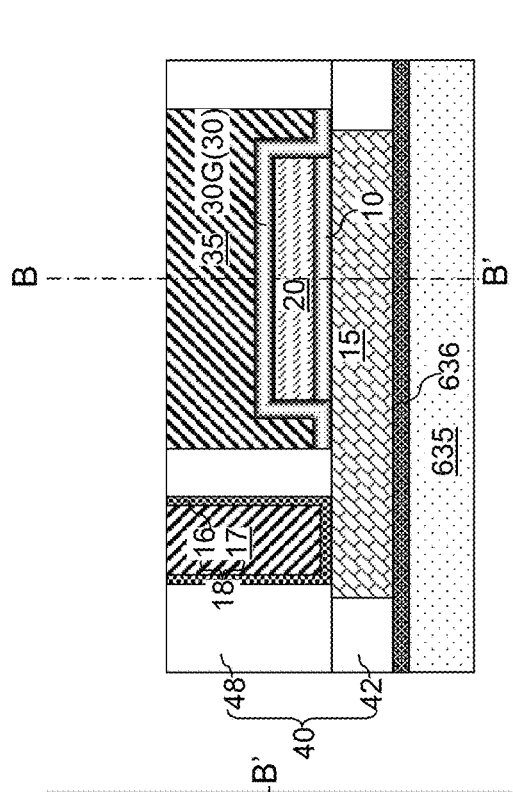
FIG. 15A is a top-down view of a region of a second exemplary structure after formation of a source electrode, a drain electrode, and a backside electrode contact via structure according to a second embodiment of the present disclosure.
Figure 15B:
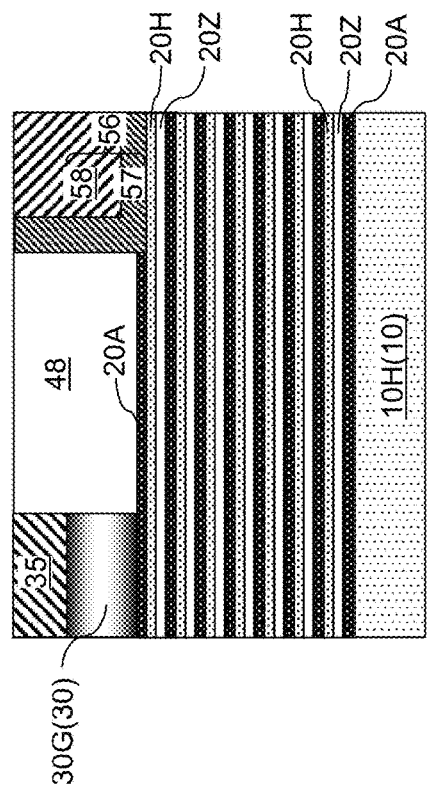
FIG. 15B is a vertical cross-sectional view of the second exemplary structure along the vertical plane B-B' of FIG. 15A.
Figure 15C:
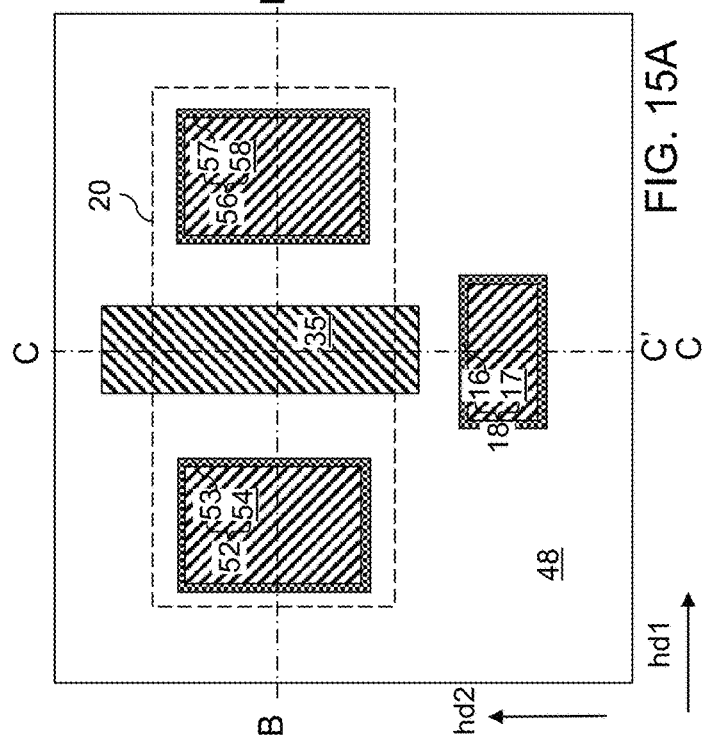
FIG. 15C is a vertical cross-sectional view of the second exemplary structure along the vertical plane C-C' of FIG. 15A.
Figure 15D:
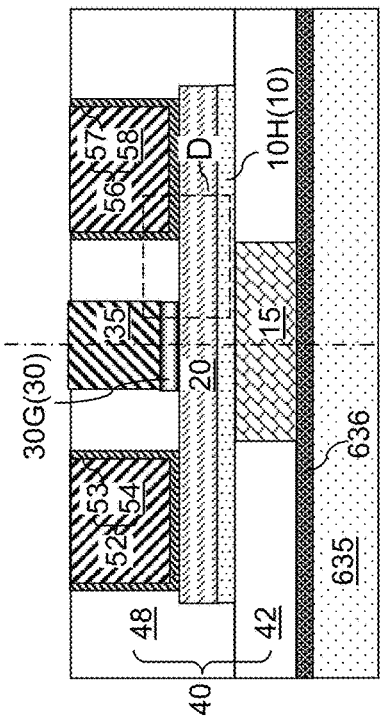
FIG. 15D is a magnified view of region D in FIG. 15B.
Figure 22A:
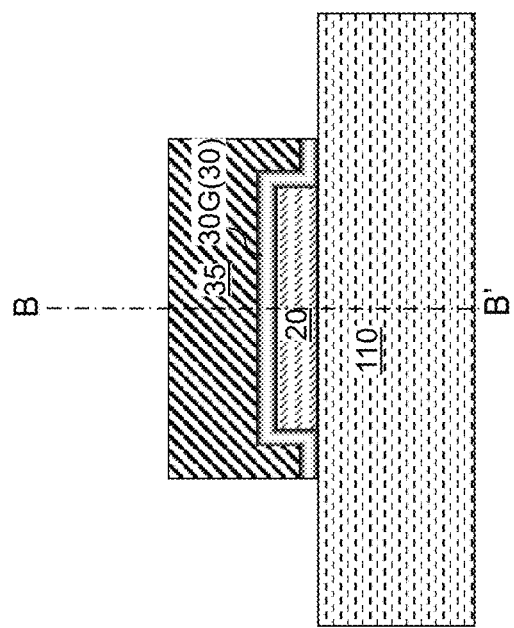
FIG. 22A is a top-down view of a region of the seventh exemplary structure after formation of a top gate electrode and a top gate dielectric according to the seventh embodiment of the present disclosure.
Figure 22B:
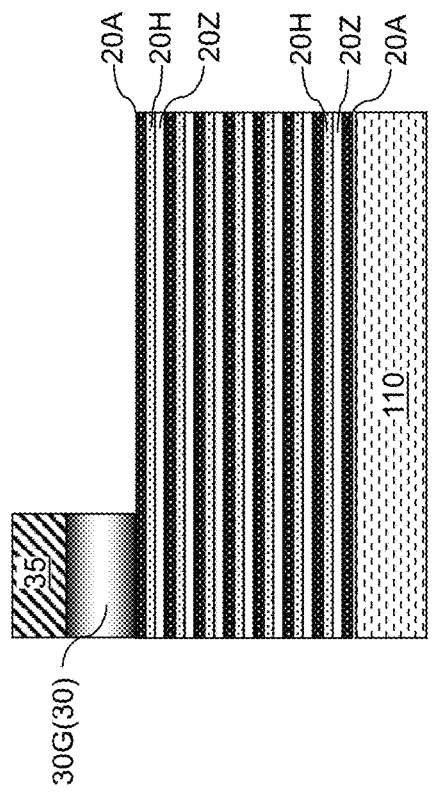
FIG. 22B is a vertical cross-sectional view of the seventh exemplary structure along the vertical plane B-B' of FIG. 22A.
Figure 22C:
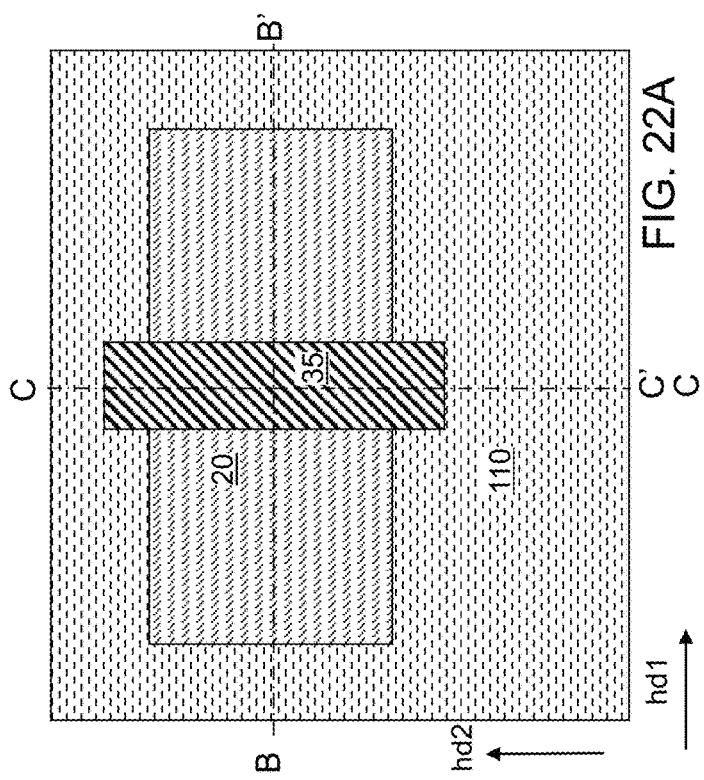
FIG. 22C is a vertical cross-sectional view of the seventh exemplary structure along the vertical plane C-C' of FIG. 22A.
Figure 22D:
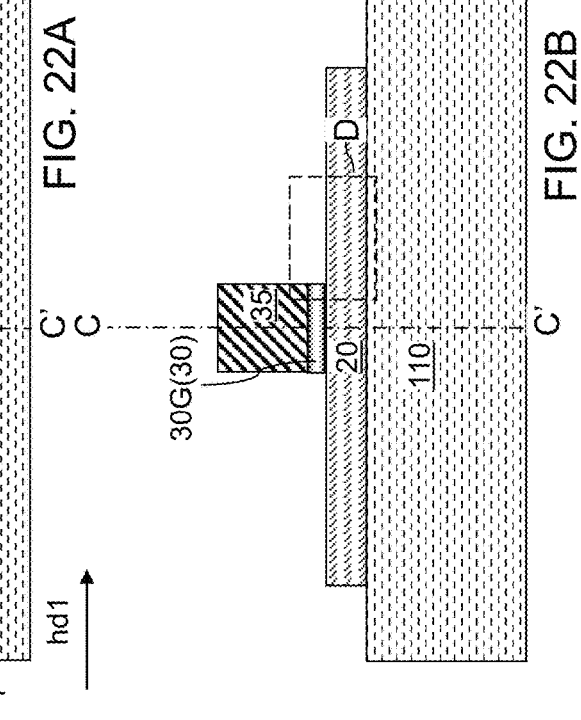
FIG. 22D is a magnified view of region D in FIG. 22B.
Figure 24C:
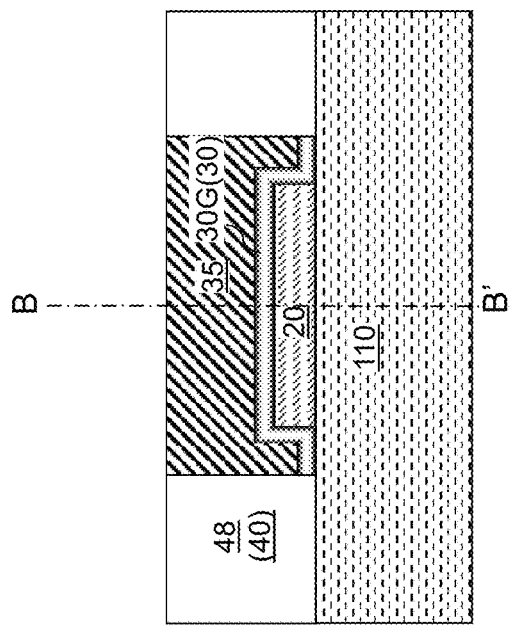
FIG. 24C is a vertical cross-sectional view of the seventh exemplary structure along the vertical plane C-C' of FIG. 24A.
Figure 24D:
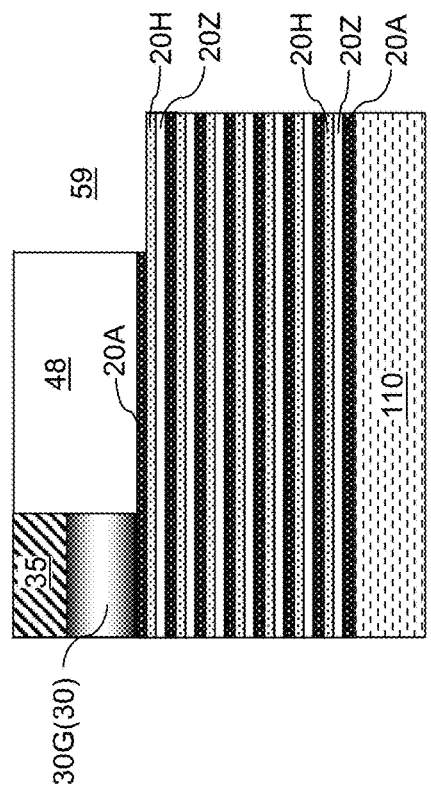
FIG. 24D is a magnified view of region D in FIG. 24B.
Figure 24A:
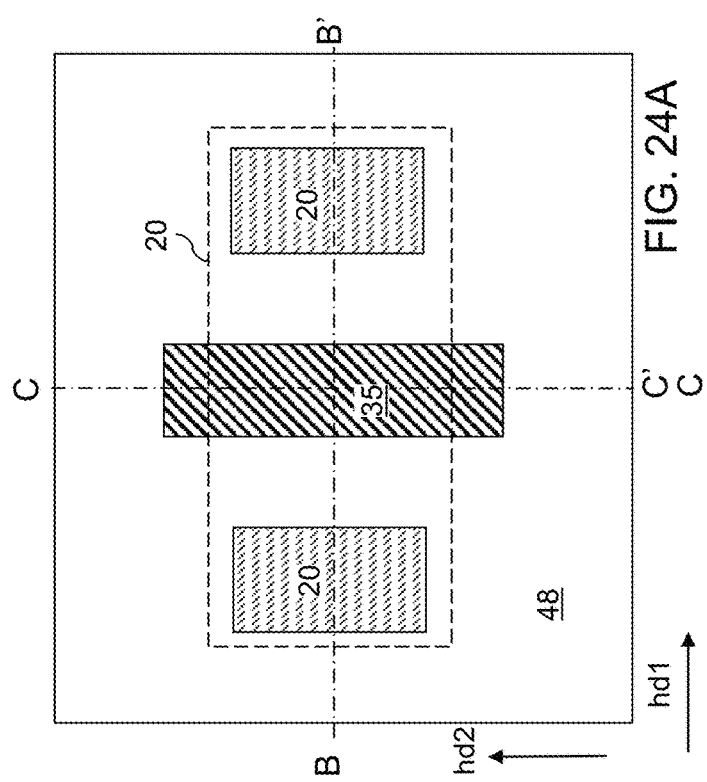
FIG. 24A is a top-down view of a region of the seventh exemplary structure after formation of a source cavity, a drain cavity, and a bottom gate contact via cavity according to the seventh embodiment of the present disclosure.
Figure 24B:
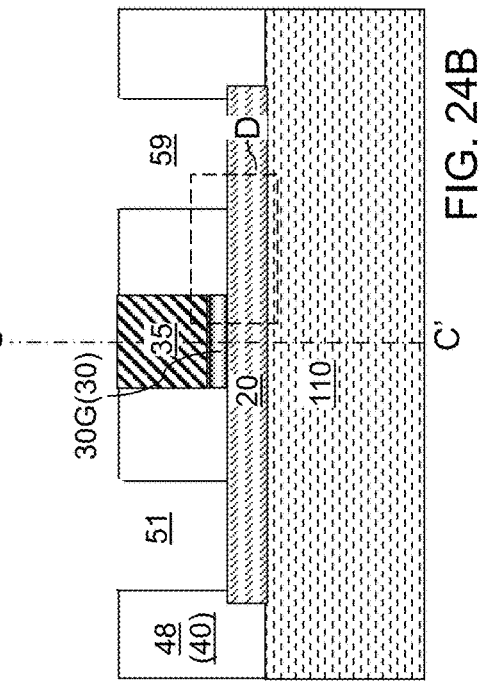
FIG. 24B is a vertical cross-sectional view of the seventh exemplary structure along the vertical plane B-B' of FIG. 24A.

Referring to FIGS. 15A-15D, a second exemplary structure according to a second embodiment of the present disclosure may be derived from the first exemplary structure by using a bottom gate dielectric 10 having a homogeneous material composition throughout. In this embodiment, the bottom gate dielectric 10 is herein referred to as a homogenous bottom gate dielectric 10H. The source electrode 52 and the drain electrode 56 can be formed directly on a topmost zinc oxide layer 20Z (in the same manner as illustrated in FIG. 11E) or a topmost post-transition metal oxide layer 20H including the oxide of the heavy post-transition metal element within the active layer 20 (as illustrated in FIG. 15D).

Referring to FIGS. 16A-16D, a third exemplary structure according to a third embodiment of the present disclosure may be derived from the first exemplary structure by using a top gate dielectric 30 having a homogeneous material composition throughout. In this embodiment, the top gate dielectric 30 is herein referred to as a homogenous top gate dielectric 30H. The source electrode 52 and the drain electrode 56 can be formed directly on a topmost zinc oxide layer 20Z (in the same manner as illustrated in FIG. 11E) or a topmost post-transition metal oxide layer 20H including the oxide of the heavy post-transition metal element within the active layer 20 (as illustrated in FIG. 16D).

Referring to FIGS. 17A-17D, a fourth exemplary structure according to a fourth embodiment of the present disclosure may be derived from the first exemplary structure by using a bottom gate dielectric 10 having a homogeneous material composition throughout, and by using a top gate dielectric 30 having a homogeneous material composition throughout. In this embodiment, the bottom gate dielectric 10 is herein referred to as a homogenous bottom gate dielectric 10H, and the top gate dielectric 30 is herein referred to as a homogenous top gate dielectric 30H. The source electrode 52 and the drain electrode 56 can be formed directly on a topmost zinc oxide layer 20Z (in the same manner as illustrated in FIG. 11E) or a topmost post-transition metal oxide layer 20H including the oxide of the heavy post-transition metal element within the active layer 20 (as illustrated in FIG. 17D).

Referring to FIGS. 18A-18D, a fifth exemplary structure according to a fifth embodiment of the present disclosure may be derived from the first exemplary structure by omitting formation of the top gate dielectric 30 and a top gate electrode 35. The source electrode 52 and the drain electrode 56 can be formed directly on a topmost zinc oxide layer 20Z (in the same manner as illustrated in FIG. 11E) or a topmost post-transition metal oxide layer 20H including the oxide of the heavy post-transition metal element within the active layer 20 (as illustrated in FIG. 18D).

Referring to FIG. 19A-19D, a sixth exemplary structure according to a sixth embodiment of the present disclosure may be derived from the second exemplary structure by omitting formation of a top gate dielectric 30 and a top gate electrode 35. The source electrode 52 and the drain electrode 56 can be formed directly on a topmost zinc oxide layer 20Z (in the same manner as illustrated in FIG. 11E) or a topmost post-transition metal oxide layer 20H including the oxide of the heavy post-transition metal element within the active layer 20 (as illustrated in FIG. 19D).

Referring to FIGS. 20A-20D, a seventh exemplary structure according to a seventh embodiment of the present disclosure may be provided by forming an active layer 20 over a buffer layer 110. In one embodiment, the buffer layer 110 may comprise an insulating material layer that is formed over the insulating spacer layer 635 of the first exemplary structure illustrated in FIG. 1. In this embodiment, the buffer layer 110 may comprise a silicon oxide layer, a silicon nitride layer, and/or a porous or non-porous organosilicate glass layer. Alternatively, the buffer layer 110 may comprise a semiconducting metal oxide substrate (having a thickness in a range from 60 microns to 1 mm) or a semiconducting metal oxide layer having a higher electrical resistivity than the active layer 20, for example, by a factor of at least 10, such as by a factor in a range from 10 to $10^6$. Yet alternatively, the buffer layer 110 may comprise an insulating substrate such as a glass substrate or a sapphire substrate (i.e., an aluminum oxide substrate) having a thickness in a range from 60 microns to 1 mm.

The active layer 20 may be formed by deposition of a continuous active layer and patterning of the continuous active layer. The active layer 20 may have the same structure as in the first through sixth exemplary structures, and may be formed using the same processing steps described with reference to the first exemplary structure. The active layer 20 may have any configuration selected from the configurations illustrated in FIGS. 5D and 5E.

Referring to FIGS. 21A-21D, the processing steps of FIGS. 7A-7D may be performed to form a continuous top gate dielectric layer 30L and a continuous top gate electrode layer 35L. The continuous top gate dielectric layer 30L may be formed with a vertically graded material composition, or may be formed with a homogeneous material composition.

Referring to FIGS. 22A-22D, the processing steps of FIGS. 8A-8D may be performed to pattern the continuous top gate electrode layer 35L and the continuous top gate dielectric layer 30L into a top gate electrode 35 and a top gate dielectric 30.

Referring to FIGS. 23A-23D, the processing steps of FIGS. 9A-9D may be performed to form a dielectric layer 48, which is also referred to as a thin-film-transistor-level (TFT-level) dielectric layer 40, i.e., a dielectric layer that is located at the level of thin film transistors.

Referring to FIGS. 24A-24D, a photoresist layer (not shown) may be applied over the TFT-level dielectric layer 40, and may be lithographically patterned to form discrete openings therein. The pattern of the discrete openings in the photoresist layer may be transferred through the dielectric layer 48 by an anisotropic etch process to form a source cavity 51 and a drain cavity 59. The anisotropic etch process comprises a first etch step that etches the material of the dielectric layer 48 selective to the topmost layer (i.e., the topmost acceptor-type oxide layer 20A) of the active layer 20, and a terminal etch step that etches the material of the topmost acceptor-type oxide layer 20A selective to an underlying layer, which may be a topmost post-transition metal oxide layer 20H or a topmost zinc oxide layer 20Z.

In one configuration, each unit layer stack within the active layer include an acceptor-type oxide layer 20A, a post-transition metal oxide layer 20H, and a zinc oxide layer 20Z, and the terminal etch step of the anisotropic etch process etches the topmost acceptor-type oxide layer 20A selective to the topmost zinc oxide layer 20Z. A top surface of the topmost post-transition metal oxide layer 20H is physically exposed, and a physically exposed portion of the topmost post-transition metal oxide layer 20H may have a thickness in a range from 50% to 100%, such as from 70% to 95%, of the thickness of the unexposed portion of the topmost post-transition metal oxide layer 20H.

In another configuration, each unit layer stack within the active layer include an acceptor-type oxide layer 20A, a post-transition metal oxide layer 20H, and a zinc oxide layer 20Z, and the terminal etch step of the anisotropic etch process etches the topmost acceptor-type oxide layer 20A and the topmost post-transition metal oxide layer 20H selective to the topmost zinc oxide layer 20Z. A top surface of the topmost zinc oxide layer 20Z is physically exposed, and a physically exposed portion of the topmost zinc oxide layer 20Z may have a thickness in a range from 50% to 100%, such as from 70% to 95%, of the thickness of the unexposed portion of the topmost zinc oxide layer 20Z.

In yet another configuration, each unit layer stack within the active layer include an acceptor-type oxide layer 20A and a post-transition metal oxide layer 20H, and the terminal etch step of the anisotropic etch process etches the topmost acceptor-type oxide layer 20A selective to the topmost post-transition metal oxide layer 20H. A top surface of the topmost post-transition metal oxide layer 20H is physically exposed, and a physically exposed portion of the topmost post-transition metal oxide layer 20H may have a thickness in a range from 50% to 100%, such as from 70% to 95%, of the thickness of the unexposed portion of the topmost post-transition metal oxide layer 20H.

The source cavity 51 and the drain cavity 59 may be formed at opposite ends of the active layer 20, and may be laterally spaced from each other along the first horizontal direction hd1. In one embodiment, an end sidewall of the active layer 20 laterally extending along the second horizontal direction hd2 and a pair of sidewall segments of the active layer 20 laterally extending along the first horizontal direction hd1 may be physically exposed at the bottom of each of the source cavity 51 and the drain cavity 59. A rectangular portion of the top surface of the active layer 20 may be physically exposed at the bottom of each of the source cavity 51 and the drain cavity 59. The photoresist layer may be subsequently removed, for example, by ashing.

Referring to FIGS. 25A-25F, the processing steps of FIGS. 11A-11F may be performed. Specifically, at least one conductive material may be deposited in the cavities (51, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. The source electrode 52 and the drain electrode 56 can be formed directly on a topmost zinc oxide layer 20Z (as illustrated in FIG. 25E) or a topmost post-transition metal oxide layer 20H including the oxide of the heavy post-transition metal element within the active layer 20 (as illustrated in FIGS. 25D and 25F).

Figure 25F:
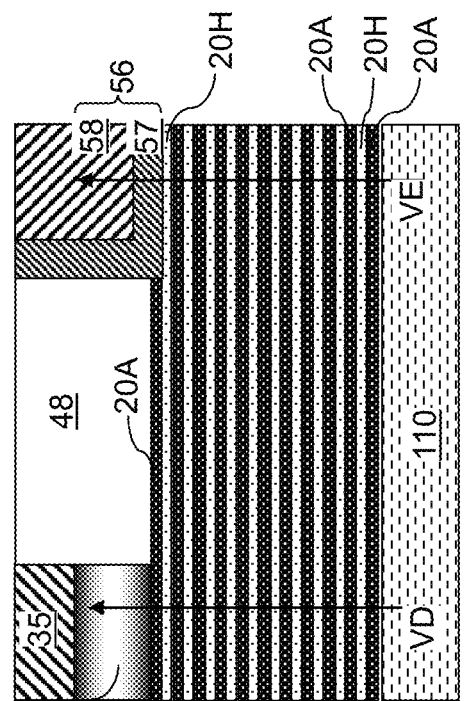
FIG. 25F is a magnified view of a second alternative configuration of region D in FIG. 25B.
Figure 25E:
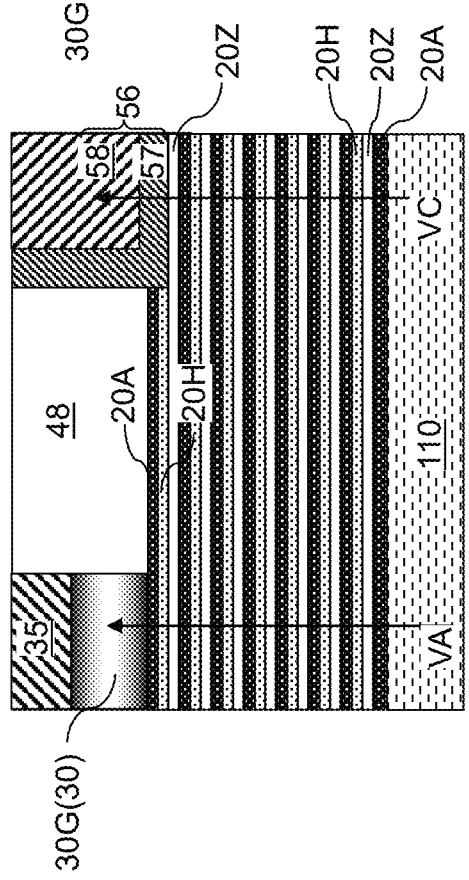
FIG. 25E is a magnified view of a first alternative configuration of region D in FIG. 25B.
Figure 26B:
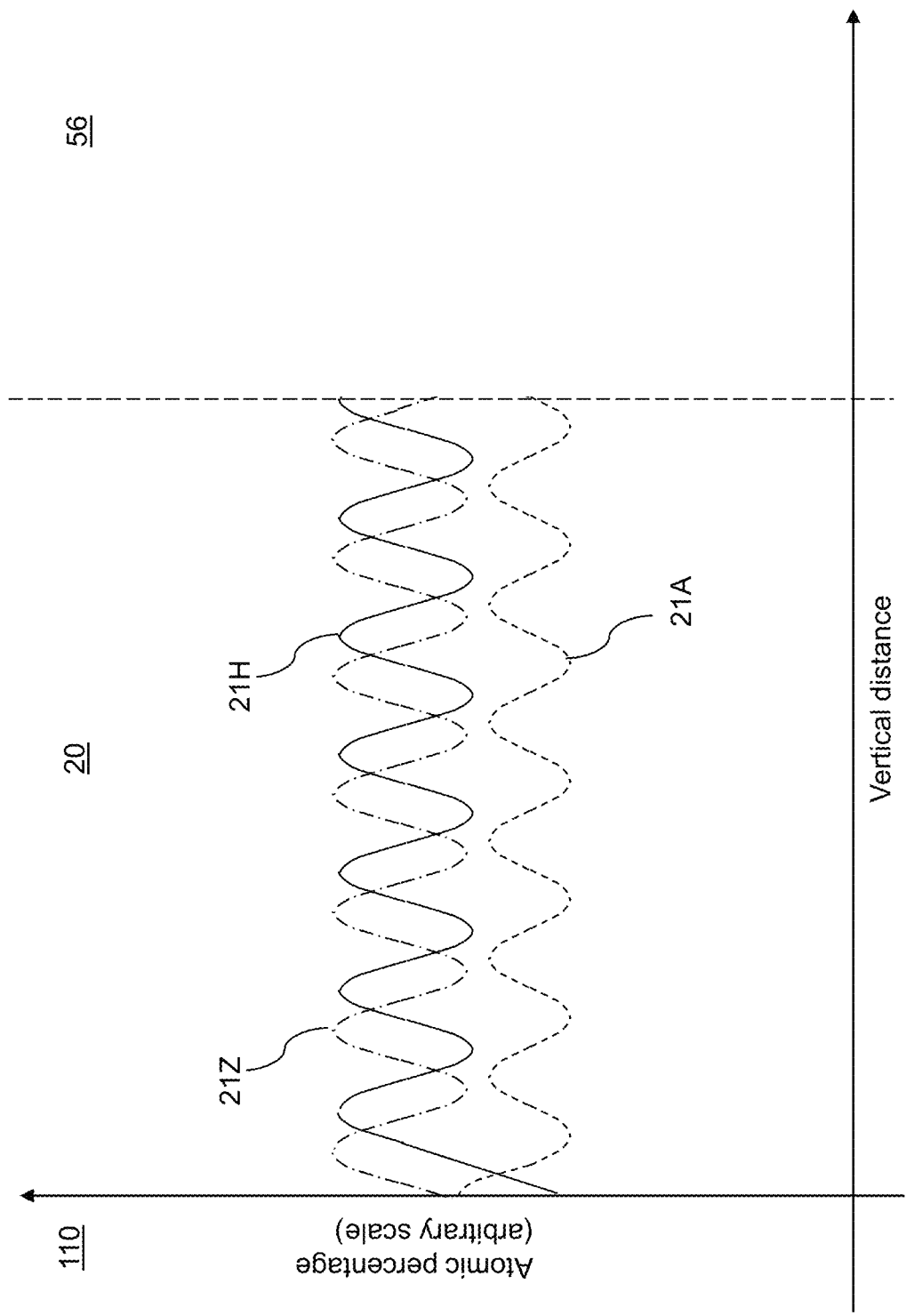
FIG. 26B is a vertical compositional profile of various metallic elements within the active layer along the vertical line VB shown in FIG. 25D.

FIG. 26A is a vertical compositional profile of various metallic elements within the active layer along the vertical line VA shown in FIG. 25D or FIG. 25E. FIG. 26B is a vertical compositional profile of various metallic elements within the active layer along the vertical line VB shown in FIG. 25D. FIG. 26C is a vertical compositional profile of various metallic elements within the active layer along the vertical line VC shown in FIG. 25E.

Figure 27B:
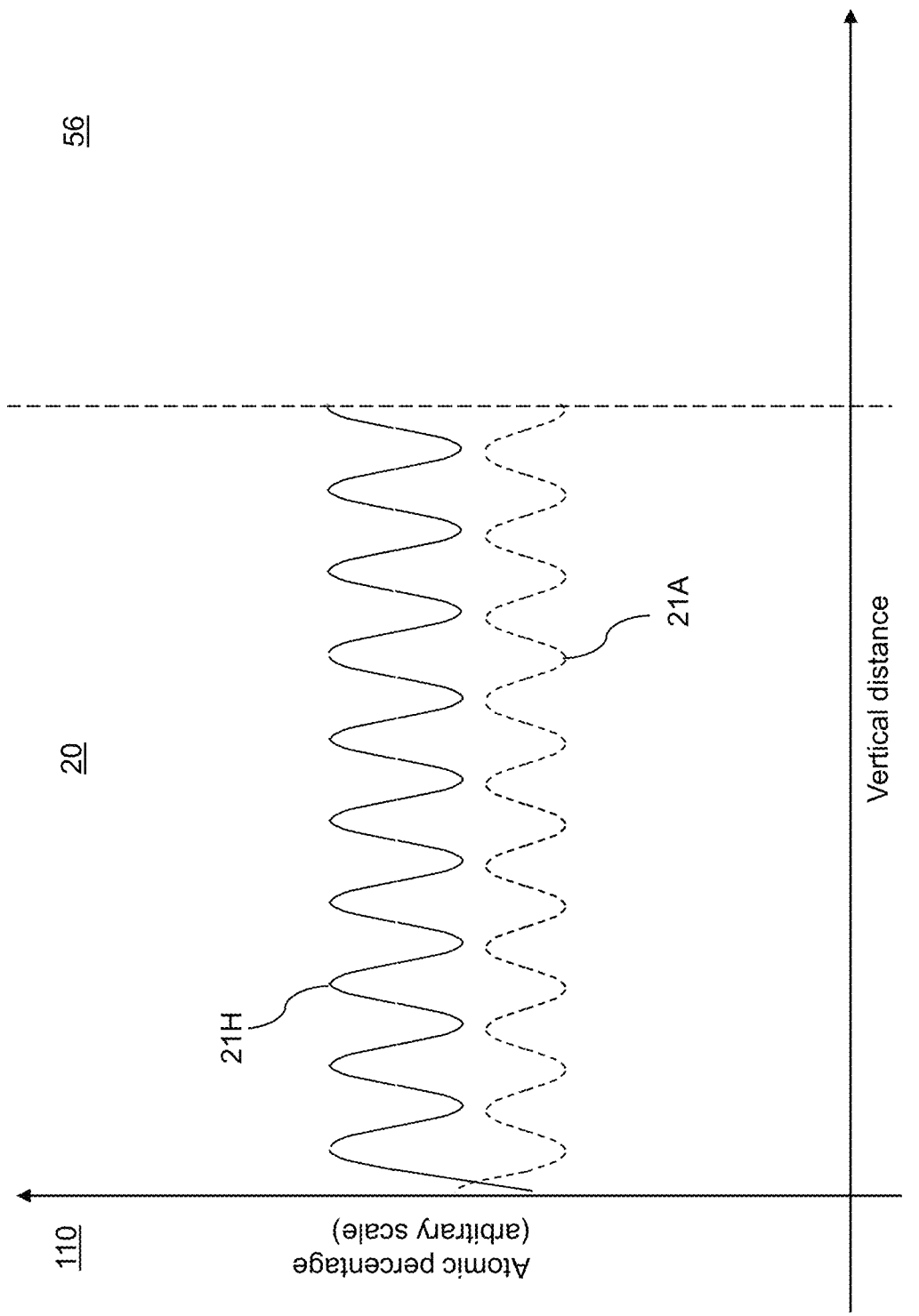
FIG. 27B is a vertical compositional profile of various metallic elements within the active layer along the vertical line VE shown in FIG. 25F.

FIG. 27A is a vertical compositional profile of various metallic elements within the active layer along the vertical line VD shown in FIG. 25F. FIG. 27B is a vertical compositional profile of various metallic elements within the active layer along the vertical line VE shown in FIG. 25F.

Referring collectively to FIGS. 26A-27B, curve 21A represents the atomic percentage of the acceptor-type element in a respective vertical compositional profile. Curve 21H represents the atomic percentage of the heavy post-transition metal element in a respective vertical compositional profile. Curve 21Z represents the atomic percentage of zinc in a respective vertical compositional profile. Generally, the atomic percentage of an element may be determined by taking an average of the atomic concentration of the element within a volume including an entire area of the active layer 20 and having an infinitesimally small height, and taking a limit in which the infinitesimal height approaches zero.

Generally, the curves 21A, 21H, and 21Z in FIG. 26A may have the same features as the curves 21A, 21H, and 21Z in FIG. 12A except that an interface between the active layer 20 and the bottom gate dielectric 10 is replaced with an interface between the active layer 20 and the buffer layer 110.

Generally, the curves 21A, 21H, and 21Z in FIG. 26B may have the same features as the curves 21A, 21H, and 21Z in FIG. 12B except that an interface between the active layer 20 and the bottom gate dielectric 10 is replaced with an interface between the active layer 20 and the buffer layer 110.

Generally, the curves 21A, 21H, and 21Z in FIG. 26C may have the same features as the curves 21A, 21H, and 21Z in FIG. 12C except that an interface between the active layer 20 and the bottom gate dielectric 10 is replaced with an interface between the active layer 20 and the buffer layer 110.

Generally, the curves 21A and 21H in FIG. 27A may have the same features as the curves 21A and 21H in FIG. 13A except that an interface between the active layer 20 and the bottom gate dielectric 10 is replaced with an interface between the active layer 20 and the buffer layer 110.

Generally, the curves 21A and 21H in FIG. 27B may have the same features as the curves 21A and 21H in FIG. 13B except that an interface between the active layer 20 and the bottom gate dielectric 10 is replaced with an interface between the active layer 20 and the buffer layer 110.

Referring to FIGS. 28A-28D, an eighth exemplary structure according to an eighth embodiment of the present disclosure may be derived from the seventh exemplary structure by using a top gate dielectric 30 having a homogeneous material composition throughout. In this embodiment, the top gate dielectric 30 is herein referred to as a homogenous top gate dielectric 30H. The source electrode 52 and the drain electrode 56 can be formed directly on a topmost zinc oxide layer 20Z (in the same manner as illustrated in FIG. 11E) or a topmost post-transition metal oxide layer 20H including the oxide of the heavy post-transition metal element within the active layer 20 (as illustrated in FIG. 28D).

Figure 29C:
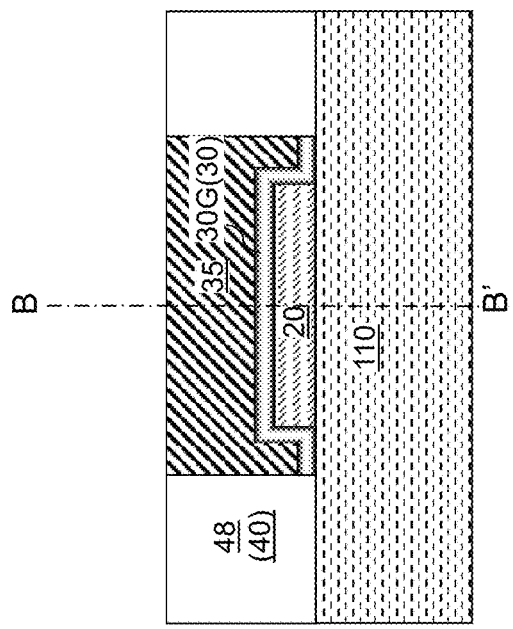
FIG. 29C is a vertical cross-sectional view of the ninth exemplary structure along the vertical plane C-C' of FIG. 29A.
Figure 29D:
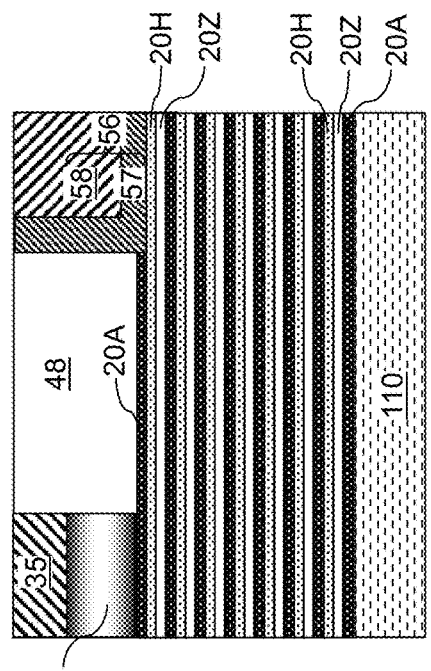
FIG. 29D is a magnified view of region D in FIG. 29B.
Figure 29A:
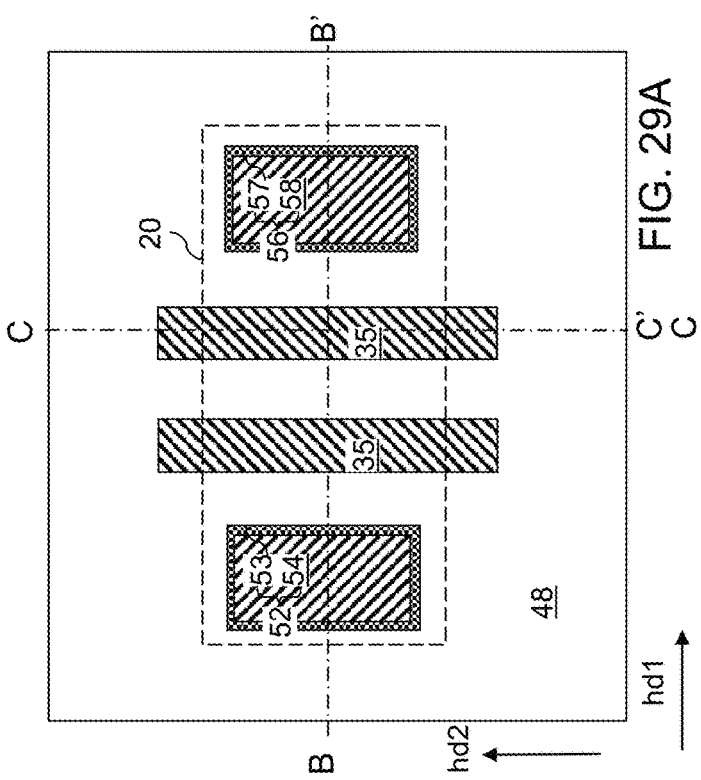
FIG. 29A is a top-down view of a region of a ninth exemplary structure after formation of a source electrode, a drain electrode, and a backside electrode contact via structure according to a ninth embodiment of the present disclosure.
Figure 29B:
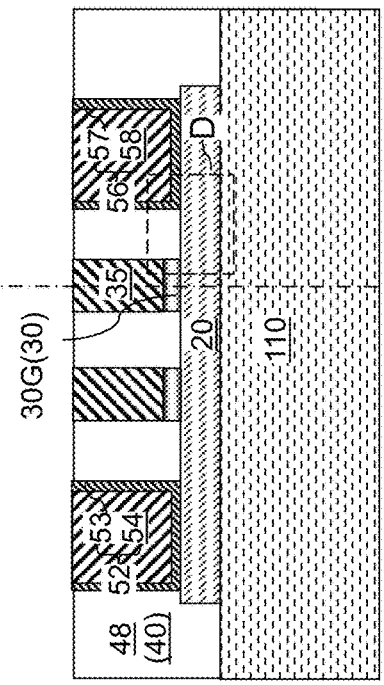
FIG. 29B is a vertical cross-sectional view of the ninth exemplary structure along the vertical plane B-B' of FIG. 29A.

Referring to FIGS. 29A-29D, a ninth exemplary structure according to a ninth embodiment of the present disclosure may be derived from the seventh exemplary structure by forming a plurality of top gate structures between the source electrode 52 and the drain electrode 56. Each gate structure may include, for example, a vertical stack of a top gate dielectric 30 and a top gate electrode 35. In one embodiment, each top gate dielectric 30 may be a graded top gate dielectric 30G. For example, two, three, four, or more gate structures (30, 35) may be formed between the source electrode 52 and the drain electrode 56 to form a horizontal NAND string. The source electrode 52 and the drain electrode 56 can be formed directly on a topmost zinc oxide layer 20Z (in the same manner as illustrated in FIG. 11E) or a topmost post-transition metal oxide layer 20H including the oxide of the heavy post-transition metal element within the active layer 20 (as illustrated in FIG. 29D).

Figure 30C:
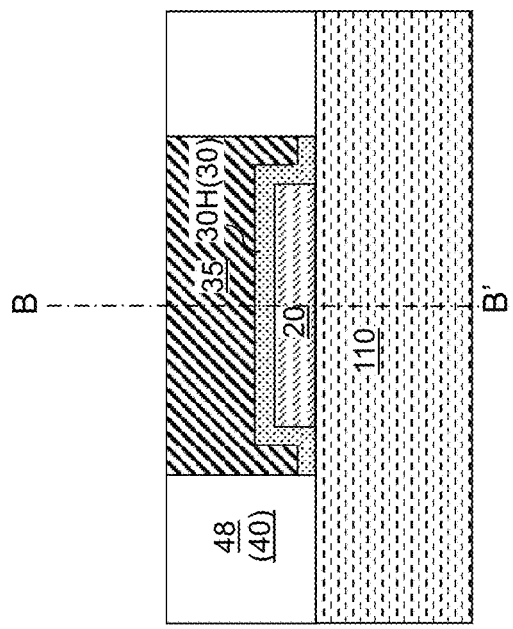
FIG. 30C is a vertical cross-sectional view of the tenth exemplary structure along the vertical plane C-C' of FIG. 30A.
Figure 30D:
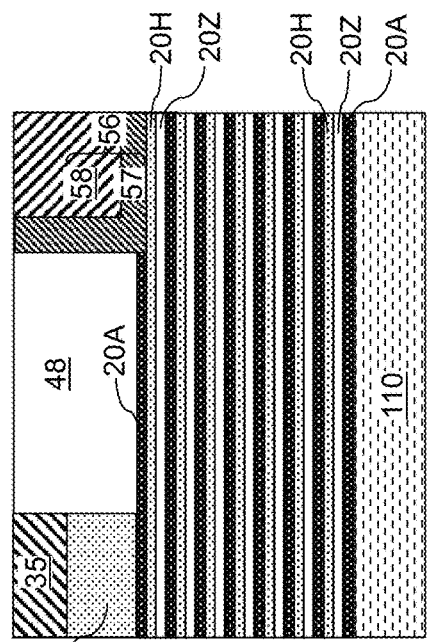
FIG. 30D is a magnified view of region D in FIG. 30B.
Figure 30A:
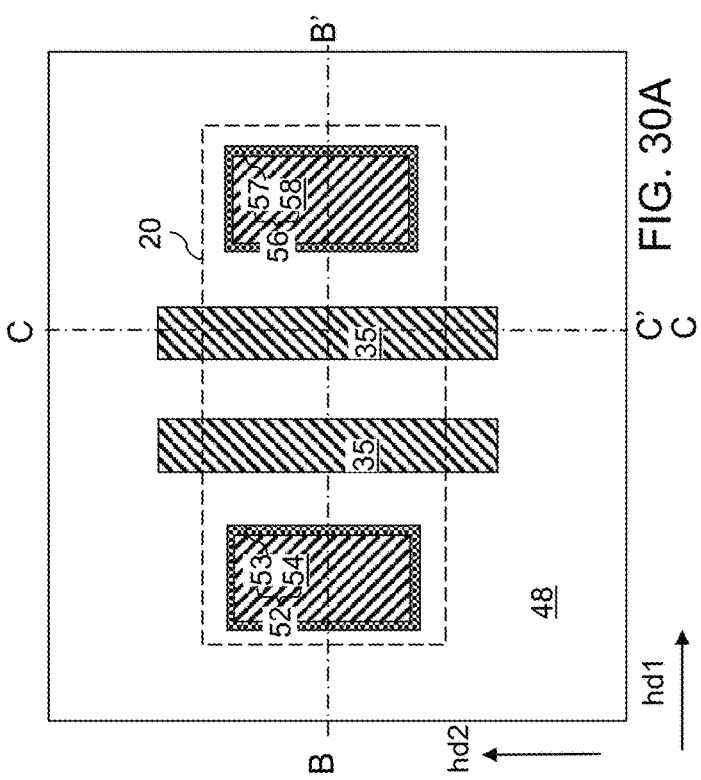
FIG. 30A is a top-down view of a region of a tenth exemplary structure after formation of a source electrode, a drain electrode, and a backside electrode contact via structure according to a tenth embodiment of the present disclosure.
Figure 30B:
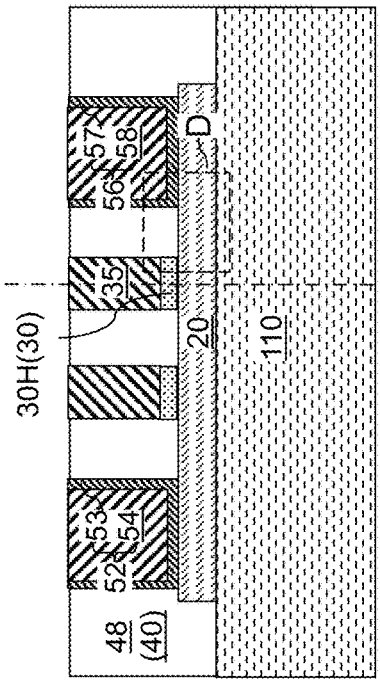
FIG. 30B is a vertical cross-sectional view of the tenth exemplary structure along the vertical plane B-B' of FIG. 30A.

Referring to FIGS. 30A-30D, a tenth exemplary structure according to a tenth embodiment of the present disclosure may be derived from the eighth exemplary structure by forming a plurality of top gate structures between the source electrode 52 and the drain electrode 56. Each gate structure may include, for example, a vertical stack of a top gate dielectric 30 and a top gate electrode 35. In one embodiment, each top gate dielectric 30 may be a homogeneous top gate dielectric 30H. For example, two, three, four, or more gate structures (30, 35) may be formed between the source electrode 52 and the drain electrode 56 to form a horizontal NAND string. The source electrode 52 and the drain electrode 56 can be formed directly on a topmost zinc oxide layer 20Z (in the same manner as illustrated in FIG. 11E) or a topmost post-transition metal oxide layer 20H including the oxide of the heavy post-transition metal element within the active layer 20 (as illustrated in FIG. 30D).

Figure 31:
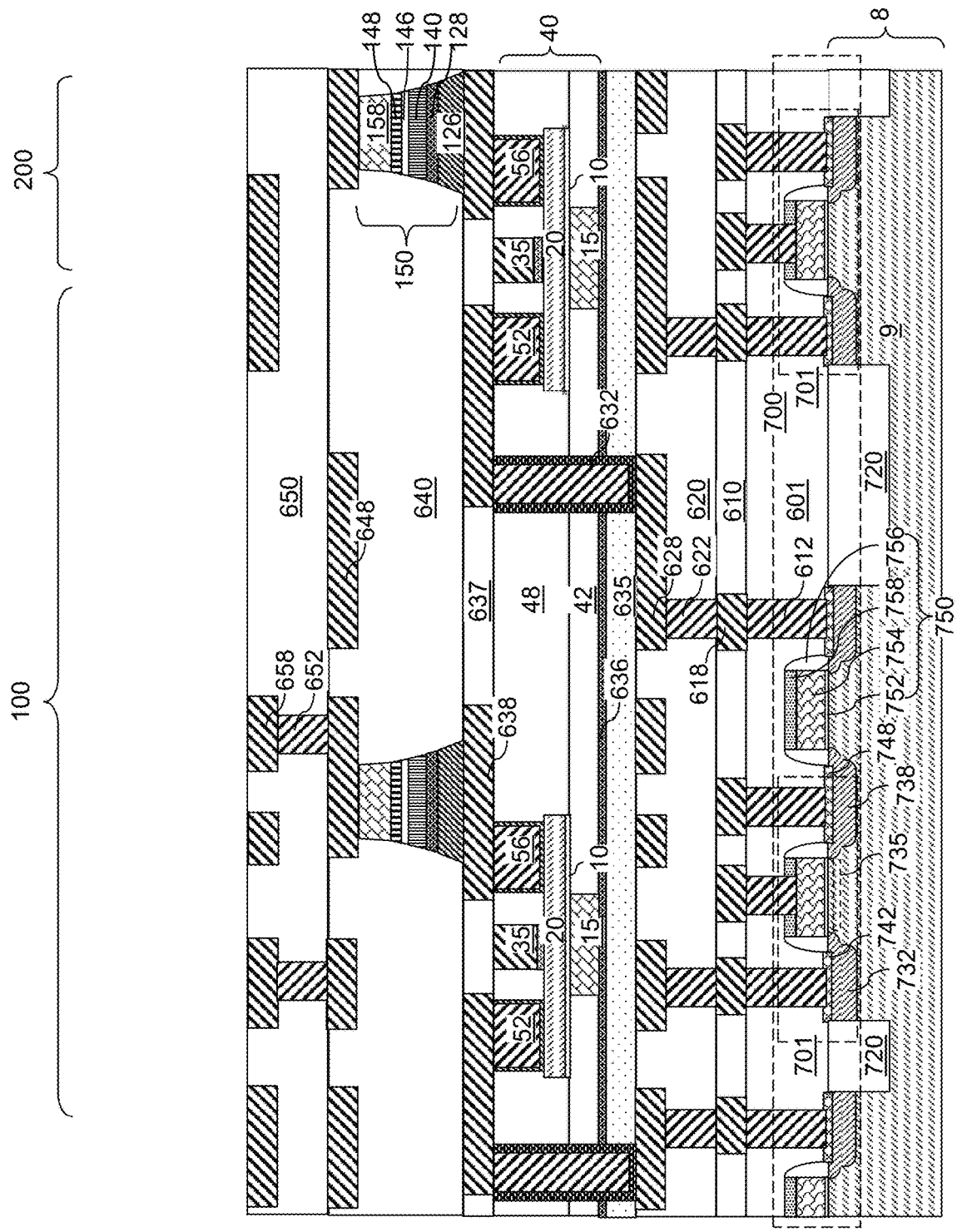
FIG. 31 is a vertical cross-sectional view of an exemplary structure after formation of memory cells according to an embodiment of the present disclosure.

Referring to FIG. 31, an exemplary structure is illustrated, which may be derived from any of the previously described exemplary structures by subsequently forming additional structures thereupon. In some embodiments, structures located underneath the bottom surface of the dielectric layer 48 may be replaced with a buffer layer 110. For example, second metal via structures 632 may be formed may be formed through the TFT-level dielectric layer 40 and the insulating spacer layer 635 on a respective one of the second metal line structures 628 concurrent with, before, or after, formation of the source electrodes 52, the drain electrodes 56, the optional top gate electrodes 35, and the backside electrode contact via structures 18.

A dielectric layer, which is herein referred to as a third line-level dielectric layer 637, may be deposited over the TFT-level dielectric layer 40. Third metal line structures 638 may be formed in the third line-level dielectric layer 637 on a respective one of the metallic structures (52, 56, 35, 18) embedded within the TFT-level dielectric layer 40.

Additional metal interconnect structures embedded in additional dielectric layers may be subsequently formed over the thin film transistors and the third line-level dielectric layer 637. In an illustrative example, the dielectric layers may include, for example, a fourth interconnect-level dielectric layer 640, a fifth interconnect-level dielectric layer 650, etc. The additional metal interconnect structures may include third metal via structures (not illustrated) and fourth metal lines 648 embedded in the fourth interconnect-level dielectric layer 640, fourth metal via structures 652 and fifth metal line structures 658 embedded in the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may comprises a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., the bottom electrode) and the second electrode 158 (i.e., the top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158. While the present disclosure is described using an embodiment in which the thin film transistors are used as access transistors for memory cells 150, embodiments are expressly contemplated herein in which the thin film transistors are used as logic devices, as components of a peripheral circuit for a memory array, or for any other semiconductor circuitry.

In one embodiment, the substrate 8 comprises a single crystalline silicon substrate. Lower-level dielectric layers (601, 610, 620) embedding lower-level metal interconnect structures (612, 618, 622, 628) may be located between the single crystalline silicon substrate and the insulating layer 42. Field effect transistors 701 including a respective portion of the single crystalline silicon substrate as a channel may be embedded within the lower-level dielectric layers (601, 610, 620), and may be electrically connected to at least one of the gate electrodes (15, 35), the source electrodes 52, and the drain electrodes 56.

Referring collectively to FIGS. 1-31 and according to various embodiments of the present disclosure, a thin film transistor is provided, which may include: a bottom gate electrode 15 embedded in an insulating layer 42; a bottom gate dielectric 10 located on a top surface of the bottom gate electrode 15; and an active layer 20 located over the bottom gate dielectric 10 and having a vertical compositional modulation, wherein the active layer 20 comprises oxygen, an acceptor-type element selected from Ga and W, and a heavy post-transition metal element selected from In and Sn, wherein a vertical compositional profile of an atomic percentage of the acceptor-type element between a bottommost surface of the active layer 20 and a topmost surface of the active layer 20 (as illustrated by curves 21A in FIGS. 12A, 13A, 26A, and 27A) has N local peaks in which N is an integer greater than 2, and wherein a bottommost peak selected from the N peaks is higher than any of (N-2) intermediate peaks located between the bottommost peak and a topmost peak selected from the N peaks.

In one embodiment, a vertical compositional profile of an atomic percentage of the heavy post-transition metal element between the bottommost surface of the active layer 20 and the topmost surface of the active layer 20 may have (N-1) local peaks; the vertical compositional profile of the atomic percentage of the heavy post-transition metal element may have N local minima; and a bottommost local minimum of the atomic percentage of the heavy post-transition metal element located at the bottommost surface of the active layer 20 may be lower than any of (N-2) intermediate local minima located between the bottommost local minimum and a topmost local minimum of the vertical compositional profile of the atomic percentage of the heavy post-transition metal element.

In one embodiment, the bottommost local minimum of the atomic percentage of the heavy post-transition metal element may be a global minimum for the atomic percentage of the heavy post-transition metal element; or the topmost local minimum of the atomic percentage of the heavy post-transition metal element may be lower than any of the (N-2) intermediate local minima of the vertical compositional profile of the atomic percentage of the heavy post-transition metal element.

In one embodiment, a topmost peak selected from the N peaks within the vertical compositional profile of the atomic percentage of the acceptor-type element may be located at the topmost surface of the active layer 20, and may be higher than any of the (N-2) intervening peaks within the vertical compositional profile of the atomic percentage of the acceptor-type element.

In one embodiment, the active layer 20 may include zinc; a vertical compositional profile of an atomic percentage of zinc between the bottommost surface of the active layer 20 and the topmost surface of the active layer may have (N-1) local peaks; and the vertical compositional profile of the atomic percentage of zinc may have a global minimum at the topmost surface of the active layer 20.

In one embodiment, a vertical compositional profile of an atomic percentage of the heavy post-transition metal element between the bottommost surface of the active layer 20 and the topmost surface of the active layer 20 may have (N-1) local peaks; and the vertical compositional profile of the atomic percentage of the heavy post-transition metal element may have a global minimum at the bottommost surface of the active layer 20.

In one embodiment, the thin film transistor may further include a source electrode 52 contacting a first recessed horizontal surface of the active layer 20; and a drain electrode 56 contacting a second recessed horizontal surface of the active layer 20.

In one embodiment, an atomic percentage of the acceptor-type element at a surface portion of the active layer 20 that contacts the source electrode 52 or the drain electrode 56 may be less than an atomic percentage of the acceptor-type element at the topmost peak selected from the N peaks of the vertical compositional profile of the atomic percentage of the acceptor-type element.

In one embodiment, a vertical compositional profile of an atomic percentage of the heavy post-transition metal element along a vertical line extending between the bottommost surface of the active layer 20 and a bottom surface of one of the source electrode 52 and the drain electrode 56 may have (N-1) local peaks; and a topmost local peak selected from the (N-1) local peaks within the vertical compositional profile of the atomic percentage of the heavy post-transition metal element may be located at an interface with the one of the source electrode 52 and the drain electrode 56.

In one embodiment, the active layer 20 may include zinc; a vertical compositional profile of an atomic percentage of zinc along a vertical line extending between the bottommost surface of the active layer 20 and a bottom surface of one of the source electrode 52 and the drain electrode 56 may have (N-1) local peaks and (N-1) local minima; and a location of a topmost local minimum selected from the (N-1) local minima within the vertical compositional profile of the atomic percentage of zinc may be vertically spaced from an interface with the one of the source electrode 52 and the drain electrode 56.

In one embodiment, the bottom gate dielectric 15 may include a dielectric metal oxide material that further includes a first metallic element, a second metallic element, and oxygen; and the bottom gate dielectric 15 may have a vertical compositional modulation in which an atomic percentage of the second metallic element has a minimum at a height that may be vertically spaced from a bottom surface of the bottom gate dielectric 15 and from a top surface of the bottom gate dielectric 15.

According to various embodiments of the present disclosure, a thin film transistor is provided, which comprises: an active layer 20 located over a substrate and having a vertical compositional modulation; a top gate dielectric 30 straddling a channel portion (i.e., the portion of the active layer 20 having an overlap with the top gate dielectric 30) of the active layer 20; and a top gate electrode 35 located on a top surface of the top gate dielectric 30, wherein the active layer 20 comprises oxygen, an acceptor-type element selected from Ga and W, and a heavy post-transition metal element selected from In and Sn, wherein a vertical compositional profile of an atomic percentage of the acceptor-type element between a bottommost surface of the active layer and a topmost surface of the active layer 20 has N local peaks in which N is an integer greater than 2 (as illustrated by curves 21A in FIGS. 12A, 13A, 26A, and 27A), and wherein a topmost peak selected from the N peaks is higher than any of (N-2) intermediate peaks located between a bottommost peak and the topmost peak selected from the N peaks.

In one embodiment, a vertical compositional profile of an atomic percentage of the heavy post-transition metal element between the bottommost surface of the active layer 20 and the topmost surface of the active layer 20 may have (N-1) local peaks; the vertical compositional profile of the atomic percentage of the heavy post-transition metal element may have N local minima; and a topmost local peak selected from the (N−1) local peaks of the atomic percentage of the heavy post-transition metal element may be vertically offset from the topmost surface of the active layer 20.

In one embodiment, the active layer 20 may include zinc; a vertical compositional profile of an atomic percentage of zinc between the bottommost surface of the active layer 20 and the topmost surface of the active layer may have (N−1) local peaks; and the vertical compositional profile of the atomic percentage of zinc may have a global minimum at the topmost surface of the active layer 20.

In one embodiment, a source electrode 52 may contact a first recessed horizontal surface of the active layer 20; and a drain electrode 52 may contact a second recessed horizontal surface of the active layer 20, wherein an atomic percentage of the acceptor-type element at a surface portion of the active layer 20 that contacts the source electrode 52 or the drain electrode 56 may be less than an atomic percentage of the acceptor-type element at the topmost peak selected from the N peaks of the vertical compositional profile of the atomic percentage of the acceptor-type element.

Figure 32:
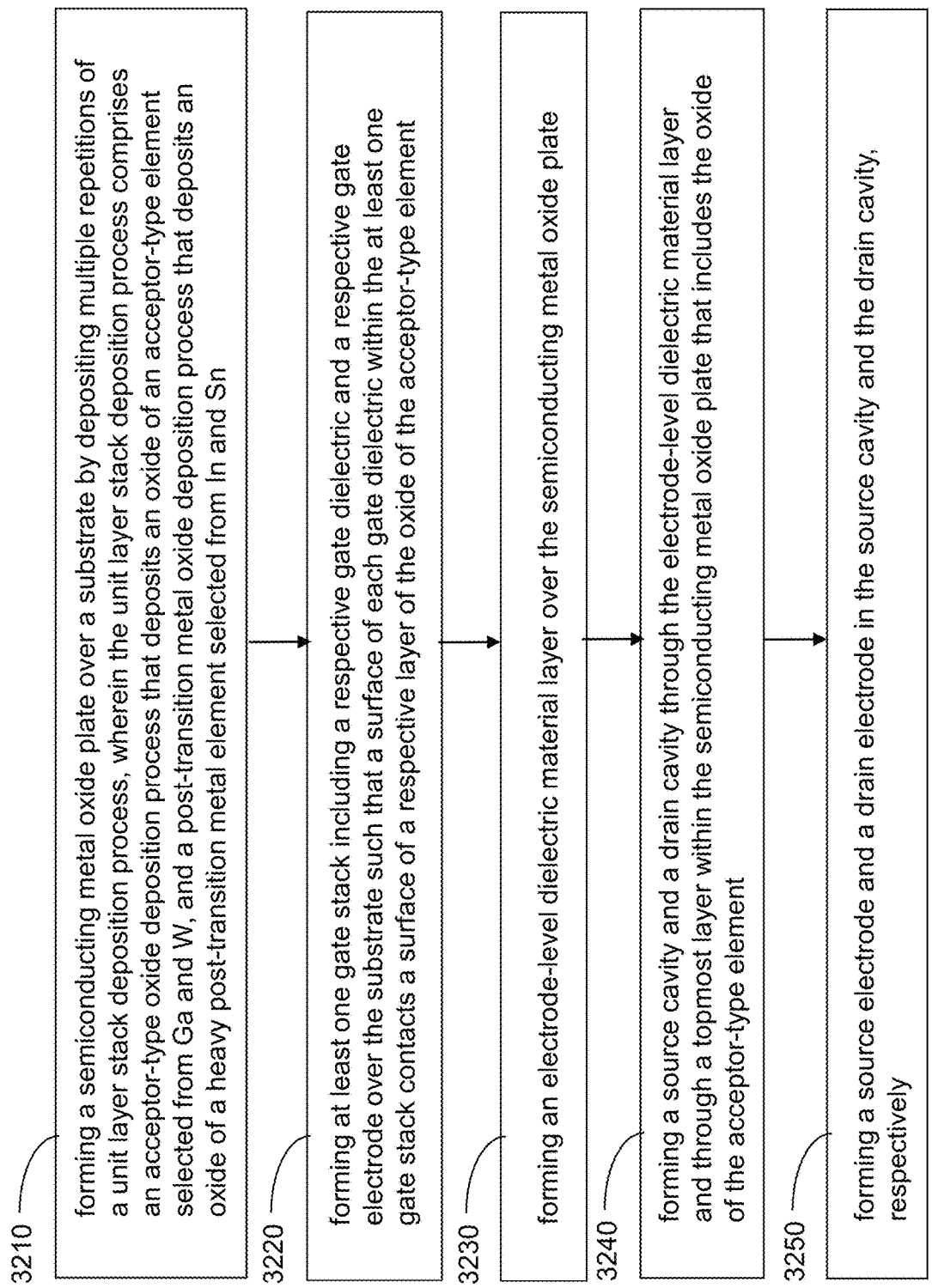
FIG. 32 is a flowchart that illustrates the general processing steps for manufacturing the semiconductor device of the present disclosure.

Referring to FIG. 32, a flowchart illustrates a general sequence of processing steps that may be used to form the structures of the present disclosure. Referring to step 3210 and FIGS. 1-6D, 15A-20D, and 28A-30D, an active layer 20 may be formed over a substrate by depositing multiple iterations of a unit layer stack deposition process. The unit layer stack deposition process comprises an acceptor-type oxide deposition process that deposits an oxide of an acceptor-type element selected from Ga and W, and a post-transition metal oxide deposition process that deposits an oxide of a heavy post-transition metal element selected from In and Sn.

Referring to step 3220 and FIGS. 2A-4C, 7A-8D, 15A-19D, 21A-22D, and 28A-30D, at least one gate stack {(10, 15), (30, 35)} including a respective gate dielectric (10, 30) and a respective gate electrode (15, 35) is formed over the substrate such that a surface of each gate dielectric (10, 30) within the at least one gate stack {(10, 15), (30, 35)} contacts a surface of a respective layer of the oxide of the acceptor-type element (i.e., a bottommost acceptor-type oxide layers 20A or a topmost acceptor-type oxide layer 20A).

Referring to step 3230 and FIGS. 9A-9D, 15A-19D, 23A-23D, and 28A-30D, a dielectric layer 48 may be formed over the active layer 20.

Referring to step 3240 and FIGS. 10A-10F, 15A-19D, 24A-24D, and 28A-30D, a source cavity 51 and a drain cavity 59 may be formed through the dielectric layer 48 and through a topmost layer within the active layer 20 that includes the oxide of the acceptor-type element, i.e., through the topmost acceptor-type oxide layer 20A.

Referring to step 3250 and FIGS. 11A-11F, 15A-19D, 25A-25F, and 28A-30D, a source electrode 52 and a drain electrode 56 may be formed in the source cavity 51 and the drain cavity 59, respectively.

The various embodiments of the present disclosure provide a low leakage surface within the active layer 20 and a low resistance contact between the active layer 20 and each of a source electrode 52 and a drain electrode 56.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thin film transistor comprising:
a bottom gate electrode embedded in an insulating layer;
a bottom gate dielectric located on a top surface of the bottom gate electrode;
an active layer located over the bottom gate dielectric and having a vertical compositional modulation;
a dielectric layer contacting a horizontal top surface of the insulating layer, a sidewall of the bottom gate dielectric, and a sidewall of the active layer; and
a source electrode comprising a source sidewall that vertically extends from a top surface of the dielectric layer to a first recessed horizontal surface of the active layer,
wherein the active layer comprises oxygen, an acceptor-type element selected from Ga and W, and a heavy post-transition metal element selected from In and Sn,
wherein a vertical compositional profile of an atomic percentage of the acceptor-type element between a bottommost surface of the active layer and a topmost surface of the active layer has N local peaks in which N is an integer greater than 2,
wherein a bottommost peak selected from the N peaks is higher than any of (N−2) intermediate peaks located between the bottommost peak and a topmost peak selected from the N peaks,
wherein the active layer comprises multiple instances of a unit layer stack that is repeated along a vertical direction, and each instance of the unit layer stack consists of, in order along the vertical direction, an acceptor-type oxide layer including an oxide of the acceptor-type element, a zinc oxide layer, and a post-transition metal oxide layer including an oxide of the heavy post-transition metal element, and each vertically neighboring pair of instances of the unit layer stack is in direct contact with each other,
wherein the active layer further comprises a topmost acceptor-type oxide layer in direct contact with a topmost surface of the multiple instances of the unit layer stack and in direct contact with a horizontal bottom surface segment of the dielectric layer, and
the source electrode vertically extends through the topmost acceptor-type oxide layer and comprises a bottom surface that directly contacts a top surface of an underlying layer that is selected from a post-transition metal oxide layer within a topmost instance of the unit layer stack and a topmost zinc oxide layer within the topmost instance of the unit layer stack, the top surface of the underlying layer being the first recessed horizontal surface of the active layer.

2. The thin film transistor of claim 1, wherein:
a vertical compositional profile of an atomic percentage of the heavy post-transition metal element between the bottommost surface of the active layer and the topmost surface of the active layer has (N−1) local peaks;
the vertical compositional profile of the atomic percentage of the heavy post-transition metal element has N local minima; and
a bottommost local minimum of the atomic percentage of the heavy post-transition metal element located at the bottommost surface of the active layer that is lower than any of (N−2) intermediate local minima located between the bottommost local minimum and a topmost local minimum of the vertical compositional profile of the atomic percentage of the heavy post-transition metal element.

3. The thin film transistor of claim 2, wherein:
the bottommost local minimum of the atomic percentage of the heavy post-transition metal element is a global minimum for the atomic percentage of the heavy post-transition metal element; or
the topmost local minimum of the atomic percentage of the heavy post-transition metal element is lower than any of the (N−2) intermediate local minima of the vertical compositional profile of the atomic percentage of the heavy post-transition metal element.

4. The thin film transistor of claim 1, wherein a topmost peak selected from the N peaks within the vertical compositional profile of the atomic percentage of the acceptor-type element is located at the topmost surface of the active layer, and is higher than any of the (N−2) intervening peaks within the vertical compositional profile of the atomic percentage of the acceptor-type element.

5. The thin film transistor of claim 1, wherein:
the active layer comprises zinc;
a vertical compositional profile of an atomic percentage of zinc between the bottommost surface of the active layer and the topmost surface of the active layer has (N−1) local peaks; and
the vertical compositional profile of the atomic percentage of zinc has a global minimum at the topmost surface of the active layer.

6. The thin film transistor of claim 5, wherein:
a vertical compositional profile of an atomic percentage of the heavy post-transition metal element between the bottommost surface of the active layer and the topmost surface of the active layer has (N−1) local peaks; and
the vertical compositional profile of the atomic percentage of the heavy post-transition metal element has a global minimum at the bottommost surface of the active layer.

7. The thin film transistor of claim 1, further comprising a drain electrode contacting a second recessed horizontal surface of the active layer.

8. The thin film transistor of claim 7, wherein an atomic percentage of the acceptor-type element at a surface portion of the active layer that contacts the source electrode or the drain electrode is less than an atomic percentage of the acceptor-type element at the topmost peak selected from the N peaks of the vertical compositional profile of the atomic percentage of the acceptor-type element.

9. The thin film transistor of claim 7, wherein:
a vertical compositional profile of an atomic percentage of the heavy post-transition metal element along a vertical line extending between the bottommost surface of the active layer and a bottom surface of one of the source electrode and the drain electrode has (N−1) local peaks; and
a topmost local peak selected from the (N−1) local peaks within the vertical compositional profile of the atomic percentage of the heavy post-transition metal element is located at an interface with the one of the source electrode and the drain electrode.

10. The thin film transistor of claim 7, wherein:
the active layer comprises zinc;
a vertical compositional profile of an atomic percentage of zinc along a vertical line extending between the bottommost surface of the active layer and a bottom surface of one of the source electrode and the drain electrode has (N−1) local peaks and (N−1) local minima; and
a location of a topmost local minimum selected from the (N−1) local minima within the vertical compositional profile of the atomic percentage of zinc is vertically spaced from an interface with the one of the source electrode and the drain electrode.

11. The thin film transistor of claim 1, wherein:
the bottom gate dielectric comprises a dielectric metal oxide material including a first metallic element, a second metallic element, and oxygen; and
the bottom gate dielectric has a vertical compositional modulation in which an atomic percentage of the second metallic element has a minimum at a height that is vertically spaced from a bottom surface of the bottom gate dielectric and from a top surface of the bottom gate dielectric.

12. The semiconductor structure of claim 1, wherein a topmost peak selected from the N peaks within the vertical compositional profile of the atomic percentage of the acceptor-type element is located at the topmost surface of the active layer, and is higher than any of the (N−2) intervening peaks within the vertical compositional profile of the atomic percentage of the acceptor-type element.

13. The semiconductor structure of claim 1, wherein:
the active layer comprises zinc;
a vertical compositional profile of an atomic percentage of zinc between the bottommost surface of the active layer and the topmost surface of the active layer has (N−1) local peaks; and
the vertical compositional profile of the atomic percentage of zinc has a global minimum at the topmost surface of the active layer.

14. A thin film transistor comprising:
an active layer located over an insulating layer that overlies a substrate and having a vertical compositional modulation;
a top gate dielectric straddling a channel portion of the active layer;
a top gate electrode located on a top surface of the top gate dielectric;
a dielectric layer contacting a horizontal top surface of the insulating layer, a sidewall of the active layer, a sidewall of the top gate dielectric, and a sidewall of the top gate electrode; and
a source electrode comprising a source sidewall that vertically extends from a top surface of the dielectric layer to a first recessed horizontal surface of the active layer,
wherein the active layer comprises oxygen, an acceptor-type element selected from Ga and W, and a heavy post-transition metal element selected from In and Sn,
wherein a vertical compositional profile of an atomic percentage of the acceptor-type element between a bottommost surface of the active layer and a topmost surface of the active layer has N local peaks in which N is an integer greater than 2,
wherein a topmost peak selected from the N peaks is higher than any of (N−2) intermediate peaks located between a bottommost peak and the topmost peak selected from the N peaks,
wherein the active layer comprises multiple instances of a unit layer stack that is repeated along a vertical direction, and each instance of the unit layer stack consists of, in order along the vertical direction, an acceptor-type oxide layer including an oxide of the acceptor-type element, a zinc oxide layer, and a post-transition metal oxide layer including an oxide of the heavy post-transition metal element, and each vertically neighboring pair of instances of the unit layer stack is in direct contact with each other, wherein the active layer further comprises a topmost acceptor-type oxide layer in direct contact with a topmost surface of the multiple instances of the unit layer stack and in direct contact with a horizontal bottom surface segment of the dielectric layer, and the source electrode vertically extends through the topmost acceptor-type oxide layer and comprises a bottom surface that directly contacts a top surface of an underlying layer that is selected from a post-transition metal oxide layer within a topmost instance of the unit layer stack and a topmost zinc oxide layer within the topmost instance of the unit layer stack, the top surface of the underlying layer being the first recessed horizontal surface of the active layer.

15. The thin film transistor of claim 14, wherein:

a vertical compositional profile of an atomic percentage of the heavy post-transition metal element between the bottommost surface of the active layer and the topmost surface of the active layer has (N−1) local peaks;

the vertical compositional profile of the atomic percentage of the heavy post-transition metal element has N local minima; and a topmost local peak selected from the (N−1) local peaks of the atomic percentage of the heavy post-transition metal element is vertically offset from the topmost surface of the active layer.

16. The thin film transistor of claim 14, wherein:

the active layer comprises zinc;

a vertical compositional profile of an atomic percentage of zinc between the bottommost surface of the active layer and the topmost surface of the active layer has (N−1) local peaks; and the vertical compositional profile of the atomic percentage of zinc has a global minimum at the topmost surface of the active layer.

17. The thin film transistor of claim 14, further comprising:

a source electrode contacting a first recessed horizontal surface of the active layer; and a drain electrode contacting a second recessed horizontal surface of the active layer, wherein an atomic percentage of the acceptor-type element at a surface portion of the active layer that contacts the source electrode or the drain electrode is less than an atomic percentage of the acceptor-type element at the topmost peak selected from the N peaks of the vertical compositional profile of the atomic percentage of the acceptor-type element.

18. A semiconductor structure comprising:

field effect transistors located on a single crystalline silicon substrate, wherein each of the field effect transistors comprises a respective channel including a respective portion of the single crystalline silicon substrate;

an insulating layer overlying the field effect transistors;

a thin film transistor located over the field effect transistors, wherein the thin film transistor comprises an active layer having a vertical compositional modulation;

a dielectric layer contacting a horizontal top surface of the insulating layer and a sidewall of the active layer; and a source electrode comprising a source sidewall that vertically extends from a top surface of the dielectric layer to a first recessed horizontal surface of the active layer, wherein the active layer comprises oxygen, an acceptor-type element selected from Ga and W, and a heavy post-transition metal element selected from In and Sn, wherein a vertical compositional profile of an atomic percentage of the acceptor-type element between a bottommost surface of the active layer and a topmost surface of the active layer has N local peaks in which N is an integer greater than 2, wherein a bottommost peak selected from the N peaks is higher than any of (N−2) intermediate peaks located between the bottommost peak and a topmost peak selected from the N peaks, and wherein the active layer comprises multiple instances of a unit layer stack that is repeated along a vertical direction, and each instance of the unit layer stack consists of, in order along the vertical direction, an acceptor-type oxide layer including an oxide of the acceptor-type element, a zinc oxide layer, and a post-transition metal oxide layer including an oxide of the heavy post-transition metal element, and each vertically neighboring pair of instances of the unit layer stack is in direct contact with each other, wherein the active layer further comprises a topmost acceptor-type oxide layer in direct contact with a topmost surface of the multiple instances of the unit layer stack and in direct contact with a horizontal bottom surface segment of the dielectric layer, and the source electrode vertically extends through the topmost acceptor-type oxide layer and comprises a bottom surface that directly contacts a top surface of an underlying layer that is selected from a post-transition metal oxide layer within a topmost instance of the unit layer stack and a topmost zinc oxide layer within the topmost instance of the unit layer stack, the top surface of the underlying layer being the first recessed horizontal surface of the active layer.

19. The semiconductor structure of claim 18, wherein:

a vertical compositional profile of an atomic percentage of the heavy post-transition metal element between the bottommost surface of the active layer and the topmost surface of the active layer has (N−1) local peaks;

the vertical compositional profile of the atomic percentage of the heavy post-transition metal element has N local minima; and a bottommost local minimum of the atomic percentage of the heavy post-transition metal element located at the bottommost surface of the active layer that is lower than any of (N−2) intermediate local minima located between the bottommost local minimum and a topmost local minimum of the vertical compositional profile of the atomic percentage of the heavy post-transition metal element.

20. The semiconductor structure of claim 19, wherein:

the bottommost local minimum of the atomic percentage of the heavy post-transition metal element is a global minimum for the atomic percentage of the heavy post-transition metal element; or the topmost local minimum of the atomic percentage of the heavy post-transition metal element is lower than any of the (N−2) intermediate local minima of the vertical compositional profile of the atomic percentage of the heavy post-transition metal element.

* * * * *